United States Patent
Rouleau et al.

(10) Patent No.: US 6,761,861 B2
(45) Date of Patent: Jul. 13, 2004

(54) HIGH DENSITY PROTEIN CRYSTAL GROWTH

(75) Inventors: Robyn Rouleau, Birmingham, AL (US); Lawrence Delucas, Birmingham, AL (US); Douglas Keith Hedden, Helena, AL (US)

(73) Assignee: UAB Research Foundation, Birmingham, AL (US)

( * ) Notice: Subject to any disclaimer, the term of this patent is extended or adjusted under 35 U.S.C. 154(b) by 0 days.

(21) Appl. No.: 10/061,913

(22) Filed: Feb. 1, 2002

(65) Prior Publication Data

US 2003/0003036 A1 Jan. 2, 2003

Related U.S. Application Data

(63) Continuation-in-part of application No. 09/371,192, filed on Aug. 10, 1999, now Pat. No. 6,447,726.
(60) Provisional application No. 60/095,984, filed on Aug. 10, 1998, provisional application No. 60/139,551, filed on Jun. 16, 1999, and provisional application No. 60/266,356, filed on Feb. 2, 2001.

(51) Int. Cl.[7] .............................. B01D 9/00; C03B 30/08
(52) U.S. Cl. ........................ 422/245.1; 117/11; 117/30; 117/200; 117/206; 117/901; 422/99
(58) Field of Search ........................ 210/95, 511, 634; 422/99, 100, 245.1, 253–259; 117/11, 17, 30, 31, 35, 200, 202, 206, 901; 436/4; 366/241

(56) References Cited

U.S. PATENT DOCUMENTS

| | | | |
|---|---|---|---|
| 4,517,048 A | 5/1985 | Shlichta | 422/245.1 |
| 4,909,933 A | * 3/1990 | Carter et al. | 210/95 |
| 4,917,707 A | 4/1990 | Claramonte et al. | 422/245.1 |
| 4,919,900 A | 4/1990 | Martin et al. | 422/245.1 |
| 4,964,596 A | 10/1990 | Ganssle et al. | |
| 5,013,531 A | 5/1991 | Snyder et al. | 422/245.1 |
| 5,078,975 A | 1/1992 | Rhodes et al. | 422/253 |
| 5,106,592 A | 4/1992 | Stapelmann et al. | 422/245.1 |
| 5,266,284 A | 11/1993 | Heilig et al. | 422/245.1 |
| 5,531,185 A | 7/1996 | Asano et al. | 117/206 |
| 5,641,681 A | * 6/1997 | Carter | 436/4 |
| 5,643,540 A | 7/1997 | Carter et al. | 422/245.1 |
| 5,961,934 A | 10/1999 | Arnowitz et al. | 422/245.1 |
| 6,027,565 A | 2/2000 | Bugg et al. | 117/202 |
| 6,447,726 B1 | * 9/2002 | Delucas et al. | 422/99 |
| 6,579,358 B2 | * 6/2003 | Delucas et al. | 117/200 |

* cited by examiner

Primary Examiner—Joseph Drodge
(74) Attorney, Agent, or Firm—Merchant & Gould P.C.

(57) ABSTRACT

A protein crystal growth assembly including a crystal growth cell and further including a cell body having a top side and a bottom side and a first aperture defined therethrough, the cell body having opposing first and second sides and a second aperture defined therethrough. A cell barrel is disposed within the cell body, the cell barrel defining a cavity alignable with the first aperture of the cell body, the cell barrel being rotatable within the second aperture. A reservoir is coupled to the bottom side of the cell body and a cap having a top side is disposed on the top side of the cell body. The protein crystal growth assembly may be employed in methods including vapor diffusion crystallization, liquid to liquid crystallization, batch crystallization, and temperature induction batch mode crystallization.

11 Claims, 51 Drawing Sheets

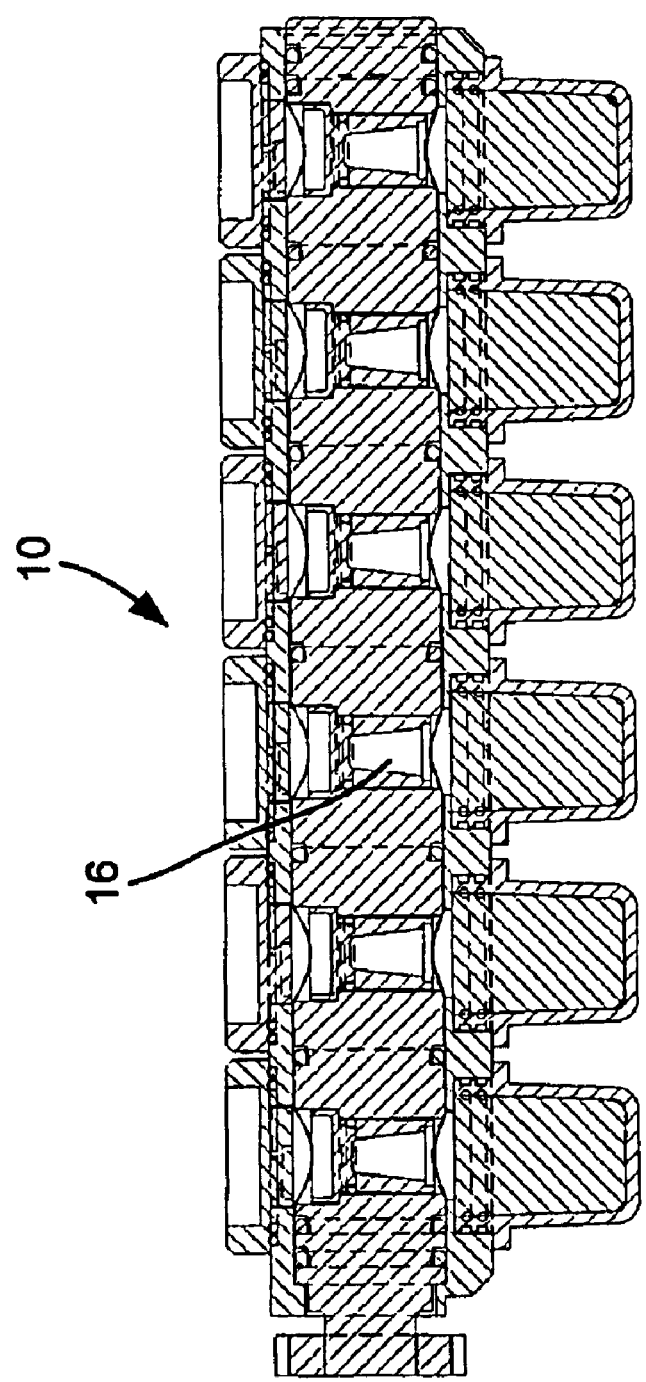

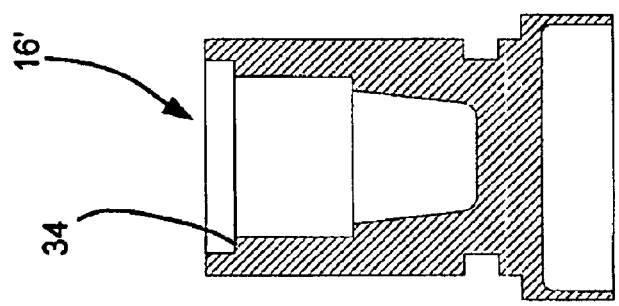
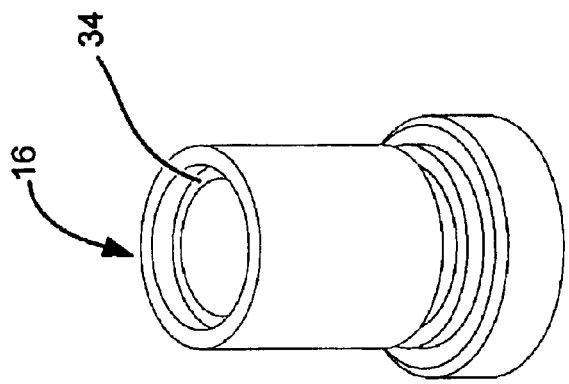
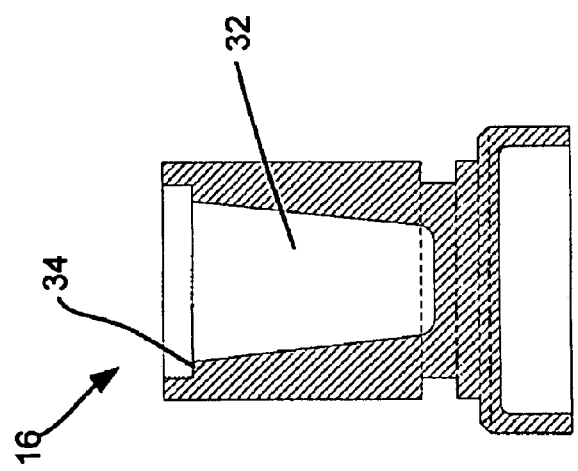

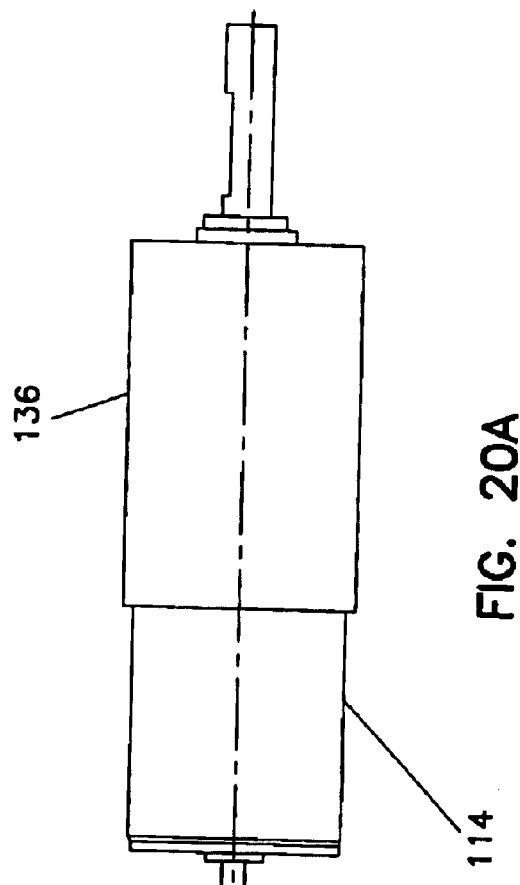
FIG. 20A
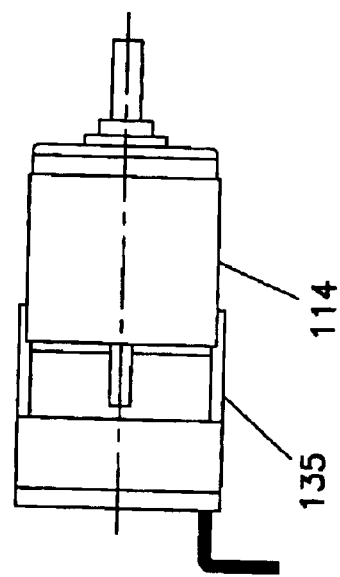
FIG. 20B
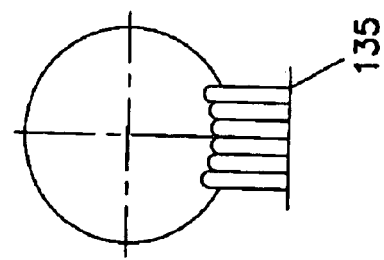

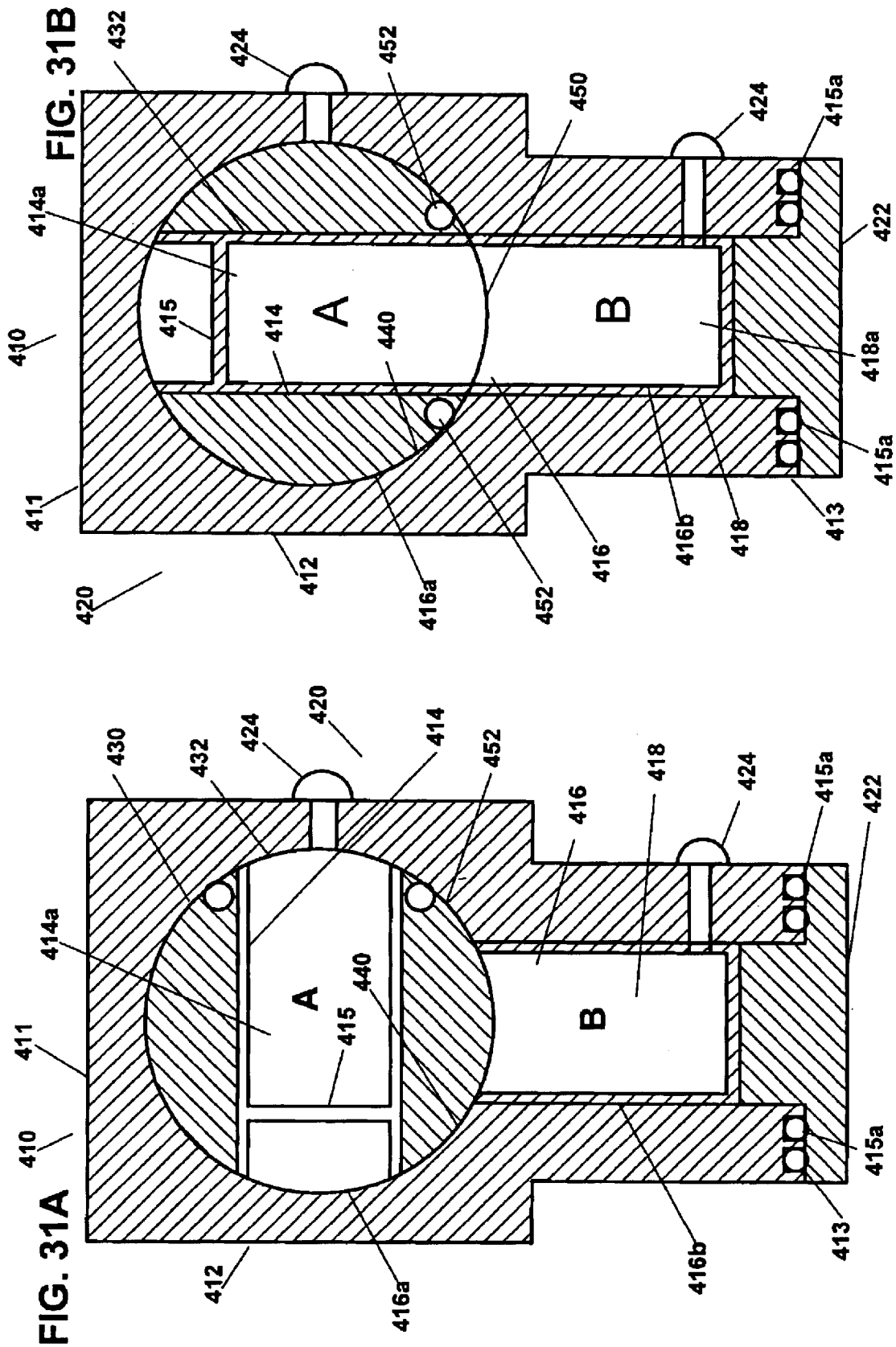

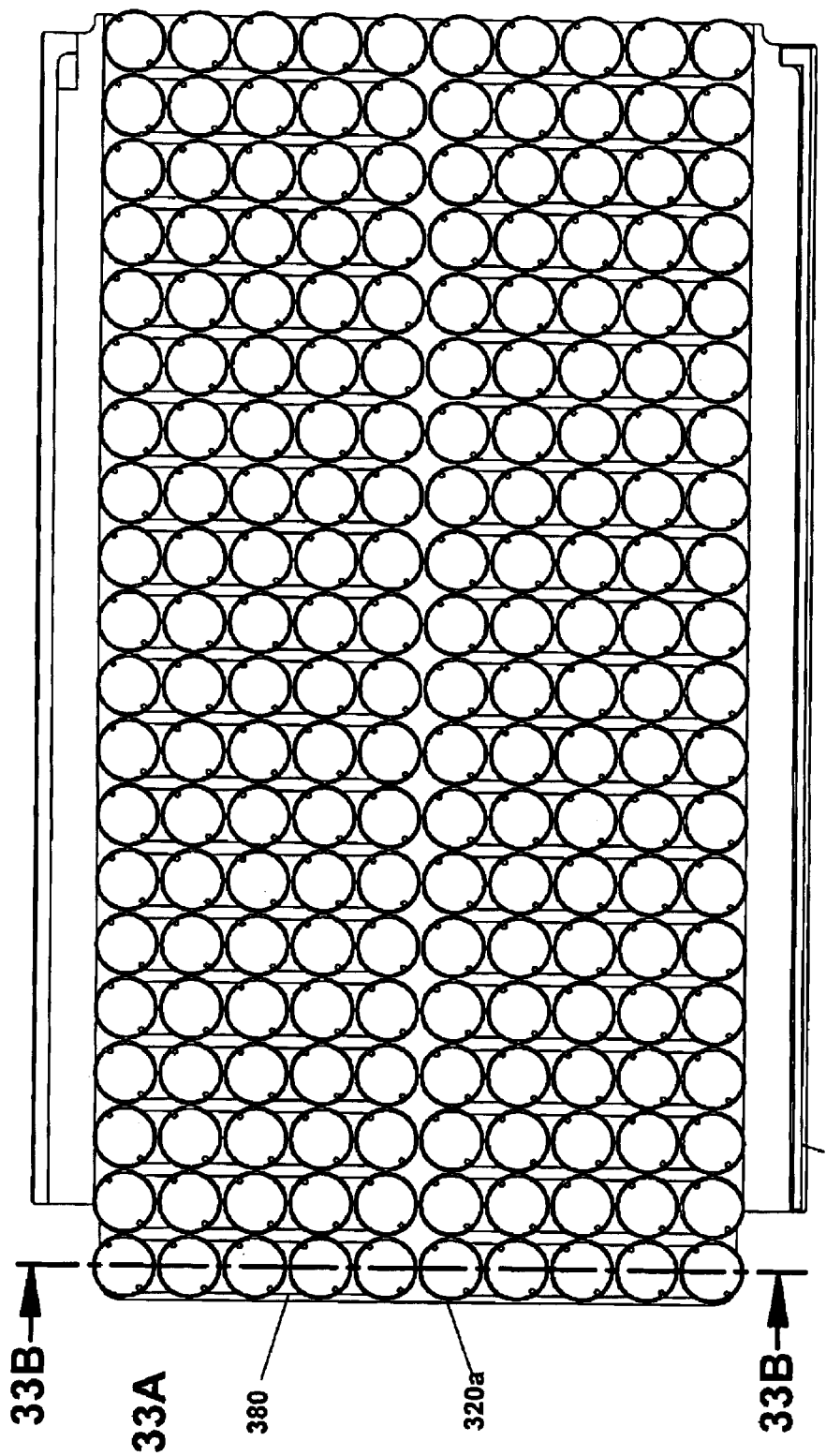
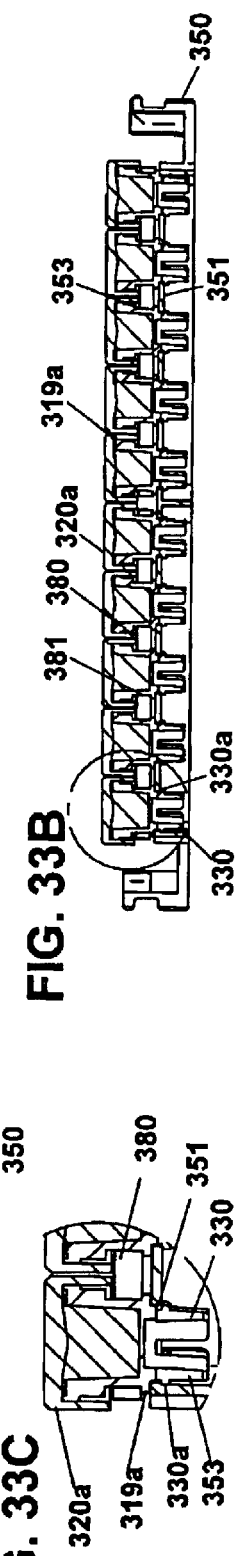
FIG. 33A
FIG. 33B
FIG. 33C

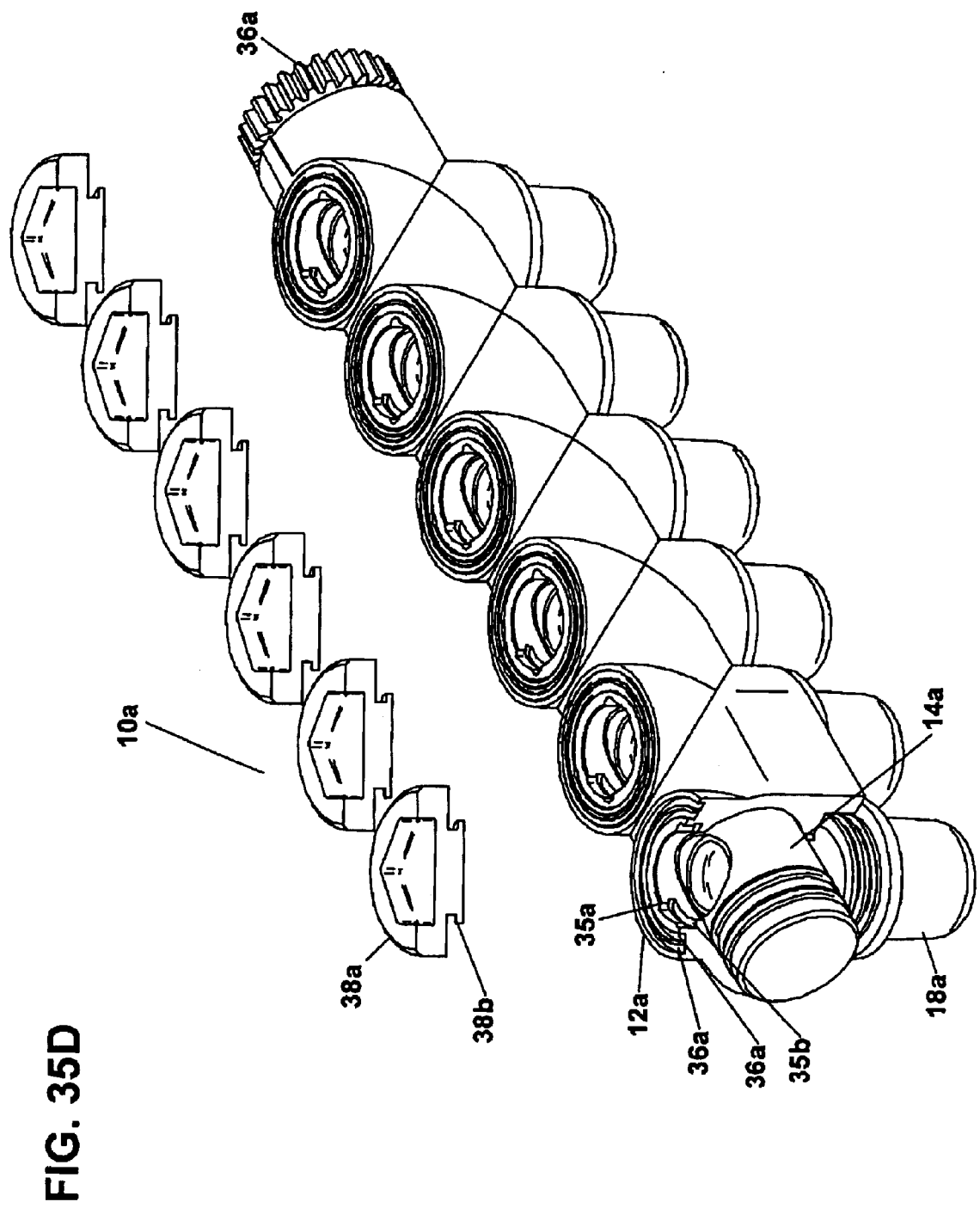

HIGH DENSITY PROTEIN CRYSTAL GROWTH

This application is a Continuation of U.S. application Ser. No. 09/371,192 filed Aug. 10, 1999, now U.S. Pat. No. 6,447,726, which claims the benefit of U.S. Provisional Application No. 60/095,984, filed Aug. 10, 1998, and U.S. Provisional Application No. 60/139,551, filed Jun. 16, 1999, and claims the benefit of U.S. Provisional Application No. 60/266,356 filed on Feb. 2, 2001.

This application is under agreement with National Aeronautics Space Administration (NASA), NASA Cooperative Agreement No. NCC8-126.

BACKGROUND

1. Field of the Invention

The present invention relates to an apparatus and method for conducting experiments for growing a large number of protein crystals.

2. Description of Related Art

Due to advances in the protein crystal growth (PCG) field, it has become apparent that current experiment configurations no longer fully utilize the available experiment volume of space shuttle orbitor flight incubators. Additionally, conventional experimental hardware is not conducive to the long duration micro-gravity flights available aboard the International Space Station (ISS). In addition, conventional systems cannot freely utilize the limited space, power requirements and down-link flight telemetry systems available aboard the International Space Station or Space Shuttle Orbitor.

It can be seen that there is a need for a method and apparatus for protein crystal growth that can fully utilize the confined experiment volume available on space shuttle orbitors and space stations.

It can also be seen that there is a need for experimental hardware that is conducive to long duration micro-gravity flights aboard the International Space Station.

It can also be seen that there is a need to more freely utilize the limited space, power requirements and down-link flight telemetry systems available aboard the International Space Station or Space Shuttle Orbitor.

SUMMARY OF THE INVENTION

To overcome the limitations of the related art described above, and to overcome other limitations that will become apparent upon reading and understanding the present specification, the present invention relates to an apparatus, system and method for conducting experiments for growing a large number of protein crystals designed to fit in a single locker space incubator.

One aspect of the invention provides a protein crystal growth assembly. The protein crystal growth assembly includes a crystal growth cell. The crystal growth cell further includes a cell body having a top side and a bottom side and a first aperture defined therethrough, the cell body having opposing first and second sides and a second aperture defined therethrough. A cell barrel is disposed within the cell body, the cell barrel defining a cavity alignable with the first aperture of the cell body, the cell barrel being rotatable within the second aperture. A reservoir is coupled to the bottom side of the cell body and a cap having a top side is disposed on the top side of the cell body.

Another aspect of the invention provides another embodiment of a protein crystal growth assembly. The protein crystal growth assembly includes a crystal growth cell. The crystal growth cell includes a body having a top side, a bottom side, and an inner surface defining a reservoir. A plate is removably connected to the top of the body to cover the reservoir. A cap having a top surface is removably disposed on top of the plate and on the top side of the body.

Another aspect of the present invention provides another embodiment of a protein crystal growth assembly. The protein crystal growth assembly includes a crystal growth cell having a cell body with a top side, a bottom side and an inner surface that defines a reservoir. Further a cap is removably disposed on the top of the cell body. The cell body includes sealing members to seal the reservoir shut when the cap is connected. The cap and cell body are provided with structures constructed to connect the cap to the cell body. A plurality of growth cells are housed in a ganging clip, and the cell body includes retaining structures for retaining each growth cell on a tray.

Another aspect of the invention provides yet another embodiment of a protein crystal growth assembly. The protein crystal growth assembly includes a crystal growth cell. The crystal growth cell includes a body having a top side, a bottom side, and an inner surface defining a chamber having an upper portion and a lower portion. The upper and lower portions of the chamber each having at least one hole operatively connected to the upper and lower portions. A cell member defining an opening therethrough is rotatably connected within the upper portion of the chamber. The cell member includes at least one aperture defined therethrough, where the aperture is operatively connectable to a rotating mechanism. The cell member includes an upper sleeve disposed within the opening. The upper sleeve includes an opening substantially lining and coaxial with the cell member opening, and includes a segment transversely disposed across the upper sleeve opening. The opening of the upper sleeve is rotatably alignable with the at least one aperture of the upper portion, and is rotatably alignable with a lower sleeve formed in the lower portion of the chamber. A cap is disposed at the bottom of the crystal growth cell.

Another aspect of the invention provides a protein crystal growth tray assembly. The protein crystal growth tray assembly includes a tray adapted to hold a protein crystal growth assembly; a securing mechanism holding the protein crystal growth assembly in place in the tray; an engaging mechanism provided on the tray, the engaging mechanism coupled with the protein crystal growth assembly; and a pivot assembly coupled to the engaging mechanism for moving the protein crystal growth assembly between two positions by operation of the pivot assembly.

A further aspect of invention provides a protein crystal growth incubator assembly. The protein crystal growth incubator assembly includes a housing having interior and exterior sides defining an internal storage compartment; and a stacked protein crystal growth tray configuration slideable into and out of the internal storage compartment, the stacked protein crystal growth tray configuration holding one or more protein crystal growth tray assemblies.

Yet another aspect of the invention provides a protein crystal growth command and monitoring system. The protein crystal growth command and monitoring system includes a chassis having interior and exterior sides, the chassis housing a video monitoring and translation mechanism; a protein crystal growth tray assembly having protein crystal growth assemblies disposed therein, the tray assembly arranged within the interior side of the chassis for video monitoring of the protein crystal growth cells; a video camera assembly for monitoring the protein crystal growth assemblies; a translation mechanism arranged on the chassis and coupled to the video camera assembly for positioning the video camera assembly above the protein crystal tray assembly; and a controller providing control signals to the translation mechanism for controlling the translation and positioning of the video camera.

Still another aspect of the invention provides, in a protein crystal growth assembly including a cell body having a top side and a bottom side and a first aperture defined therethrough, the cell body having opposed first and second sides and a second aperture defined therethrough; a cell barrel disposed within the cell body, the cell barrel defining a cavity alignable with the first aperture of the cell body; a reservoir coupled to the bottom side of the cell body, the cell barrel being rotatable within the second aperture; a protein cell insert disposed within the cavity of the cell barrel, the protein cell insert having an inner portion and an outer portion wherein the inner portion defines a well; and a cap having a top side disposed on the top side of the cell body. Another aspect of the invention further includes a method of growing protein crystals. The method includes rotating the cell barrel, to orient the growth cell in a fill/removal position; loading a premixed protein in the protein cell insert of a growth cell assembly; securing the premixed protein in the protein insert; rotating the cell barrel to a launch configuration position; at a predetermined time, rotating the cell barrel to a position to activate an experiment by placing the growth cell in a growth position; and at a second predetermined time, rotating the cell barrel to a position to deactivate the experiment by placing the growth cell in the fill/removal position.

These and various other features of novelty as well as advantages which characterize the invention are pointed out with particularity in the claims annexed hereto and form a part hereof. However, for a better understanding of the invention reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout, where:

FIG. 11A illustrates a sectional view of one example of one embodiment of a protein crystal growth cell assembly in its growth position;

FIGS. 12A–C illustrate examples of various embodiments of a protein cell insert;

FIGS. 20A–B illustrate examples embodiments of a stepper motor and encoder;

FIG. 31A illustrates a sectional view of one example of an embodiment of a single protein crystal growth assembly in its deactivated position.

FIG. 31B illustrates a sectional view of the single protein crystal growth assembly of FIG. 31A in its activated position.

FIG. 33A illustrates a top plan view of one embodiment for an arrangement of protein crystal growth assemblies connected to multiple ganging clips and placed on a HDPCG tray.

FIG. 33B illustrates a sectional view B—B of the arrangement of protein crystal growth assemblies connected to multiple ganging clips and placed on a HDPCG tray as in FIG. 33A.

FIG. 33C illustrates a sectional view of one of the crystal growth assembly in FIG. 33B.

FIG. 35D illustrates a top perspective view of a plurality of crystal growth cells with the high density access cap of FIG. 35A.

DETAILED DESCRIPTION OF THE PREFERRED EMBODIMENTS

Figure 1:
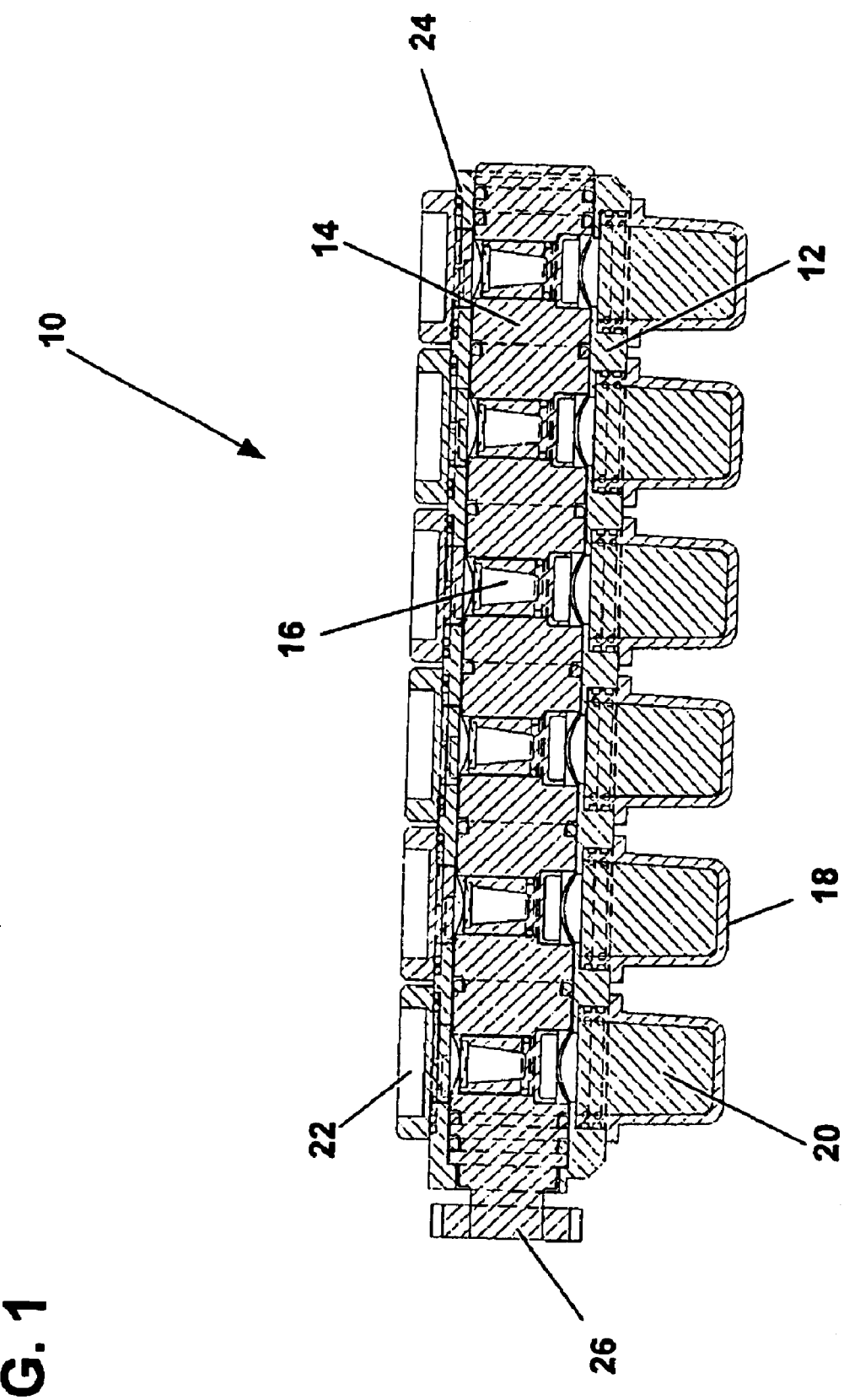
FIG. 1 illustrates an example of one embodiment of a protein crystal growth cell assembly.

In the following description of the specific embodiments, reference is made to the accompanying drawings which form a part hereof, and in which is shown by way of illustration the specific embodiments in which the invention may be practiced. It is to be understood that other embodiments may be utilized as changes may be made without departing from the spirit and scope of the present invention.

In one embodiment the present invention provides a Commercial Refrigerator Incubator Module-Modified (CRIM-M) for utilization in early flights of the Space Shuttle Orbitor.

In one embodiment the present invention provides a Commercial Refrigerator Incubator Module-Modified (CRIM-M) for utilization in early flights of the Space Shuttle Orbitor providing an internal storage compartment having a width of about 10 inches, a height of about 7 inches and a depth of about 17 inches for storing a stacked protein crystal growth tray configuration according to the present invention.

In another embodiment the present invention provides a next generation thermal carrier (NGTC), to be utilized when mid-deck modifications to the Space Shuttle Orbitor are completed. The high density protein crystal growth system (HDPCG) and video command and monitoring system (VCMS) of this embodiment are designed to complement each other. The experiment configurations for the HDPCG/VCMS will be compatible with the planned EXPRESS Rack available accommodations. Finally, the HDPCG growth samples will be easily accessible to crew members for harvesting, frozen storage, or other accommodations.

In yet another embodiment, the present invention provides a new generation of PCG hardware in order to freely utilize the limited space, power requirements, down-link flight telemetry data, and other early ISS limitations. Growth chambers, in this embodiment will include additional design considerations such as: (1) fit inside the Next Generation Thermal Carrier; (2) hold a large quantity of samples; (3) allow vapor diffusion, batch, & liquid to liquid (L/L) crystal growth methods together in one incubator; (4) make it easy to harvest crystals while in orbit; (5) provide video images of samples; (6) be automated from Earth based stations; (7) utilize conventional materials; (8) hold 10–50 micro-liter samples minimum; and (9) be accessible enough to cryogenically preserve the crystals while in orbit.

Other embodiments include easy transfer to a X-ray crystallography facility (XCF) Crystal Preparation Prime Item (CPPI) and sample volumes consistent with previous vapor diffusion apparatus (VDA) type experiments.

Although crystal adhesion to the sides of a well defined by an interior portion of a protein cell insert may present problems, one solution is to possibly coat the walls defining the well with an oil such as an immersion oil, for example, that may be used to reduce the chance of crystal adhesion to the side walls of the protein well if necessary.

The following is a list of some of the distinct aspects of the present invention, whereby:

1. Crystals may be viewed through an optically clear access cap without having to open the sealed container and exposing the fragile crystals to the ambient environment;
2. Up to 1008 cells may be accessed individually without risking harm to other cells in the immediate area;
3. Each individual cell is isolated from the environment by double "O-ring" containment to ensure sealing during in-orbit operations;
4. Individual protein inserts used in the cell barrel of the protein crystal growth assembly are designed to hold volumes consistent with ground based experiments;
5. The protein inserts may be made of molded LEXAN and can be modified individually to hold volumes ranging from 10 micro-liters ($\mu l$) to 40 micro-liters ($\mu l$);
6. The protein inserts are designed to facilitate easy harvesting by having a high surface finish wall and a 6 degree taper;
7. The protein inserts have a sharp pinning angle at the top to keep the protein solution from "creeping" up the sides in a micro-gravity environment;
8. The cell barrel used in the protein crystal growth assembly is designed to rotate in up to four different orientations. There are two launch configuration positions (depending on whether the Incubator is located in the Space Shuttle): a loading/harvesting position, and a growth position;
9. The cell barrel can be rotated in an orientation whereby the Space Shuttle launch "G-force" keeps the protein solution in the Protein Insert and will not let it "creep" out during the ascent;

10. The cell barrel can be rotated in an orientation that will be conducive to accomodating Space Shuttle landing loads, thus assuring that during the occasional "hard landing" the protein crystals and solution will stay intact;

11. The PPT reservoir used in the protein crystal growth assembly is designed to use a Chromex Barrier, which keeps the ½ milliliter reservoir solution from "creeping out" during Space Shuttle Launch and while in a micro-gravity environment;

12. growth cell blocks can be activated in smaller groups, e.g. groups of 21, instead of all at once. This is helpful if proteins have different growing cycles during a given mission;

13. The individual growth cell blocks can be removed from the sample tray very easily without disturbing the others. This is beneficial prior to the Space Shuttle Launch when a "Launch Scrub" requires only certain proteins to be reloaded;

14. The experimental apparatus can operate properly under one G-force; and

15. The experimental apparatus can operate during International Space Station operations, Space Shuttle operations, and other micro-gravity operations.

High Density Protein Crystal Growth (HDPCG) System Description

The HDPCG system is the first phase of a 3 phase program for commercial protein crystal growth (CPCG). This system will utilize the apparatus for the protein crystal growth mechanism for the program. The second phase comprises the HDPCG and the VCMS system. This system will be used to help evaluate protein crystal size, location and potential for X-ray data collection. The third phase of the program will be an X-ray crystallography facility (XCF). This XCF system will collect X-ray data sets on the protein samples grown in the HDPCG apparatus, which will be assessed and selected utilizing the VCMS system.

The HDPCG Experiment Assembly includes, for example, 1008 individual growth cells stored within sample trays. This apparatus is then placed into a thermal control facility in order to maintain the temperatures required by the experiment. The first generation HDPCG experiment assembly will utilize vapor diffusion as the process for protein crystal growth, with other methods of crystal growth to follow.

Figure 2B:
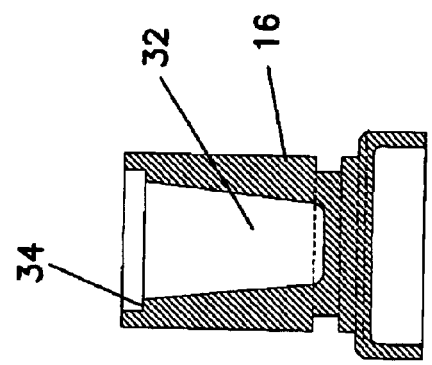
FIGS. 2A–D illustrate examples of various views and components of one embodiment of a protein crystal growth cell assembly.

Turning now to FIG. 1, one embodiment of a protein crystal growth cell assembly 10 comprises a cell body 12, cell barrel 14, protein inserts 16, PPT Reservoirs 18, chromex barriers 20, hex head access caps 22, O-rings 24 and a Spur Gear 26. The cell body 12 and cell barrel 14 are machined from clear Polysulfone P1700. A molded LEXAN version could be used to reduce cost and allow the experimenter the ability to keep the hardware after each mission. The cell barrel 14 is designed to rotate within the cell body 12 in order to activate/deactivate the experiment and to seal the protein within the assembly when in launch configuration 28. As shown in FIG. 2A, this may accomplished by using the spur gear 26, that may be manufactured from a synthetic resin such as Delrin, for example. During launch, the growth cell assembly 10 may experience a G-Force as indicated by G-Force vector 30. The spur gear 26 is located on one end of the growth cell assembly 10 and it is designed to interface with a 26 gear 48 (FIG. 3A, for example a tooth pitch gear) on a sample tray assembly 43 (FIG. 3A), so that the samples can be activated, or deactivated simultaneously.

Located within the cell barrel 14 are six protein inserts 16 where premixed proteins are loaded. As illustrated in FIG. 2B the Protein Insert 16 has a tapered well 32 and a 90° pinning angle 34 to restrict the protein drops from wicking out of the well while in a micro-gravity environment. Different size options can be provided to the experimenter, for example a 40 $\mu$l and a 20 $\mu$l version.

Figure 2D:
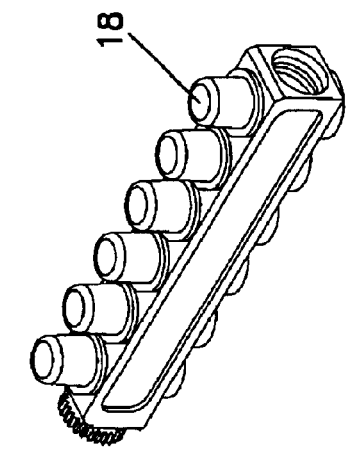
Figure 2A:
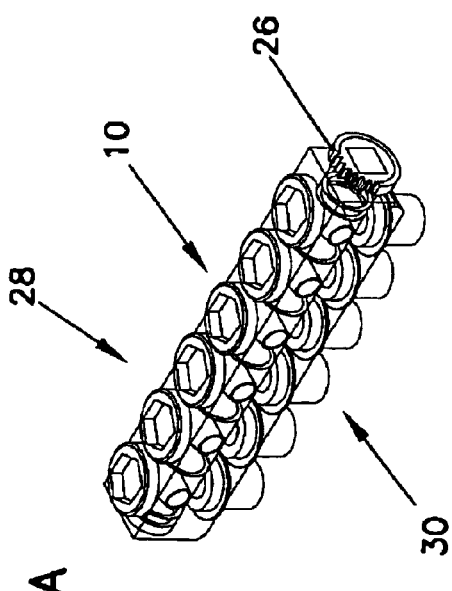
Figure 2C:
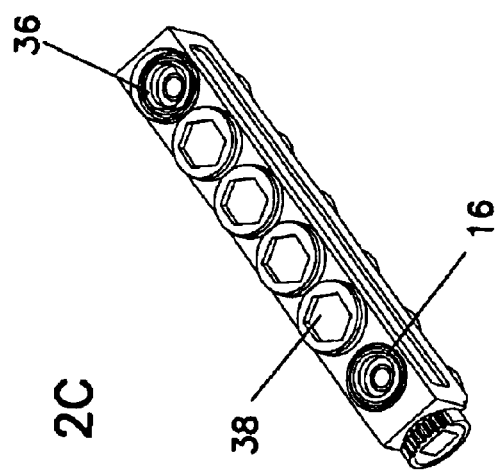

Illustrated in FIG. 2C is one embodiment of a hex head access cap 38 that is used to seal the protein environment from the outside. The hex head access caps 38 can be designed for cooperation with the XCF crystal preparation prime item (CPPI) robotics for remote access. Also included are double O-ring containment 36 to prevent leakage of the protein solution during the experiment. The protein inserts 16 and hex head access caps 38 can be made of optical grade LEXAN. This allows a level of clarity as needed for the VCMS during the second phase of the commercial protein crystal growth (CPCG) HDPCG program.

FIG. 2D illustrates embodiments of six PPT reservoirs 18 located on the cell body 12. The PPT reservoirs 18 can be made from molded clear Polysulfone P1700. Each PPT reservoir 18 houses a chromex barrier 20 in order to contain the protein precipitant and is designed to provide easy access. Once the premixed proteins are loaded and secured, the cell barrel 14 is turned 90° for launch configuration 28.

Figure 3A:
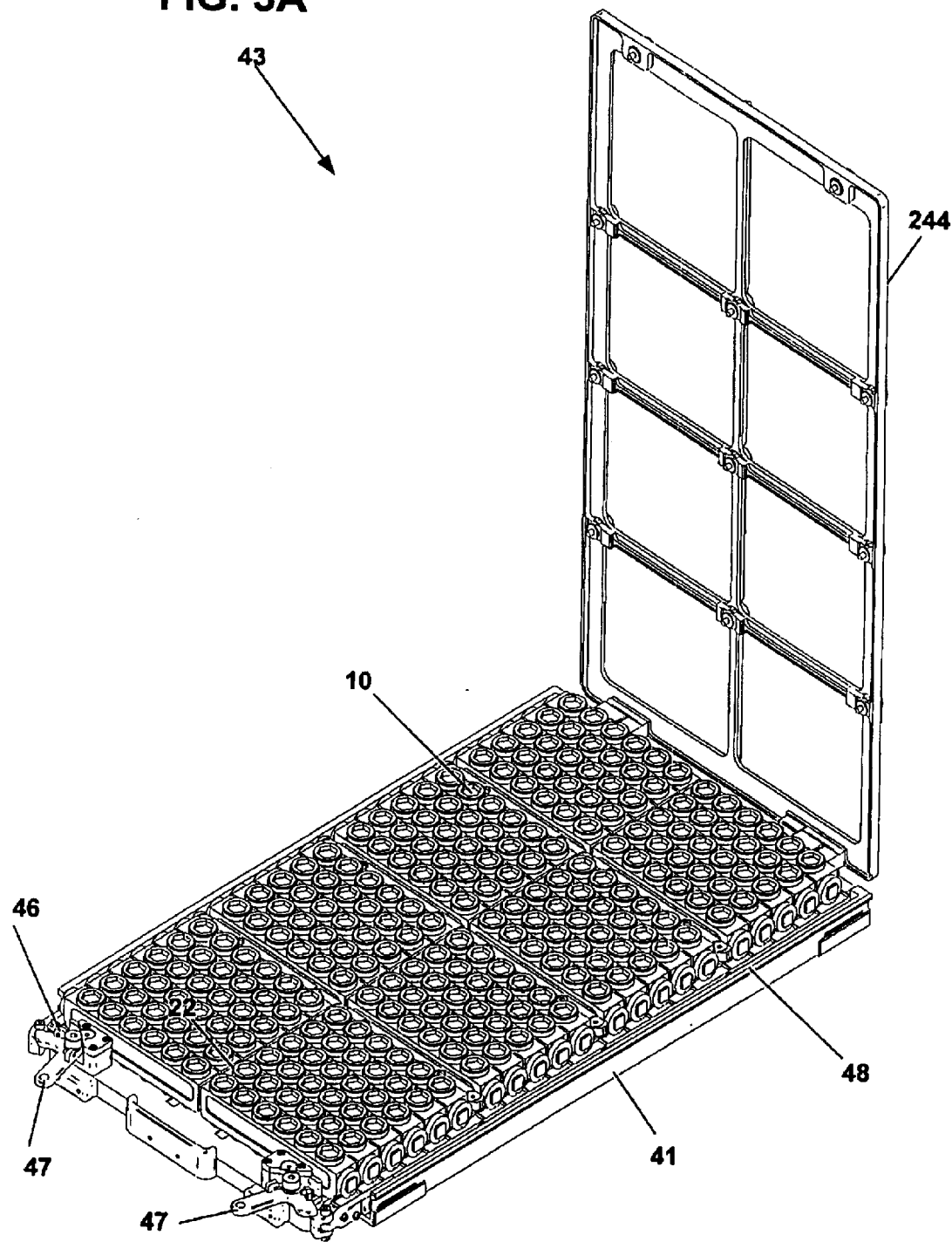
FIGS. 3A–C illustrate examples of various embodiments of a single high Density protein crystal growth (HDPCG) tray assembly.

FIG. 3A illustrates one embodiment of a HDPCG sample tray assembly 43 with a hinged lid 244 in the open position. A HDPCG experiment assembly is capable of housing several, for example up to four, sample tray assemblies 43 at a time. The sample tray assemblies 43 are designed to secure the growth cell assemblies 10 during an experiment. Each sample tray assembly 43 may have a hinged lid 244, which is used to lock the growth cell assemblies 10 into place and thus allows for the ease of loading and unloading samples.

Each sample tray assembly 43 is capable of securing 42 growth cell assemblies 10 (21 on each side). All 21 growth cell assemblies 10 on each side are activated/deactivated together by the push/pull movement of the geared rack 46 and 26 gear 48 that engages each individual spur gear 26 of the growth cell assemblies 10. The growth cell assemblies 10 rest in tray 41. This allows the total number of samples to be as much as 252 per tray 43 (for a total of 1008 on four trays) for the apparatus where previous University of Alabama at Birmingham (UAB) crystal growth experiments were limited to approximately 128. Pivot assembly 47 activates 21 growth cell assemblies per side. There are two pivot assemblies 47 per sample tray 43.

Figure 3B:
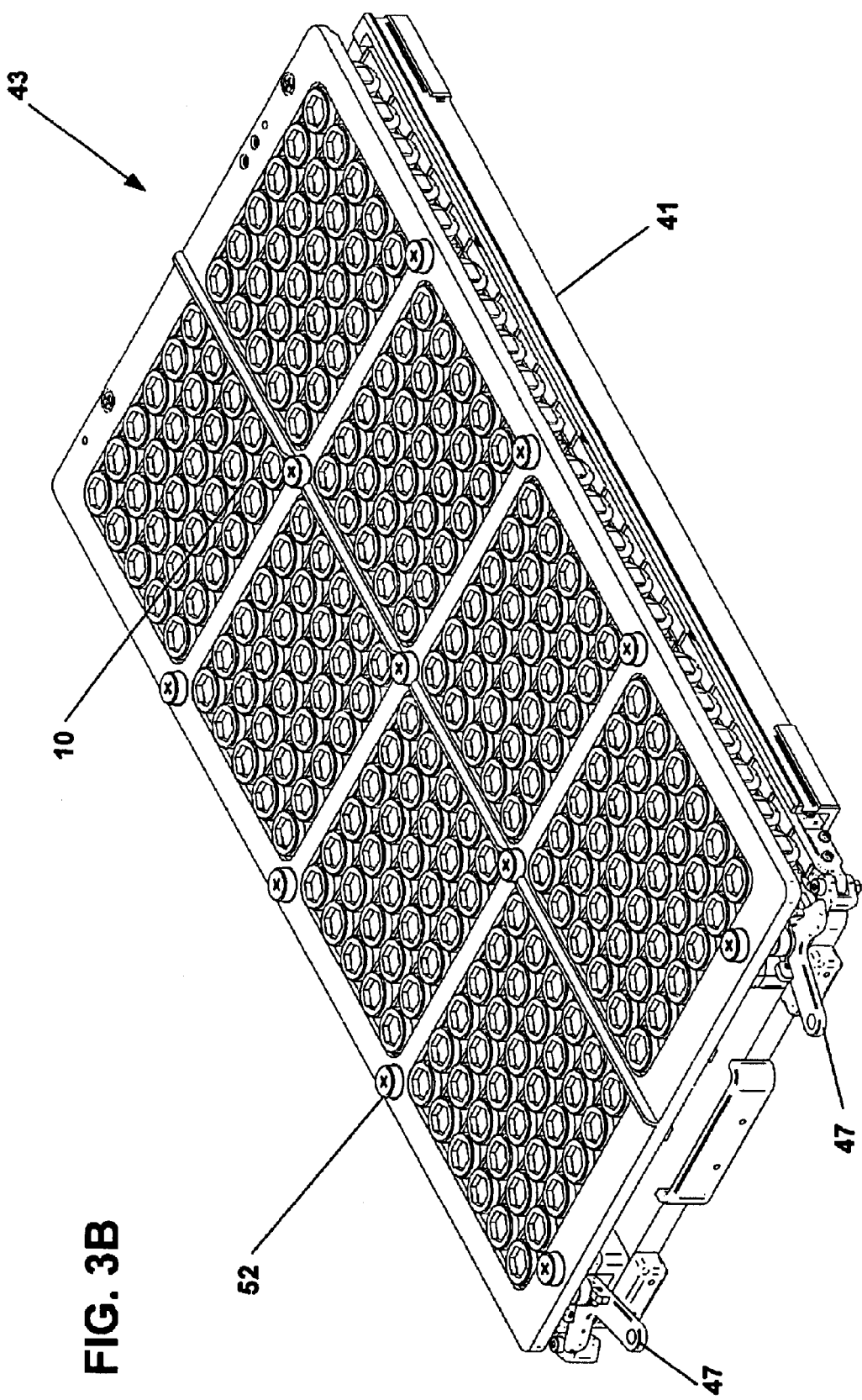

FIG. 3B illustrates one embodiment of a HDPCG Sample Tray Assembly 43 with a lid assembly 244 in a closed position. The sample tray assembly 43 further includes captive screws 52 to secure the trays. There are 42 growth cell assemblies 10 per tray 41 at a weight of about 3.7 lbs. per tray with the weight of the tray 41 being about 1.8 lbs. The lid assembly 244 weighs about 0.57 lbs.

Figure 3C:
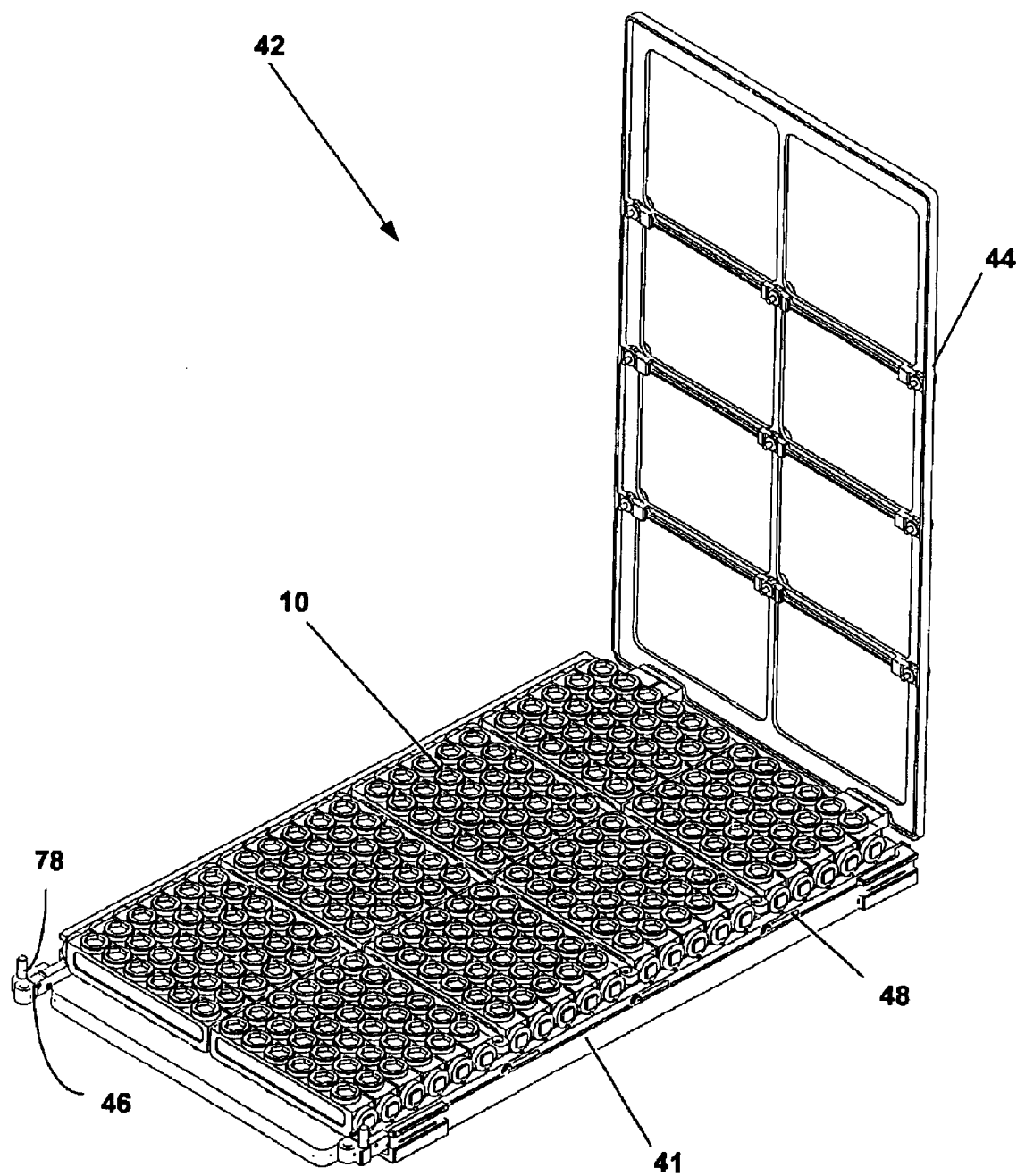

FIG. 3C illustrates another embodiment of a HDPCG sample tray assembly 42 with a hinged lid 44 in the open position. The HDPCG Experiment Assembly is capable of housing several, for example up to four, sample tray assemblies 42 at a time. The sample tray assemblies 42 are designed to secure the growth cell assemblies 10 during an experiment. Each sample tray assembly 42 has a hinged lid 44, which is used to lock the growth cell assemblies 10 into place and thus allows for the ease of loading and unloading samples.

Figure 4A:
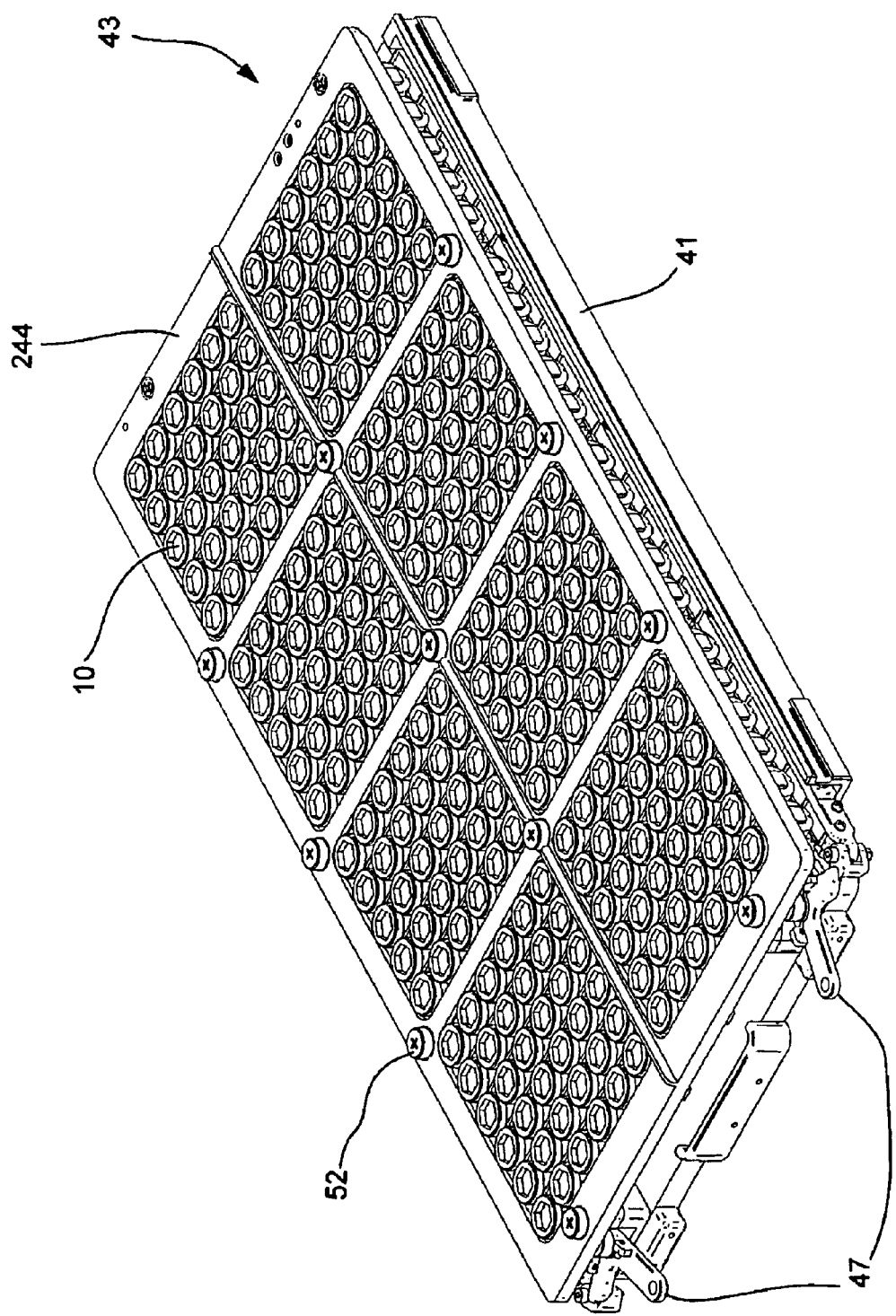
FIGS. 4A–D illustrate examples of various embodiments of a single HDPCG sample tray and stacked tray configurations.

FIG. 4A is another view of one embodiment of a sample tray assembly 43 with its hinged lid 244 in a closed position.

Figure 4B:
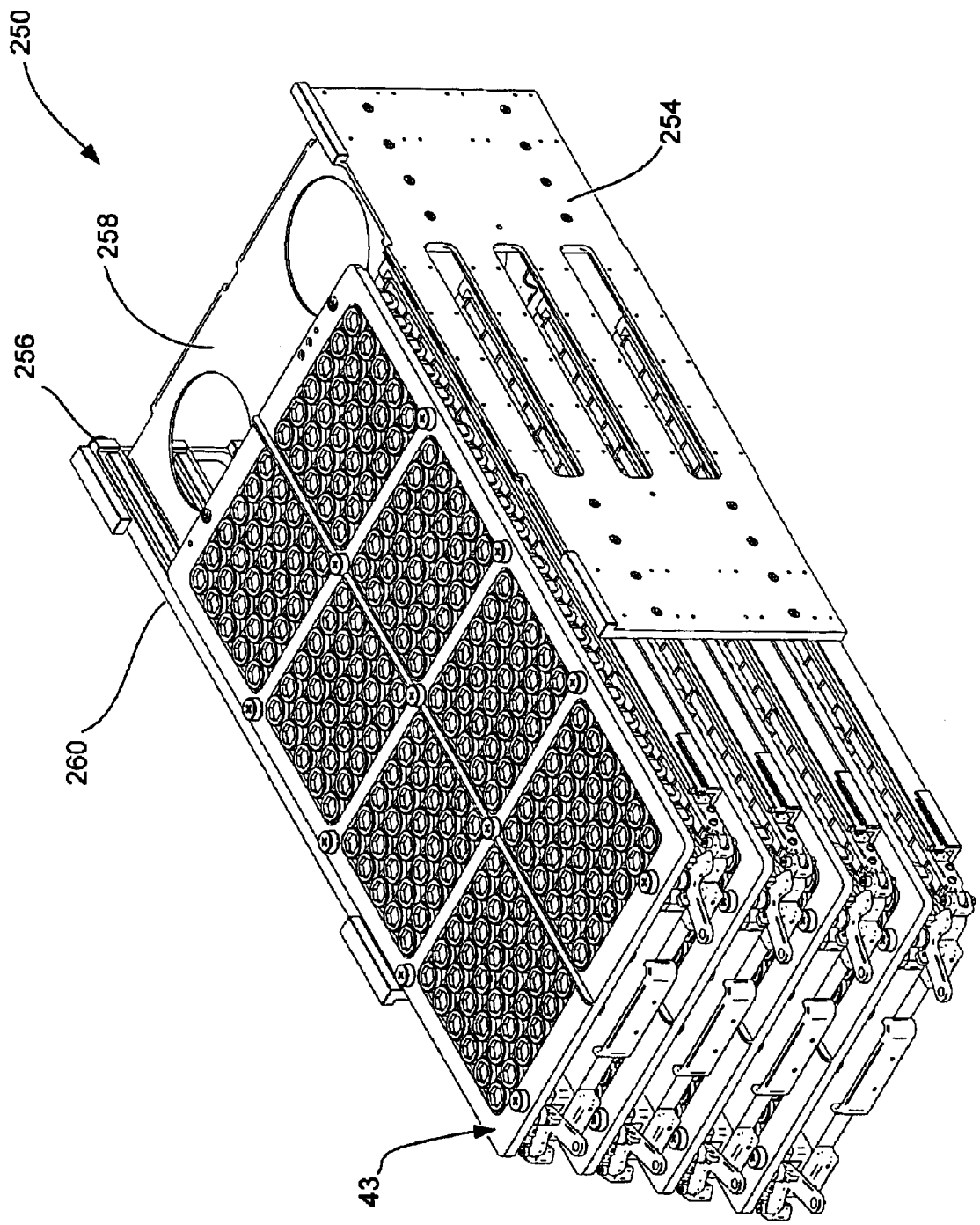

As illustrated in FIG. 4B one embodiment of a sample tray assembly 43 may be arranged in a stacked tray assembly configuration 250 designed to slide in and out of a protein crystal growth incubator assembly such as a Commercial Refrigeration Incubator Module-Modified 63 (CRIM-M) (FIG. 5). For easy access slides (for example of Delrin) are provided on either side of the inside portion of the CRIM-M, thus permitting removal of the sample tray assemblies 43 individually, for example for future transfer to the VCMS. The stacked tray configuration 250 further includes a hot side wall 254, a rear stop 256, an internal structure assembly 258 and cold side wall 260.

In one specific example, there are four tray assemblies 43 in each CRIM-M 63 (FIG. 5) at 6.00 lbs. each for a total weight of 24.00 lbs. The internal structure assembly 258 weighs about 3.90 lbs. The total Experiment Weight is about 27.90 lbs.

Figure 4C:
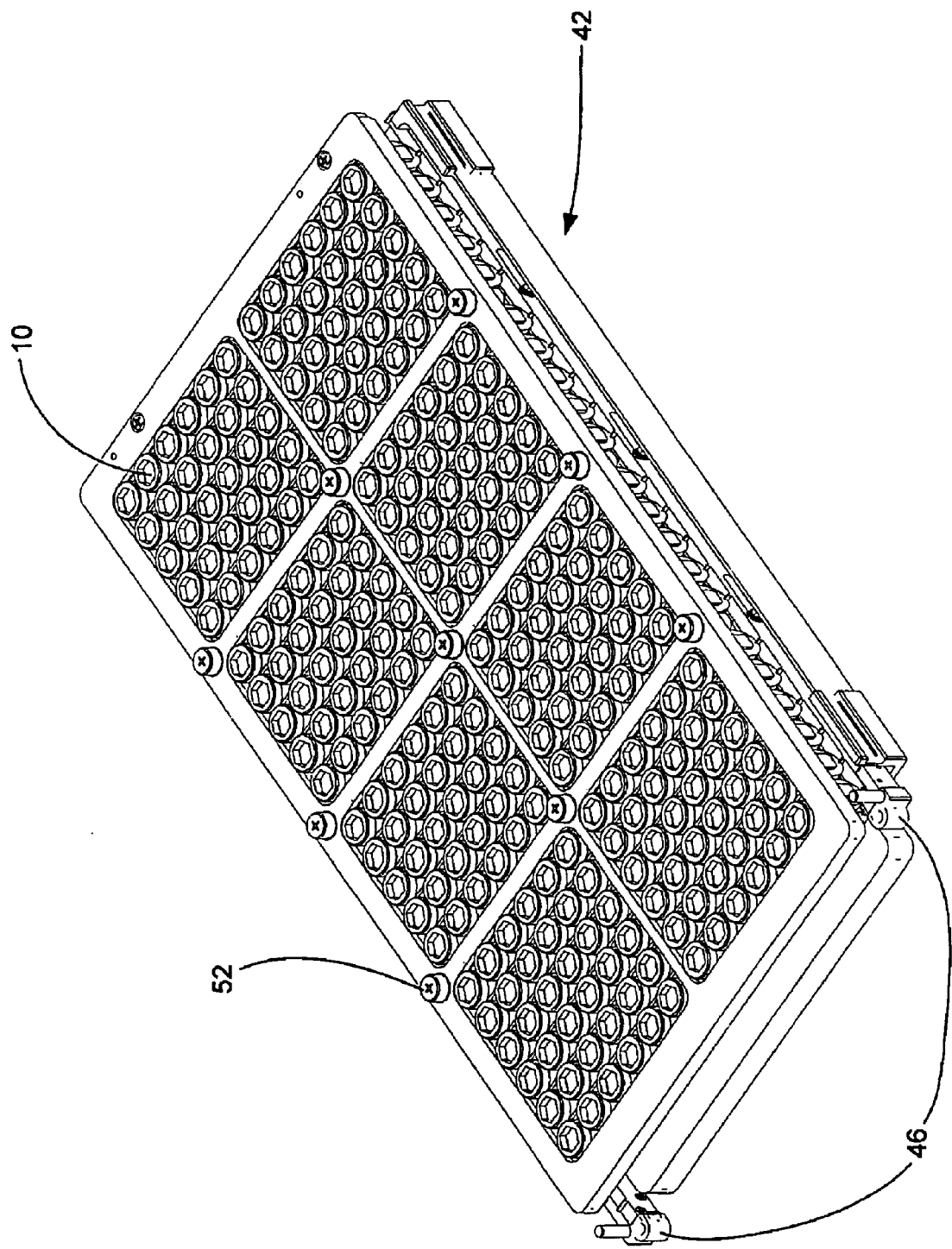
Figure 4D:
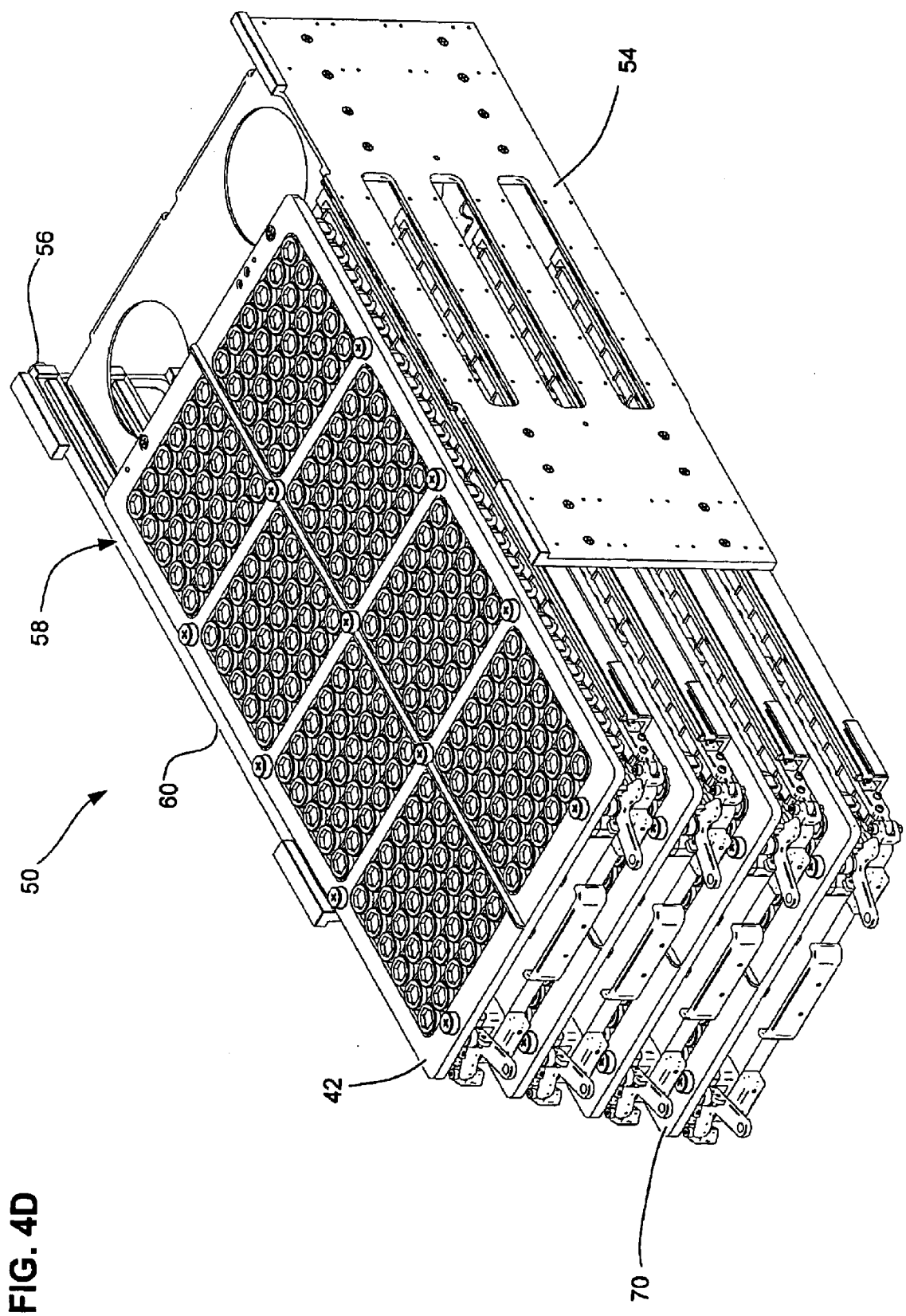

FIG. 4C is yet another view of one embodiment of a sample tray assembly 42 with its hinged lid 44 in a closed position. As illustrated in FIG. 4D one embodiment of a sample tray assembly 42 may be arranged in a stacked tray assembly configuration 50 designed to slide in and out of a Commercial Refrigeration Incubator Module-Modified 63 (CRIM-M) (FIG. 5). The stacked tray configuration 50 further includes a hot side wall 54, a rear stop 56, an internal structure assembly 58 and cold side wall 60.

Figure 5A:
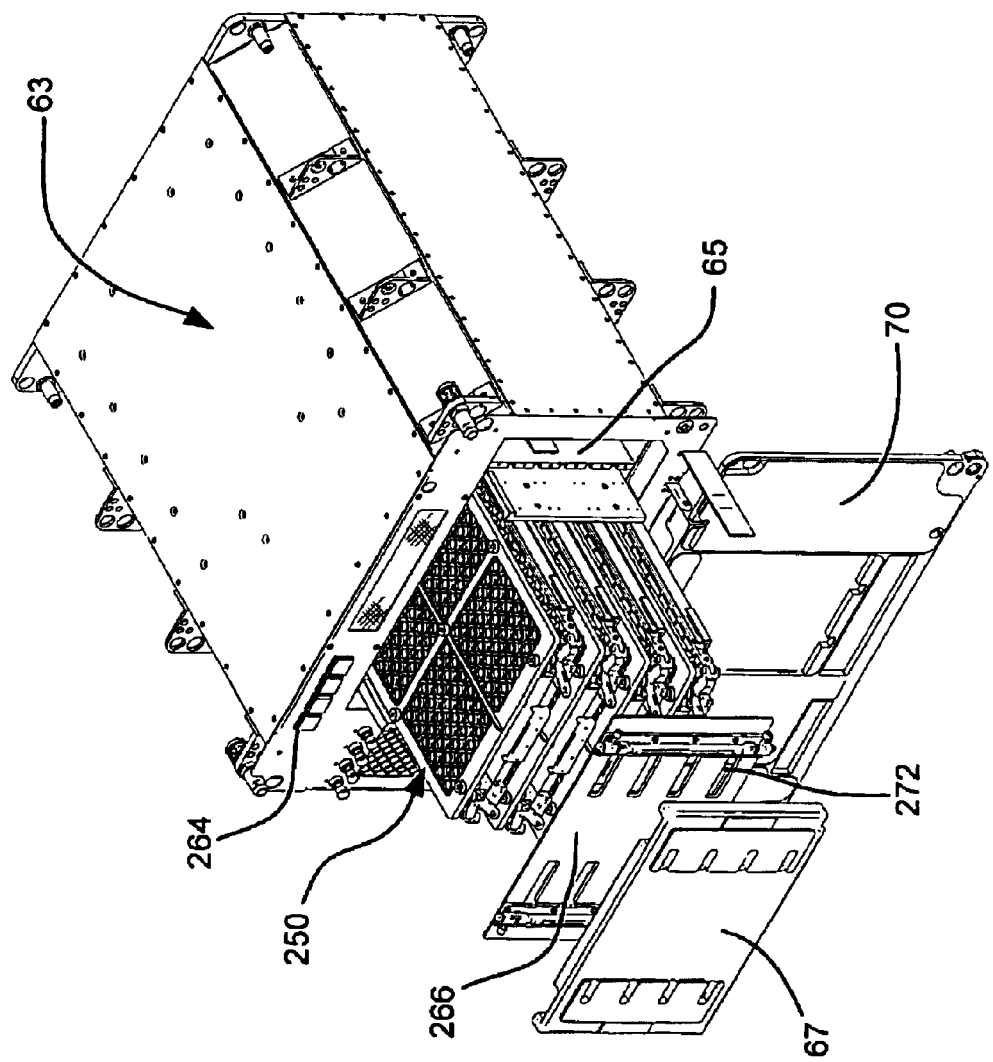
FIGS. 5A–B illustrate examples of embodiments of a HDPCG apparatus installed in a Commercial Refrigeration Incubator Module-Modified (CRIM-M)

Illustrated in FIG. 5A is one embodiment of a HDPCG stacked tray assembly Configuration 250 installed inside of a Commercial Refrigeration Incubator Module-Modified 63 (CRIM-M). The CRIM-M 63 is a single locker thermal control facility, similar to that used in early ISS Development. This apparatus fits into the CRIM-M 63 in a similar manner as previous crystal growth experiments, for example Vapor Diffusion Apparatus 2 (VDA-2), Commercial Vapor Diffusion Apparatus (CVDA) and Protein Crystallization Facility (PCF). The CRIM-M 63 provides a Crew Interface 264 required for setting the temperature profiles and monitoring the state of the system for the experiment. In addition, the CRIM-M 63 provides an internal storage compartment 65, a retainer door assembly 266, foam insulation 67 and door 70.

Figure 5B:
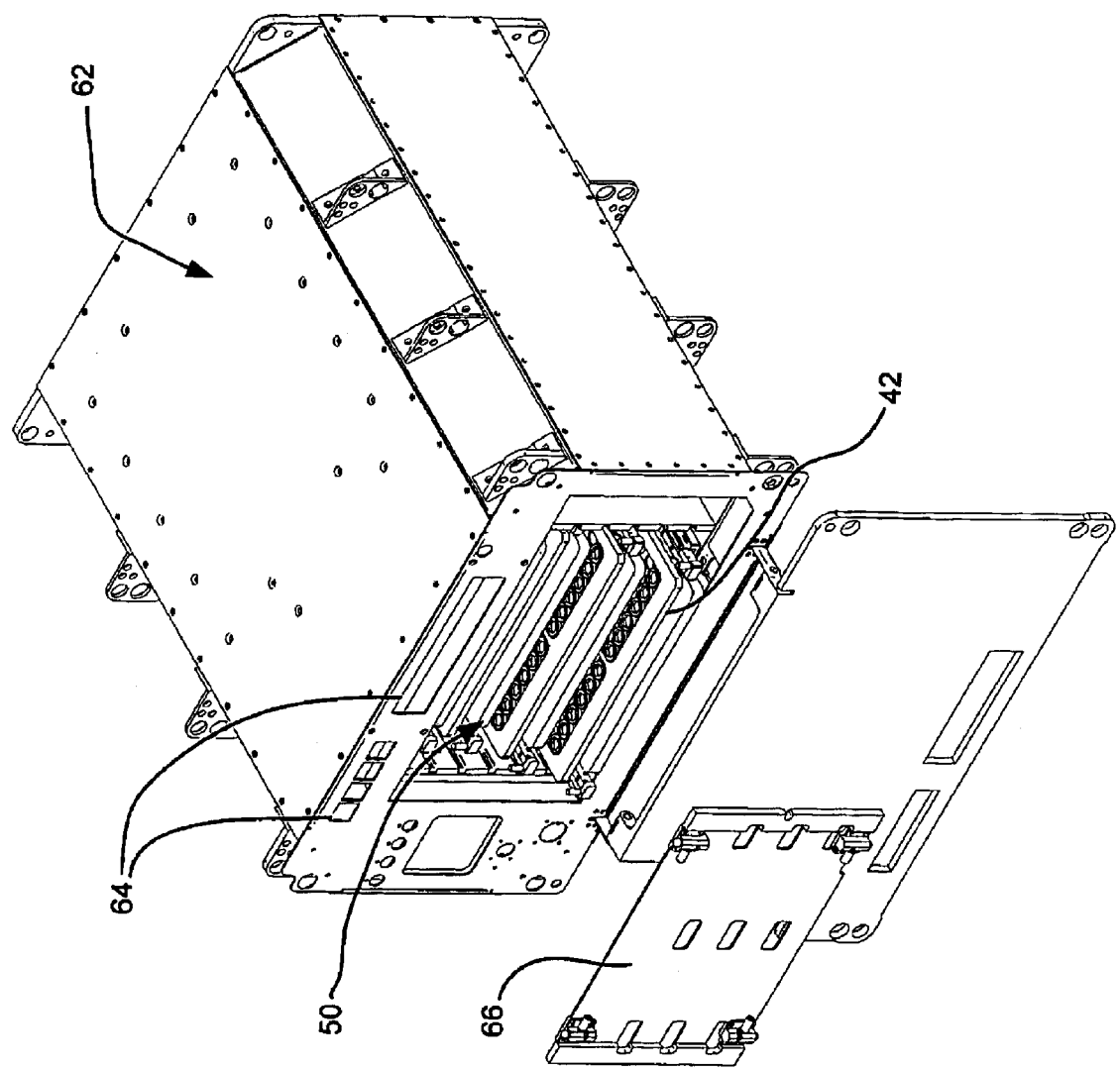

Illustrated in FIG. 5B is another embodiment of a HDPCG stacked tray assembly configuration 50 installed in a Commercial Refrigeration Incubator Module 62 (C-RIM) 62. The CRIM 62 provides a crew interface 64 required for setting the temperature profiles and monitoring the state of the system for the experiment. In addition, the CRIM 62 provides a retainer door assembly 66.

Figure 6A:
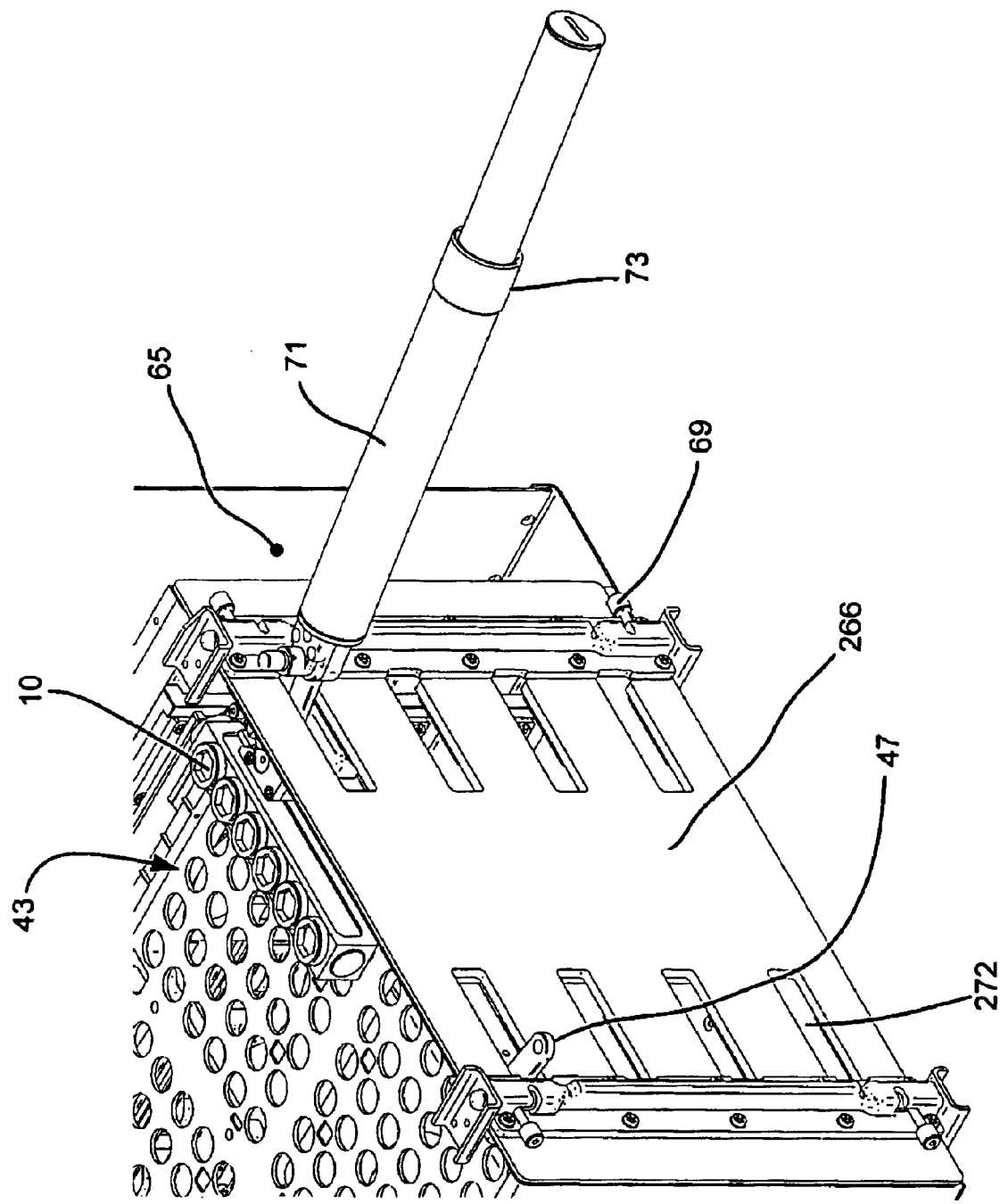
FIG. 6A illustrates one example of one embodiment of a method of activating/deactivating a tray and a commercial protein crystal growth (CPCG) actuator handle in its extended position engaging the pivot assembly of the tray.

As illustrated in FIG. 6A, one embodiment of a HDPCG experiment is easily activated, or deactivated by the use of the commercial protein crystal growth (CPCG) actuator handle 71. The actuator handle 71 is retrieved from the CRIM-M Internal Storage Compartment 65 where it is collapsed for storage. In order to activate/deactivate the experiment the CRIM-M door 70 (not shown) must be opened and the foam insulation 67 (not shown) temporarily removed. This allows the retainer door 266 to be visible. There are eight slots 272 that are located on the retainer door 266. Each slot 272 is labeled and contains a pivot 47 that extends through the slot so that the actuator handle 71 can be used to activate/deactivate the sample tray assembly 43. This allows for the ease and flexibility of activating/deactivating the sample tray assemblies 43 individually. For clarity only one growth cell assembly 10 is shown.

The actuator handle 71 is extended for leverage by loosening the locking ring 73. Once the actuator handle 71 is extended, the locking ring 73 is tightened. The actuator handle 71 is ready to engage and secure the pivot 47 by snapping the actuator's clevis around the pivot hole 272. Once the pivot 47 is secured by the actuator handle 71, it is then pushed to the left or right depending on the flight configuration. The actuator handle 71 is then removed by pulling the actuator handle 71 from the pivot 47. This has activated/deactivated one side of the sample tray assembly 43. The opposite side of the sample tray 43 is activated/deactivated in the same manner and this sequence is repeated for the remaining three trays. Also shown is a latch assembly 69.

Once all of the sample tray assemblies 43 have been activated/deactivated, the locking ring 73 on the actuator handle 71 is loosened and pushed into the original position. The locking ring 73 is tightened to secure the handle 71. The actuator handle 71 then is placed back into the CRIM-M Internal Storage compartment 65. The experiment is activated/deactivated once all four trays have been activated/deactivated. For reference, in one specific example, 50° of rotation on the pivot assembly 47 will correspond to 0.851" of rack 46 linear translation and 180° of rotation on the cell barrel 14 inside the growth cell assembly 10.

The CPCG-HDPCG experiment assembly includes the CRIM-M 63 and the installed stacked HDPCG tray assembly configuration 250. The Space Shuttle Orbiter Middeck can be used as the payload carrier for this apparatus. A payload mounting panel (PMP) will be used to mount the experiment locker into the payload carrier location. This locker configuration may be designed to be a cabin air breather. Payloads that are located in the Orbiter Middeck may be in the following areas: (a) aft surface of wire trays of Avionics Bays 1 and 2, or (b) forward surface of wire trays of Avionics Bay 3A. Of course, the availability of specific locations for payload use may be subject to the amount of ducted and non-ducted air cooling, power required by the individual middeck payloads, mission profile and its length, the size of the Orbitor crew, and amount of crew equipment to be stowed in standard stowage lockers at these locations.

Figure 6B:
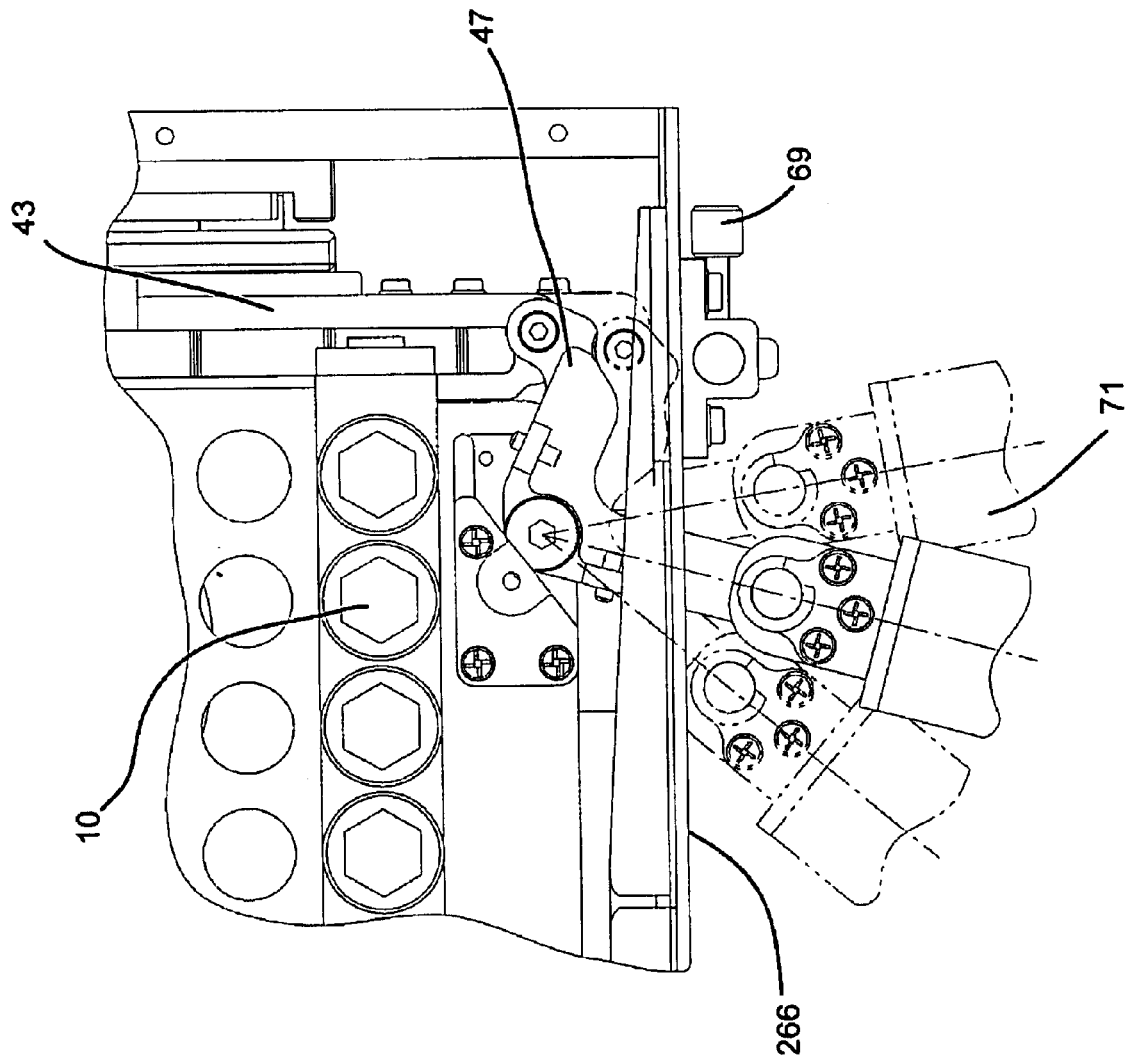
FIG. 6B illustrates one example of one embodiment of a pivot assembly pivot rotation.

FIG. 6B illustrates the actuator handle 71 at various positions while in the process of activating/deactivating an experiment. As the actuator handle 71 is rotated, the pivot assembly 47 rotates to activate/deactivate the experiment.

As illustrated in FIG. 6A the HDPCG experiment is easily activated, or deactivated by the use of a Activation/Deactivation Handle 68. The handle 68 can be retrieved from possible stowage within the C-RIM 62 with installed HDPCG apparatus, as shown in FIG. 6B. In order to activate/deactivate the experiment the C-RIM door 70 must be opened. This allows the retainer door 66 to be visible. There are 12 slots 72 that are accessible on the retainer door 66. Each slot corresponds to a tray 42 located within the HDPCG apparatus. This allows for the ease and flexibility of activating/deactivating a tray 42 individually.

Figure 6C:
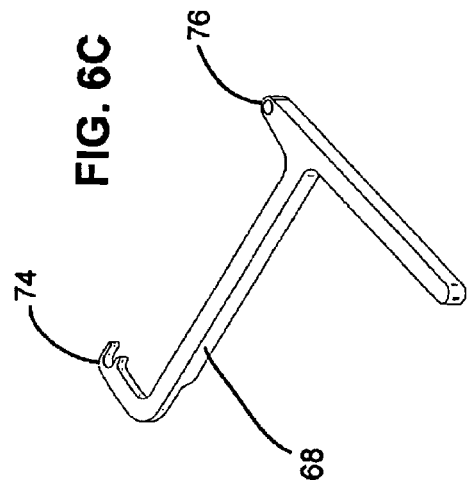
FIGS. 6C–D illustrate one example of one embodiment of an Activation/Deactivation tool and incubator assembly.

FIG. 6C illustrates another embodiment of an activation/deactivation handle 68. In order to activate the tray 42 the handle 68 is inserted through one of the slots 72. The handle 68 is then used to engage a pin (not shown) on the rack with a slot 74. The handle 68 has a pivot 76 and pivots on the retainer door 66 where it can be rotated 60° clockwise (CW) to activate the sample tray 42. The handle 68 will activate both sides of the sample tray 42, one side at a time. The opposite side of the sample tray 42 is then activated by removing the handle 68 and rotating it 180°. Once again the handle 68 is inserted through two of the slots 72 in order to activate the opposite side of the sample tray 42. Once the pin 78 is engaged the handle is rotated 60° counterclockwise (CCW). This completes the activation sequence for the sample tray 42.

Figure 6D:
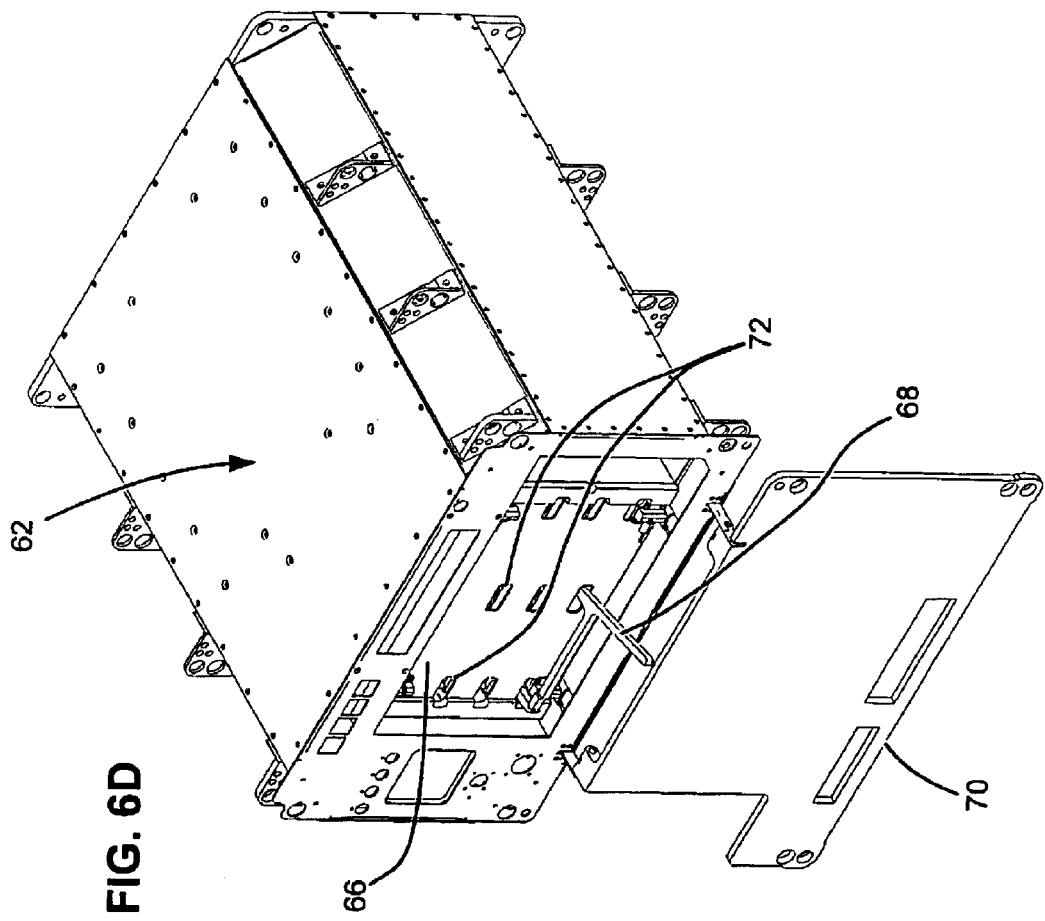

FIG. 6D illustrates the handle 68 in operation. The handle 68 is first retrieved from stowage, then the C-RIM door 70 is opened and the retainer door 66 becomes visible. The handle 68 is inserted through the slots 72 on the retainer door 66 corresponding to the sample tray 42 that is to be deactivated. Once the pin (not shown) on the rack is engaged, the handle 68 is rotated 120° CCW to deactivate. The opposite side of the sample tray 42 is then deactivated by removing the handle 68 and rotating it 180°. Once the pin 78 on the rack is engaged, the handle is rotated 120° CW to deactivate the opposite side of the sample tray 42. This completes the deactivation sequence for the sample tray 42.

Figure 7:
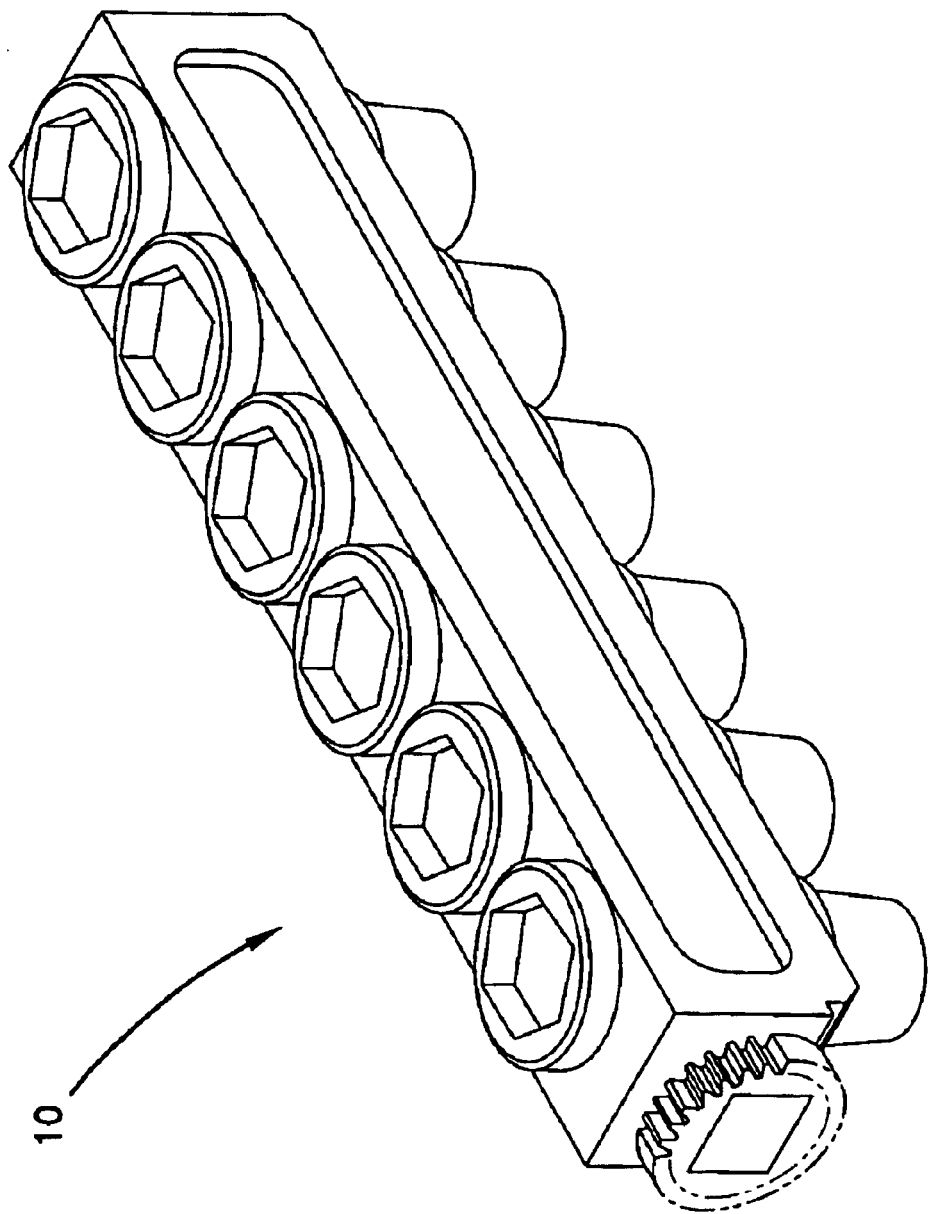
FIG. 7 illustrates one view of one embodiment of a high density protein crystal growth cell assembly.

FIG. 7 illustrates another view of one embodiment of a High Density Protein Crystal Growth growth cell assembly 10.

Figure 8:
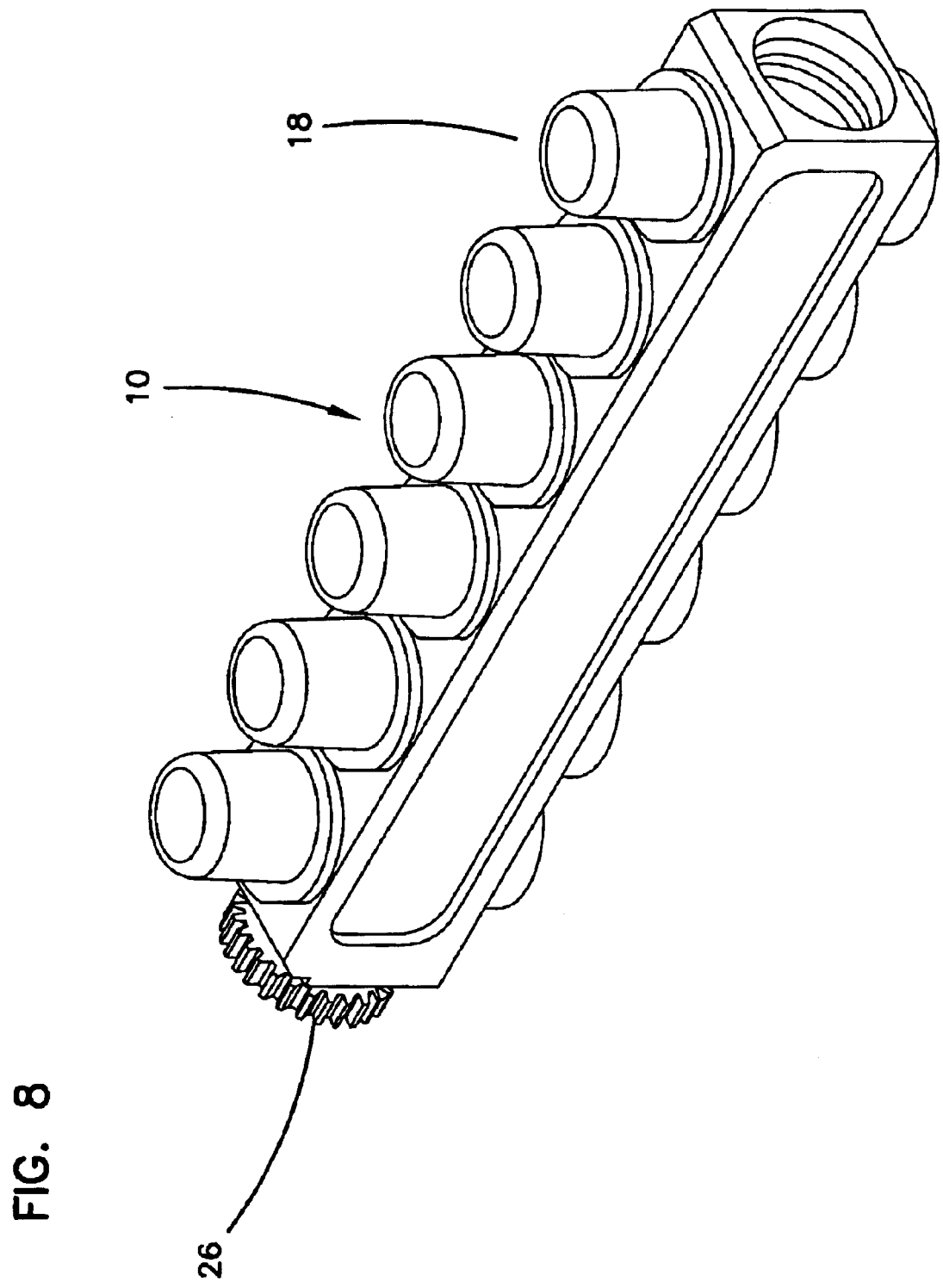
FIG. 8 illustrates one view of one embodiment of a precipitant (PPT) reservoir and protein crystal growth cell assembly.

FIG. 8 illustrates one embodiment of a PPT reservoir 18 of the growth cell assembly 10, made from Molded Clear Polysulfone P1700 and, for example having a fluid capacity of ½ milliliters. The PPT reservoir 40 houses a CHROMEX barrier to contain the reservoir solution. CHROMEX is one example of a ultra high molecular weight polyethylene material.

Figure 9:
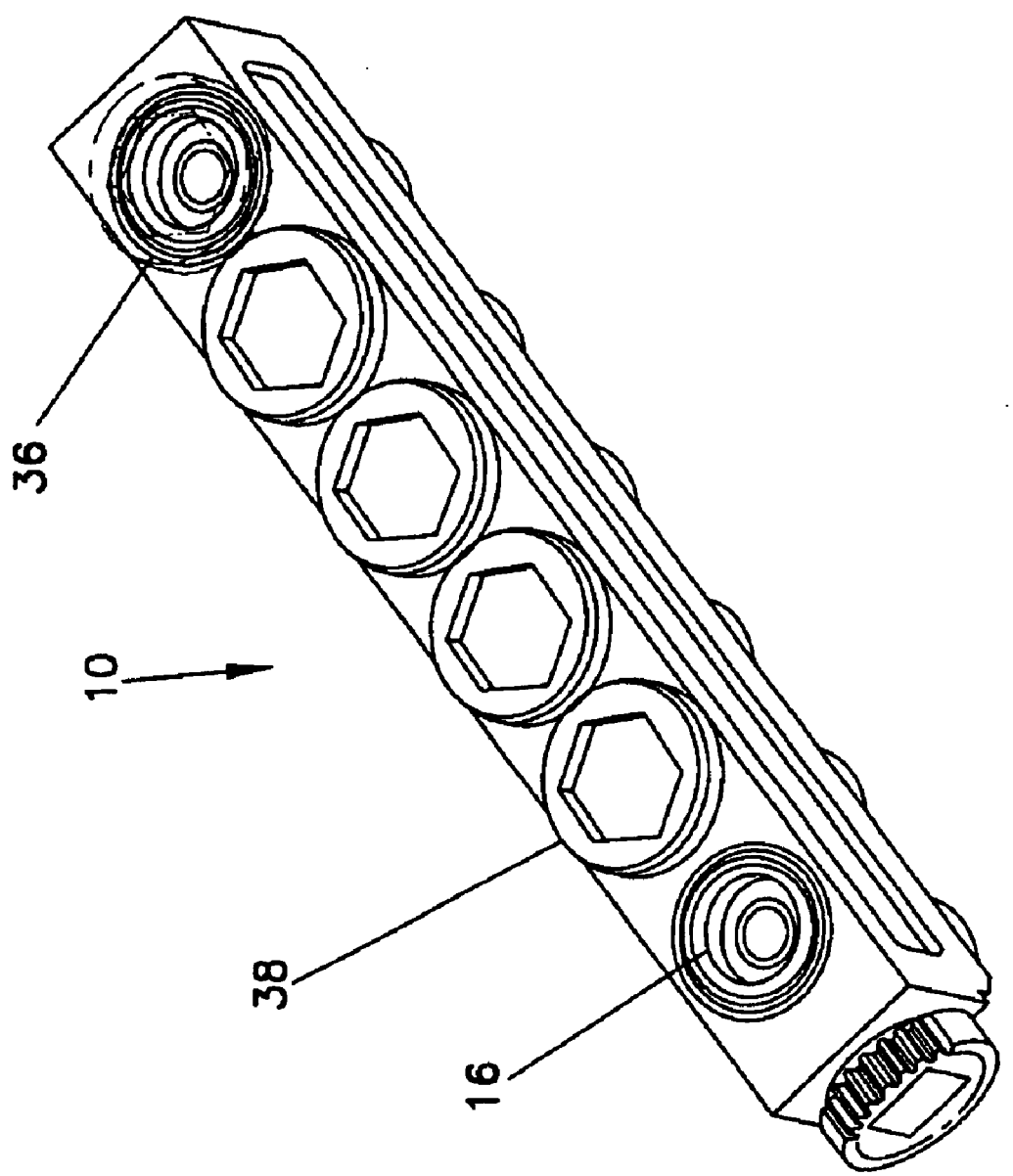
FIG. 9 illustrates one view of one embodiment of a protein crystal growth cell assembly illustrating an example of a high density access cap.

FIG. 9 illustrates another view of one embodiment of a growth cell assembly 10 illustrating the hd access cap 38 which is designed in conjunction with the XCF CPPI for remote access by means of the hex head cap. Access to the protein insert is obtained by rotating the access cap 38 45 degrees. The O-rings reside in the containment 36. The protein insert 16 can be removed from the back without having to disassemble the entire block. Both the access cap 38 and protein insert 16 can be molded from optical grade LEXAN for clarity.

Figure 35A:
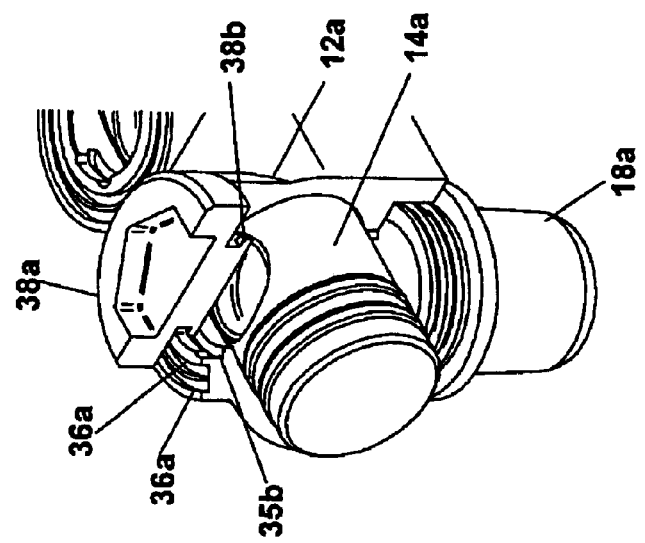
FIG. 35A illustrates a top perspective view of another embodiment for a high density access cap for a protein crystal growth cell assembly showing the cap removed.

FIGS. 35A–35D illustrate another embodiment of an hd access cap 38a for a protein crystal growth assembly 10a. FIG. 35A illustrates a single crystal growth cell with a cell body 12a, a cell barrel 14a, and a PPT reservoir 18a, where the cell body 12a includes a connective space 35b having at least one lip portion 35a that can connect with the hd access cap 38a. The access cap 38a is shown removed from the cell body 12a. The access cap 38a includes a tab portion 38b. The tab portion 38b engages with the lip portion 35a to releasably connect the access cap 38a to the cell body 12a. Preferably, a pair of lip portions 35a and a pair of tab portions 38b are employed for engaging the cap 38a to the cell body 12a. The access cap 38a includes a hex head configuration that provides a quick and easy one step access/closure of the growth cell, either manually or by mechanical automation such as with the XCF CPPI above. O-ring grooves 36a are employed to house resilient O-rings that provide a suitable seal between the access cap 38a and the cell body 12a when connected.

Figure 35B:
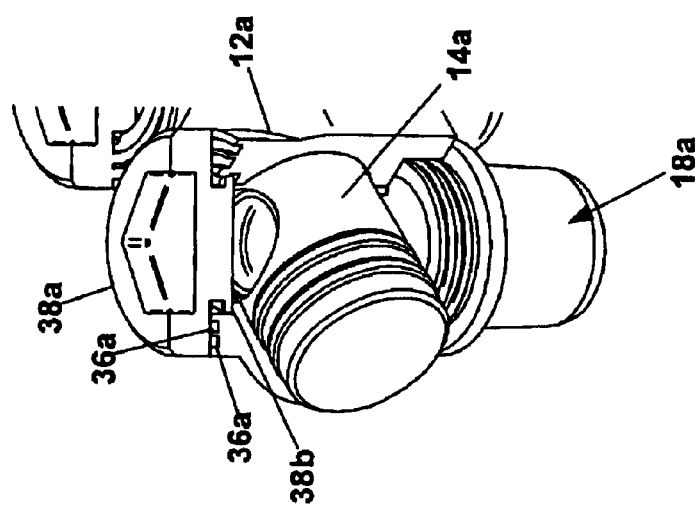
FIG. 35B illustrates a top perspective view of the high density access cap of FIG. 35A showing the cap installed but not yet rotated.
Figure 35C:
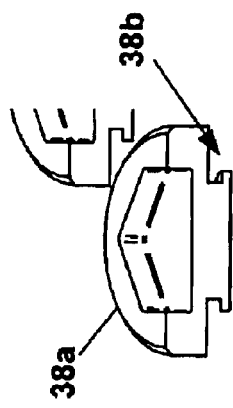
FIG. 35C illustrates a top perspective view of the high density access cap of FIG. 35A showing the cap rotated to a closed position.

FIG. 35B illustrates the access cap 38a connected with the cell body 12 in an access position, where the cap can be removed. As shown in FIG. 35B, the access cap is installed but not rotated into a closed position. The access cap 38a is releasably connected with the cell body 12a, and is rotatable to enable access or closure of the growth cell. Preferably, the access cap 38a is rotatable 45° degrees, as shown in FIG. 35C relative to FIG. 35B. FIG. 35C illustrates the access cap 38a rotated 45° degrees to the close the growth cell. In FIG. 35C the access cap 38a is in the closed position. FIG. 35D illustrates a plurality of crystal growth cells in an assembly 10a connected with a rotating mechanism including a gear 26a.

Figure 10A:
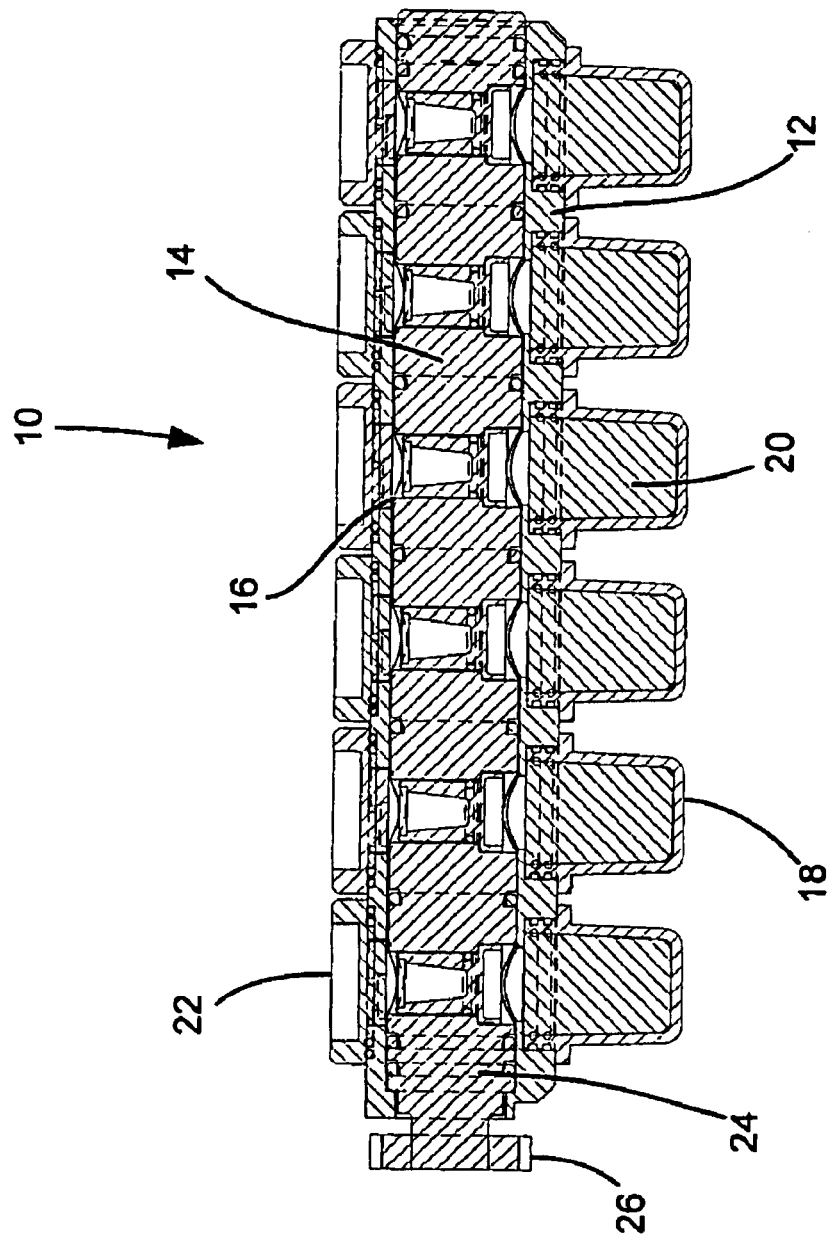
FIG. 10A illustrates a sectional view of one example of one embodiment of a protein crystal growth cell assembly in its fill/removal position.

FIG. 10A illustrates a sectional view of one embodiment of a growth cell assembly 10 in its fill/removal position. Note the position of the protein insert 16.

Figure 10B:
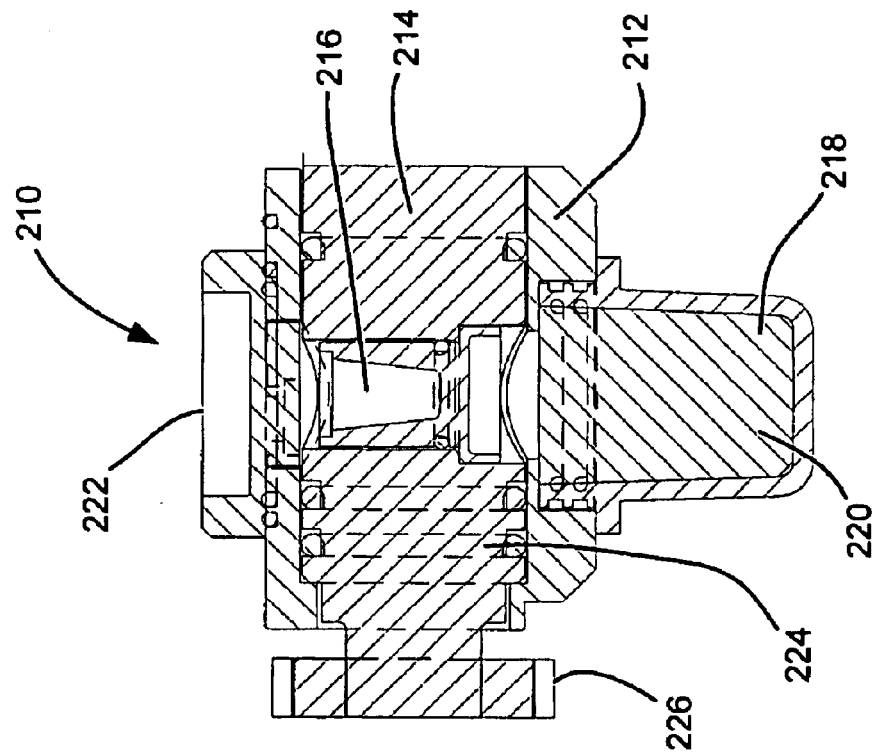
FIG. 10B illustrates a sectional view of one example of embodiment of a single protein crystal growth cell assembly in its fill/removal position.

FIG. 10B illustrates a sectional view of one embodiment of a single growth cell assembly 210 in its fill/removal position. Note the position of the protein insert 216. The single growth cell assembly 210 comprises the cell body 212, the cell barrel 214, protein insert 216, PPT reservoir 218, CHROMEX barrier 220, hex head access caps 222, O-ring 224 and a spur gear 226.

FIG. 11A illustrates a sectional view of one embodiment of a growth cell assembly 10 in its growth position. Note that the position of the protein insert 16 is opposite to that shown in FIG. 10A.

Figure 11B:
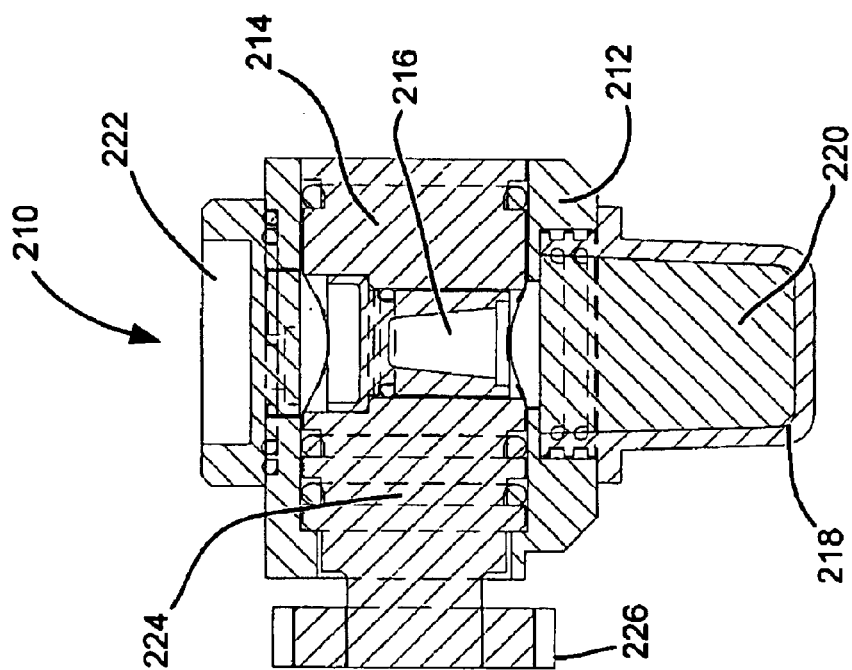
FIG. 11B illustrates a sectional view of one example of embodiment of a single protein crystal growth cell assembly in its growth position.

FIG. 11B illustrates a sectional view of one embodiment of a single growth cell assembly 210 in its growth position. Note that the position of the protein insert 216 is opposite to that shown in FIG. 10A.

Figure 30A:
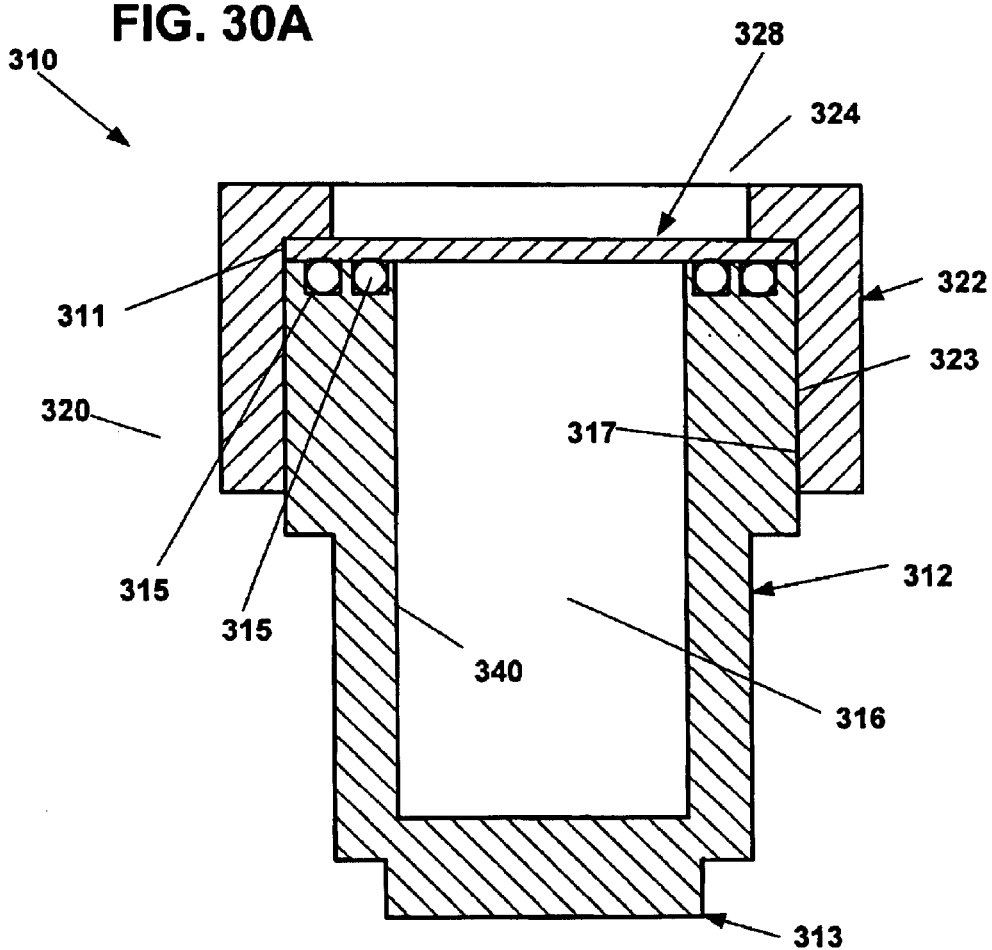
FIG. 30A illustrates a sectional view of one example of an embodiment of a single protein crystal growth assembly.
Figure 30B:
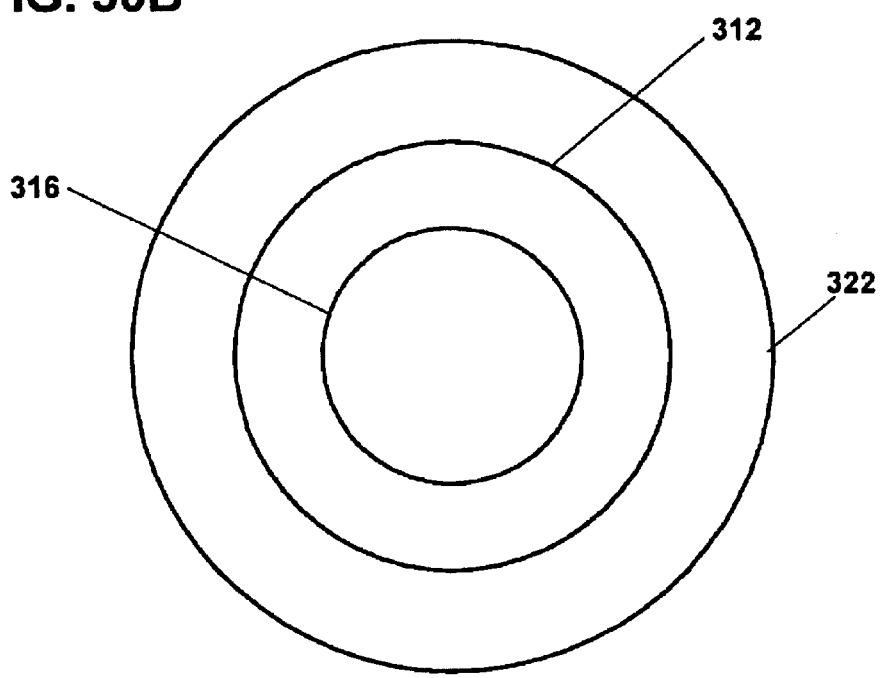
FIG. 30B illustrates a top view of the single protein crystal growth assembly of FIG. 30A.

FIGS. 30A–30B illustrate another embodiment of a single protein crystal growth assembly 310. The protein crystal growth assembly 310 includes a crystal growth cell 320. Preferably, the crystal growth cell 320 may be a bottle formed of a molded optical plastic material, such as a polysulfone material. The cells or bottles house many crystallization experiments, and are placed on an HDPCG tray assembly, for instance as shown and described above. Preferably, a plurality of protein crystal growth assemblies 310 are placed and arranged on an HDPCG tray assembly.

The crystal growth cell 320 includes a cell body 312 having a top side 311, a bottom side 313, and an inner surface 340 defining a reservoir 316. The reservoir 316 may be suitably sized to house various volumes. Preferably, the reservoir has a volume of 1.0 ml. A plate 328 is removably connected to the top side 311 of the body 312 to cover the reservoir 316. Preferably, the plate 328 is configured of an optically clear material, for instance an optical lens, and allows crystal growth observations with the VCMS. The top side 311 includes at least one sealing member 315 disposed thereon. Preferably, the sealing member has an annular shape and is formed of a resilient material. A cap 322 having a top surface 324 is removably disposed on top of the plate 328 and on the top side 311 of the body 312. Preferably, the top surface 324 of the cap is configured of an optically clear surface allowing crystal growth observations. Preferably, the cap 322 is formed of a molded optical plastic material. More preferably, the cap 322 includes a side surface 323 having a threaded portion for threadably engaging the cap 322 to the cell body 312. The threaded portion of the side surface 323 is threadably engaged with a threaded portion on a side surface 317 of the cell body 312. It will be appreciated that the cap 322 and body 312 may be constructed of a molded material, for instance polysulfone, as described above.

FIG. 30B illustrates a top view of the single protein crystal growth assembly 310 showing the cap 322, body 312, and chamber 316. Preferably, the assembly 310 is a substantially round shape.

Preferably, the protein crystal growth assembly 310 is used in temperature induction batch mode crystallization methods in which solutions are mixed in a homogeneous solution and do not require separating the protein, buffer and precipitating parts involved. Temperature control is needed to start and maintain crystal growth in a single volume. A first temperature is used to start the experiment, and the temperature is changed to a second temperature to initiate nucleation and subsequent crystal growth. The second temperature may be higher or lower than the first temperature as needed to initiate nucleation and crystal growth. The control is maintained in micro-gravity conditions by a CRIM, for instance as described above. As described above, small crystal growth cells 320, such as molded polysulfone bottles, are placed on the HDPCG tray assembly. Preferably, a plurality of bottles will interface with the trays similar to vapor diffusion growth assemblies, but these can house independent experiments and need not be housed in six cell configurations.

Figure 32D:
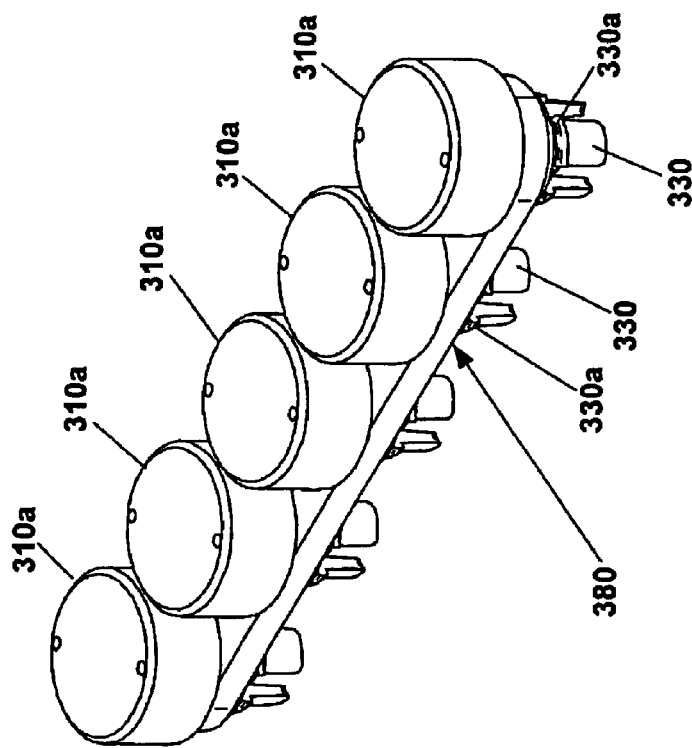
FIG. 32D illustrates a plurality of protein crystal growth assemblies connected with one embodiment of a ganging clip.
Figure 32A:
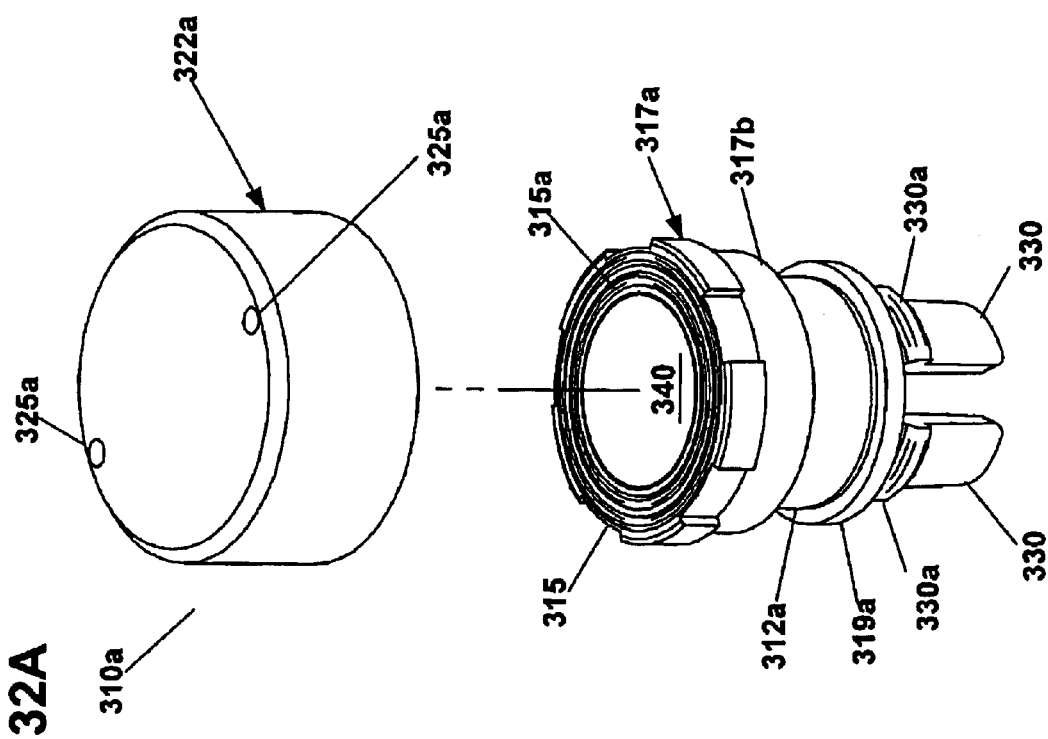
FIG. 32A illustrates a top perspective view of one embodiment for single protein crystal growth assembly.
Figure 34:
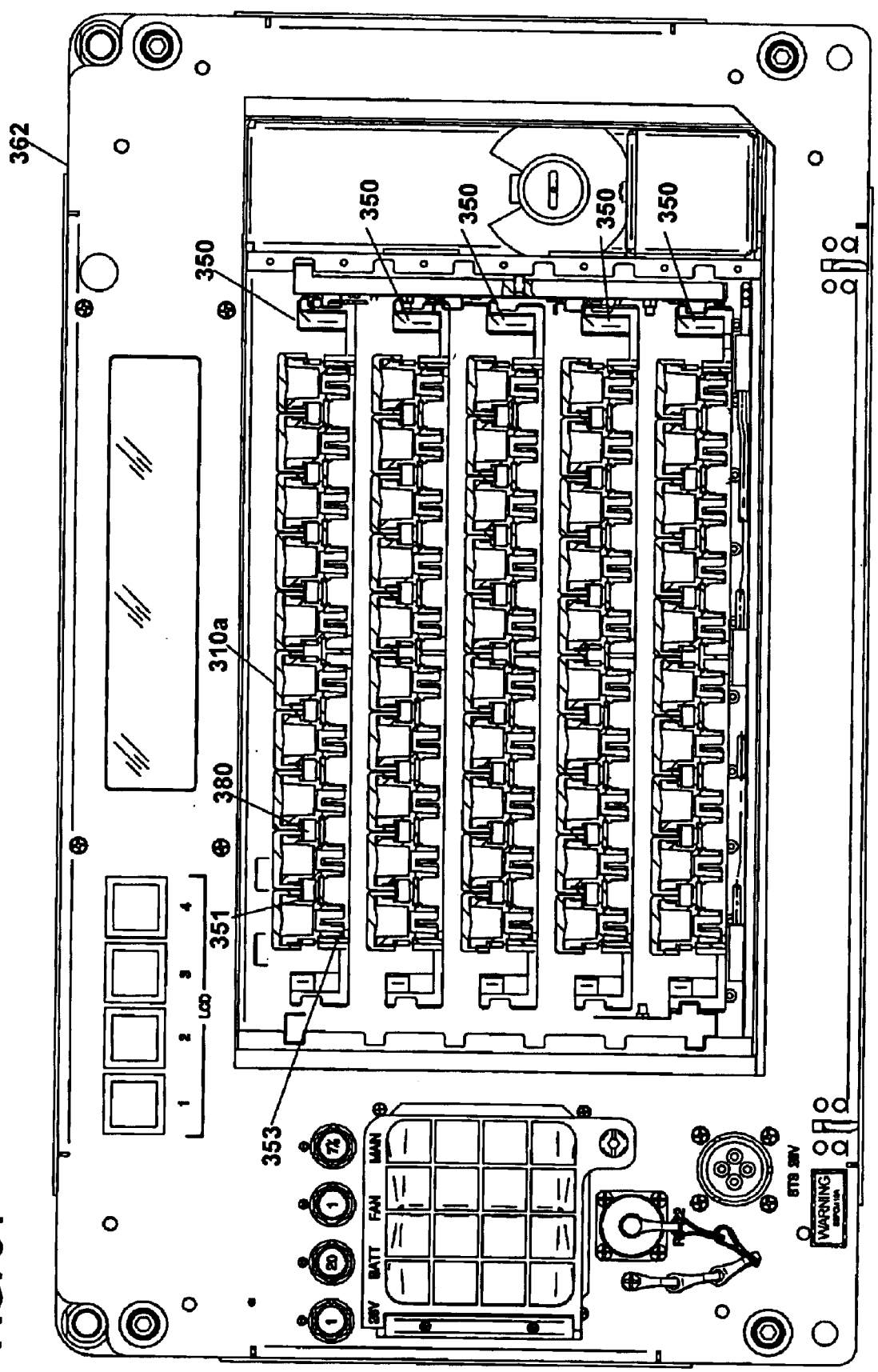
FIG. 34 illustrates a side view of one embodiment for multiple HDPCG trays contained in a CRIM-M.

FIGS. 32A–34 illustrate another preferred embodiment of a single protein crystal growth assembly 310a used in HDPCG temperature induction batch mode crystallization. Turning to FIGS. 32A to 32C, the protein crystal growth assembly 310a includes a crystal growth cell 320a. The crystal growth cell 320a may be a bottle formed of a molded optical plastic material, such as a polysulfone material. The cells or bottles may house many crystallization experiments, and are placed on an HDPCG tray assembly, as best shown in FIGS. 33A to 34 described below. Preferably, a plurality of protein crystal growth assemblies 310a are placed and arranged on an HDPCG tray 350 and can be placed in a CRIM-M 362, similar to the CRIM-M 62 described above.

The crystal growth cell 320a includes a cell body 312a having a top side 311a, a bottom side 313a, and an inner surface 340a defining a reservoir 316a. The reservoir 316a may be suitably sized to house various volumes. Preferably, the reservoir 316a has a volume of 1.0 ml. The top side 311a includes at least one sealing member 315a disposed thereon. Preferably, the sealing member 315a has an annular shape and is formed of a resilient material. The resilient member 315a may be an O-ring disposed about a circumference defined by the top side 311a.

A cap 322a having a top is removably attached to the top side 311a of the body 312a. Preferably, the cap 322a is formed of a molded optical plastic material, such as a molded polysulfone material. The sealing members 315a provide a redundant O-ring containment that seals the reservoir 316a shut when the cap 322a is attached onto the cell body 312a. The cap 322a includes a side surface 323a having a resilient lip member 323b for engaging a step portion 317b of a side surface 317a of the cell body 312. Preferably, the lip member 323b and the step portion 317b communicate to form a snap fit connection. It will be appreciated that other configurations may be employed for attaching the cap 322a to the cell body 312a, for instance the threaded connection described in FIGS. 30A–30B above.

Preferably, the cap 322a includes oppositely disposed mating holes 325a such that the cap 322a can be removed by attaching a spanner wrench (not shown) to access/close the growth cell 320a. More preferably, the growth cells are designed to interface with the XCF CPPI similar to the other growth cells described above for a one step access/closure to facilitate automation.

Figure 32B:
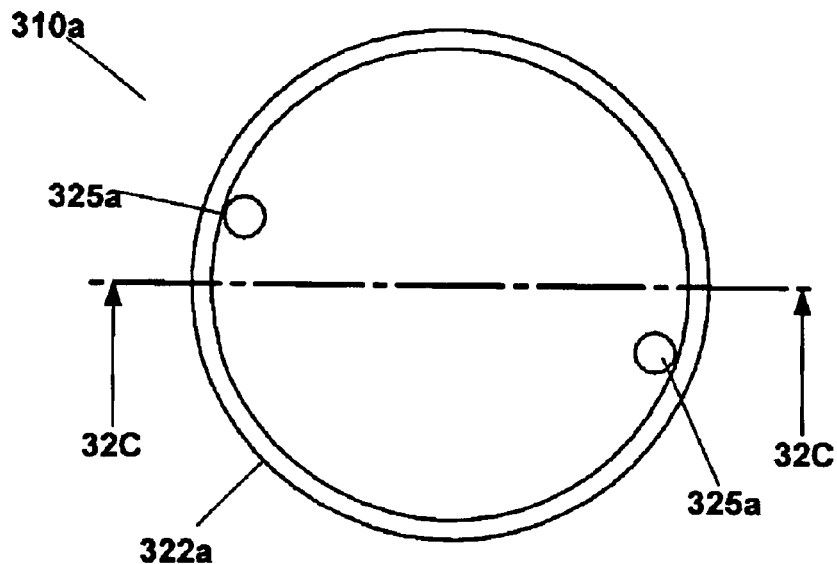
FIG. 32B illustrates a top view of the protein crystal growth assembly of FIG. 32A.
Figure 32C:
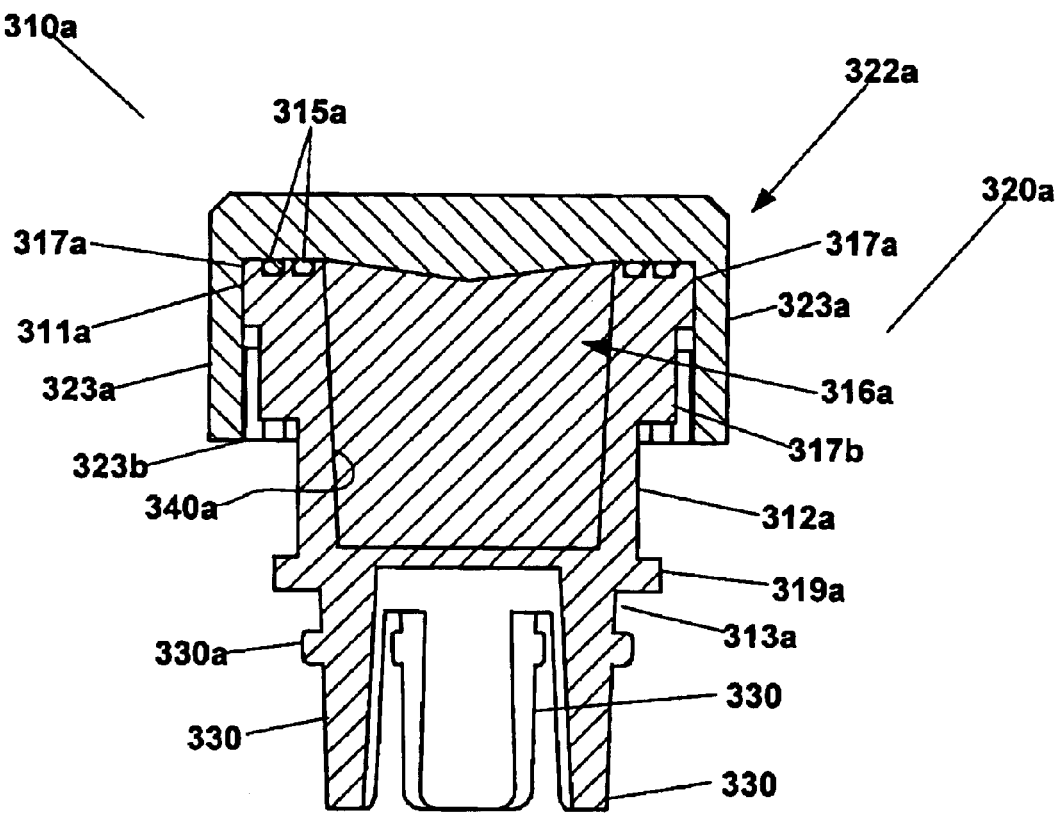
FIG. 32C illustrates a sectional view A—A of the protein crystal growth assembly of FIG. 32A.

FIG. 32B illustrates a top view of the single protein crystal growth cell 320a showing the cap 322a. Preferably, the cell 320a is a substantially round shape.

FIG. 32D illustrates a plurality of crystal growth assemblies 310a where a ganging clip 380 includes a plurality of holes 381 (best shown in FIG. 33B) to enable a single crystal growth assembly 310a to be inserted into each hole provided. Preferably, each ganging clip 380 includes five holes to allow insertion of five crystal growth assemblies 310a. More preferably, the ganging clip 380 is portable for easy placement in the XCF CPPI. The cell body 312a includes a flange 319a that can be forcibly pushed through a hole in the ganging clip 380 to provide a snap fit connection between each crystal growth assembly 310a and each hole of the ganging clip 380. Preferably, the holes 281 of the ganging clip 380 include a diameter less than a diameter defined by said flange 319a to provide the snap fit connection.

FIGS. 33A–33C illustrate growth cells 320a of crystal growth assemblies 310a attached to multiple ganging clips 380 and connected to a HDPCG tray 350. Preferably, each HDPCG tray 350 is designed with a plurality of slots 353 to house 200 growth cells 320a of a 1.0 ml size. Preferably, the slots 353 in the HDPCG tray 350 are arranged in a 10×20 configuration as shown in FIG. 33A, where two ganging clips 380 each having 5 crystal growth cells 320a are connected thereto to define 10 crystal growth cells 320a across one row. Resilient elongated members 330 extend outwardly from the bottom side 313a of the cell body 312a. The resilient elongated members 330 each include a barb or protrusion 330a extending outwardly and transversely to the extension of the elongated member. Each growth cell 320a is releasably connected within a slot 353 of the HDPCG tray 350 through a snap fit connection. Preferably, the resilient elongated member 330 bends enough to allow clearance into the slot 353, and then returning to its original position after insertion, thereby attaching the growth cell 320a to the tray 350. The barb 330a passes a retaining member 351, such as a tab, of the tray 350, and retains the growth cell 320a within the slot 353 of the tray 350, as best shown in FIGS. 33B, 33C.

Preferably, the growth cells 320a allow for viewing and monitoring by the VCMS. In addition, the ganging clip 380 may be detachable or removable from the growth cell. Such construction enables microscopic examination of grown crystals in the growth cells after being returned to earth. As the grown crystals settle to the bottom of the growth cell after formation when subjected to earth's gravity, an inverted microscope is needed to view the crystals through the bottom of the growth cell. The ganging clip 380 being removable facilitates this examination.

FIG. 34 illustrates a plurality of HDPCG trays 350 placed in the CRIM-M 362. Preferably, the CRIM-M 362 is as previously described, and a total of five HDPCG trays 350 are held in the CRIM-M, such that a total of 1000 experiments of 1.0 ml volume size can reside in a single mid-deck locker flight experiment.

As above, the protein crystal growth assembly 310a is used in temperature induction batch mode crystallization methods in which solutions are mixed in a homogeneous solution and do not require separating the protein, buffer and precipitating parts involved. Temperature control is needed to start and maintain crystal growth in a single volume. The control is maintained in micro-gravity conditions by a CRIM, for instance as described above. As described above, small crystal growth cells 320a, such as molded polysulfone bottles, are placed on a plurality of HDPCG trays and housed in the CRIM-M.

FIGS. 31A–31B illustrate another embodiment of a single protein crystal growth assembly 410. FIG. 31A represents the protein crystal growth assembly 410 in a deactivated position. FIG. 31B represents the protein crystal growth assembly 410 in an activated position. The protein crystal growth assembly 410 includes a crystal growth cell 420. The crystal growth cell 420 may be formed of a molded material, for instance polysulfone.

The crystal growth cell includes a body 412 having a top side 411, a bottom side 413, and an inner surface 440 defining a chamber 416 having an upper portion 416a and a lower portion 416b. Preferably, the top side 411 includes a surface constructed of an optically clear surface to allow viewing and monitoring by the VCMS through the top side 411. The bottom side 413 includes at least one sealing member 415a disposed thereon. Preferably, the sealing member 415a has an annular shape and is formed of a resilient material. The upper and lower portions 416a, 416b of the chamber 416 each include at least one hole 424 operatively connected to the upper and lower portions 416a, 416b. The holes 424 may be closed by any suitable means when not in use, for instance during filling and/or venting conditions. Preferably, the holes 424 are disposed at side surfaces of the cell body 412, as best shown in FIGS. 31A, 31B. The bottom side 413 is adaptable for placement onto a HDPCG tray assembly, for instance, as described above. Preferably, a plurality of protein crystal growth assemblies, such as 410, may be placed and arranged on a HDPCG tray assembly.

A cell member 430 defines an opening 432 therethrough, and the cell member 430 is rotatably connected within the upper portion 416a of the chamber 416. The cell member 430 includes at least one aperture 452 defined therethrough, where the aperture 452 is operatively connected to a rotating mechanism, for instance as shown and described above. The aperture 452 is disposed transverse to the opening 432. The cell member 430 includes an upper sleeve 414 disposed within the opening 432. The upper sleeve includes an opening 414a substantially lining and coaxial with the cell member opening 432, and includes a segment 415 transversely disposed across the upper sleeve opening 414a. The segment 415 is formed of a molded optical material to allow viewing and monitoring by the VCMS. The upper sleeve 414 of the cell member 430 is rotatable, such that the openings 432 and 414a are rotatably alignable, in one deactivated position, with the at least one hole 424 of the upper portion 416a, and are rotatably alignable, in another activated position, with a lower sleeve 418 formed in the lower portion 416b of the chamber 416. Preferably, the upper sleeve 414 and the lower sleeve 418 are constructed of a molded plastic material, and may be suitably sized depending on the requirements for an experiment. A cap 422 is disposed at the bottom 413 of the crystal growth cell 420 and connects to the cell body 412, and is sealed with sealing members 415a.

The cell member 430 is rotatable between deactivated and activated positions. A first liquid A may be disposed within the opening 414a of the upper sleeve 414, and a second liquid B may be disposed within the opening 418a of the lower sleeve 418. In the deactivated position, as best shown in FIG. 31A, the cell member 430 is oriented such that the openings 414a and 432 are in alignment with the aperture 424. Preferably, the deactivated position allows filling and venting of internal volumes of the upper and lower sleeves 414, 418 through the apertures 424.

In the activated position, as best shown in FIG. 31B, the cell member 430 is oriented such that the openings 414a and 432 are in alignment with the opening 418a of the lower sleeve 418 formed within the lower portion 416b of the chamber 416. As shown in FIG. 31B, the opening 414a of the upper sleeve is in communication with an opening 418a of the lower sleeve 418. The activated position enables the first liquid A to touch the second liquid B at an interface 450 upon alignment, where the liquids A, B diffuse through the interface 450 to allow crystal growth. Preferably, the cell member 430 rotates 90° between the deactivated and activated positions.

The cap 422 is an access cap that is removable from the cell body 412, and can be formed of a molded plastic material. Preferably, the cap is designed to accept automated manipulation if available.

Preferably, the protein crystal growth assembly 410 is used in liquid to liquid crystallization methods, also known as free interface diffusion, in which different solutions are separated at launch and allowed to touch once in microgravity. The solutions slowly diffuse through the interface and allow for crystal growth. Much like vapor diffusion growth cell assemblies in HDPCG, the temperature is maintained at a constant temperature, and is controlled by the CRIM, for instance as described above. The mechanism for rotation will be the same as that used on the HDPCG tray assemblies discussed above, with the exception that the rotation is preferably 90° between the activation and deactivation positions in the liquid to liquid crystallization method. Preferably, the liquid to liquid protein crystal growth assemblies are similar to vapor diffusion growth cell assemblies in that multiple experiments are housed in six cell configurations for ease of use and transportability.

In addition, the protein crystal growth assembly 410 may be used in batch crystallization methods, where mechanical shaking or agitation of the growth cells is done manually by an astronaut or by automated manipulation.

FIGS. 12A–C illustrate various embodiments of a protein insert 16 produced by LIGHTWAVE PRODUCTS. The protein insert 16 holds up to 50 micro-liters, is made for example of optical grade LEXAN and includes a tapered well 32 as determined by the KC-135 zero gravity test plane and is available in an optional molded version. The modified protein inserts 16' have a volume capacity of 20 microliters or less. Pinning edge 34 will restrict drops from wicking up the walls while in micro-gravity.

Figure 13:
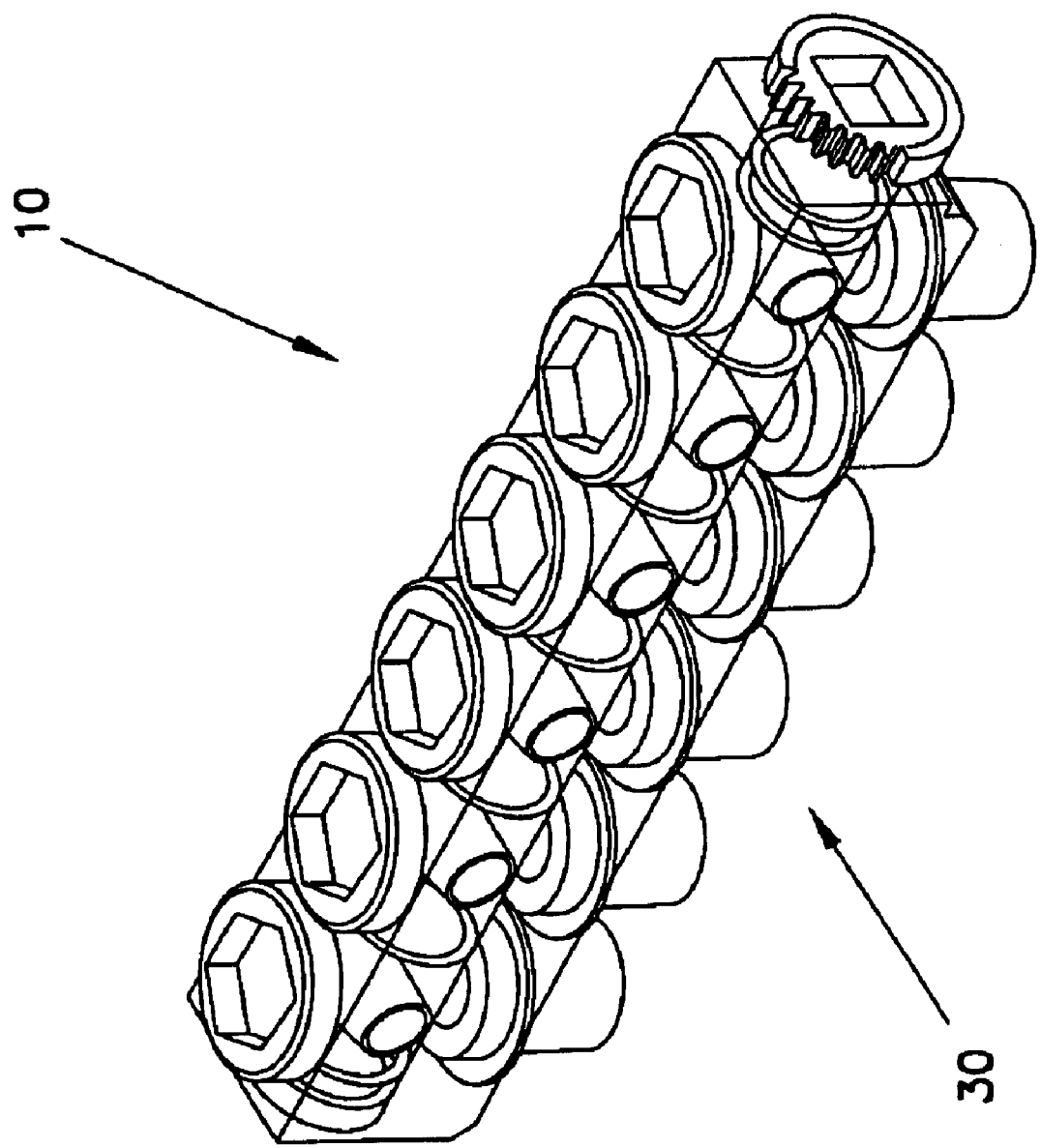
FIG. 13 illustrates one example of one embodiment of a protein crystal growth cell assembly in a launch configuration and direction of a corresponding launch G-Force vector.

FIG. 13 illustrates one embodiment of a growth cell assembly 10 in its launch configuration and corresponding launch G-Force vector 30.

Video Command and Monitoring System (VCMS) System Description

As part of the overall system, the present invention provides a Video Command and Monitoring System (VCMS) that is part of the second phase of a three phase program for commercial protein crystal growth (CPCG). The VCMS system will be used to evaluate protein crystal quality, size, location within HDPCG (CPCG-H) tray, and the potential for X-ray data collection.

Figure 15A:
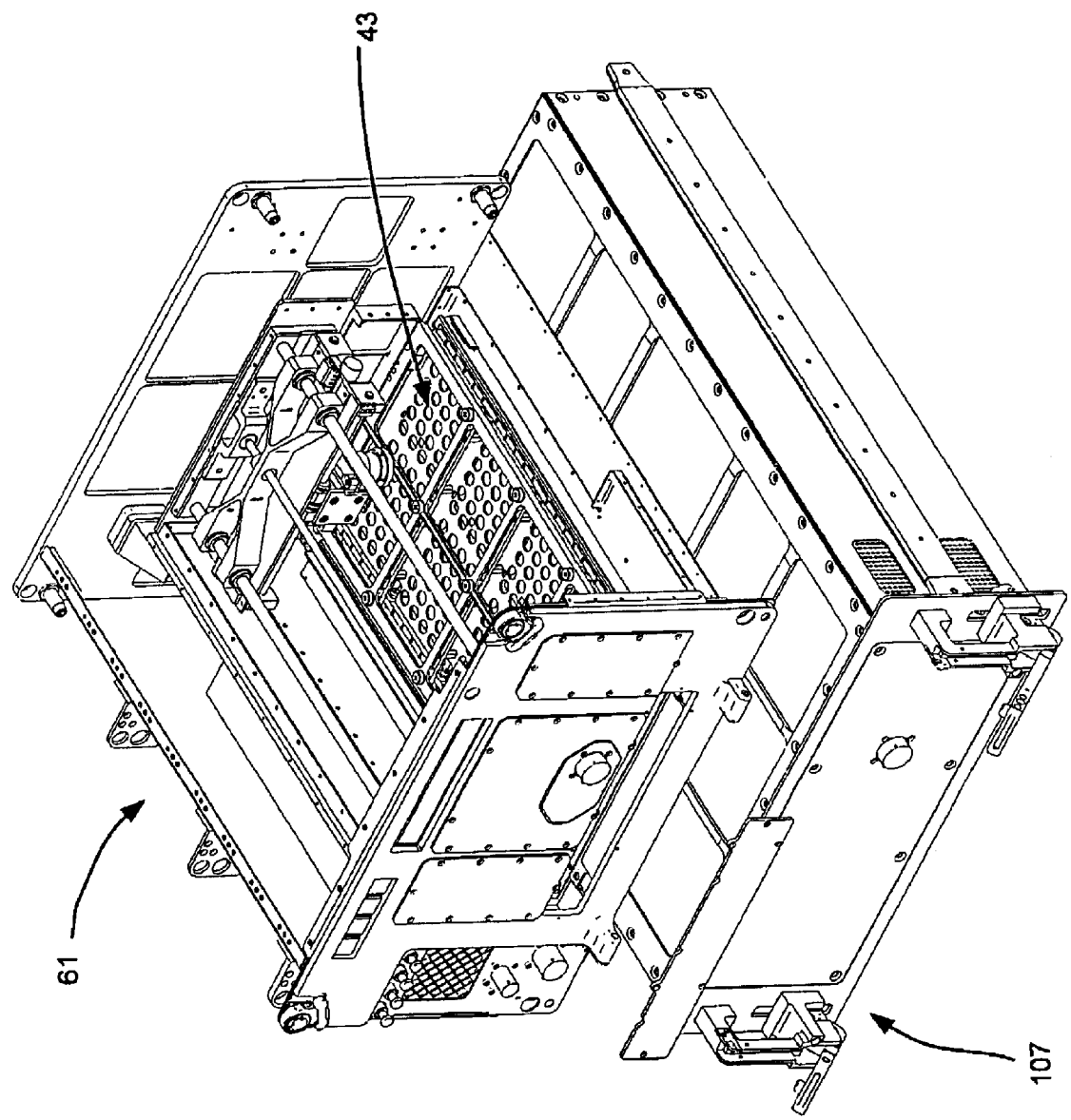
FIGS. 15A–B illustrate examples of embodiments of a VCMS chassis and a VCMS controller.

FIG. 15A illustrates one embodiment of a CPCG payload complement comprising three components: a HDPCG stacked tray assembly 43 (CPCG-H), a VCMS—video & translation chassis 61 (CPCG-V) and a VCMS—controller 107 (CPCG-C). The HDPCG tray assembly 43 and VCMS 61 payloads will reside in thermal carriers.

Figure 15B:
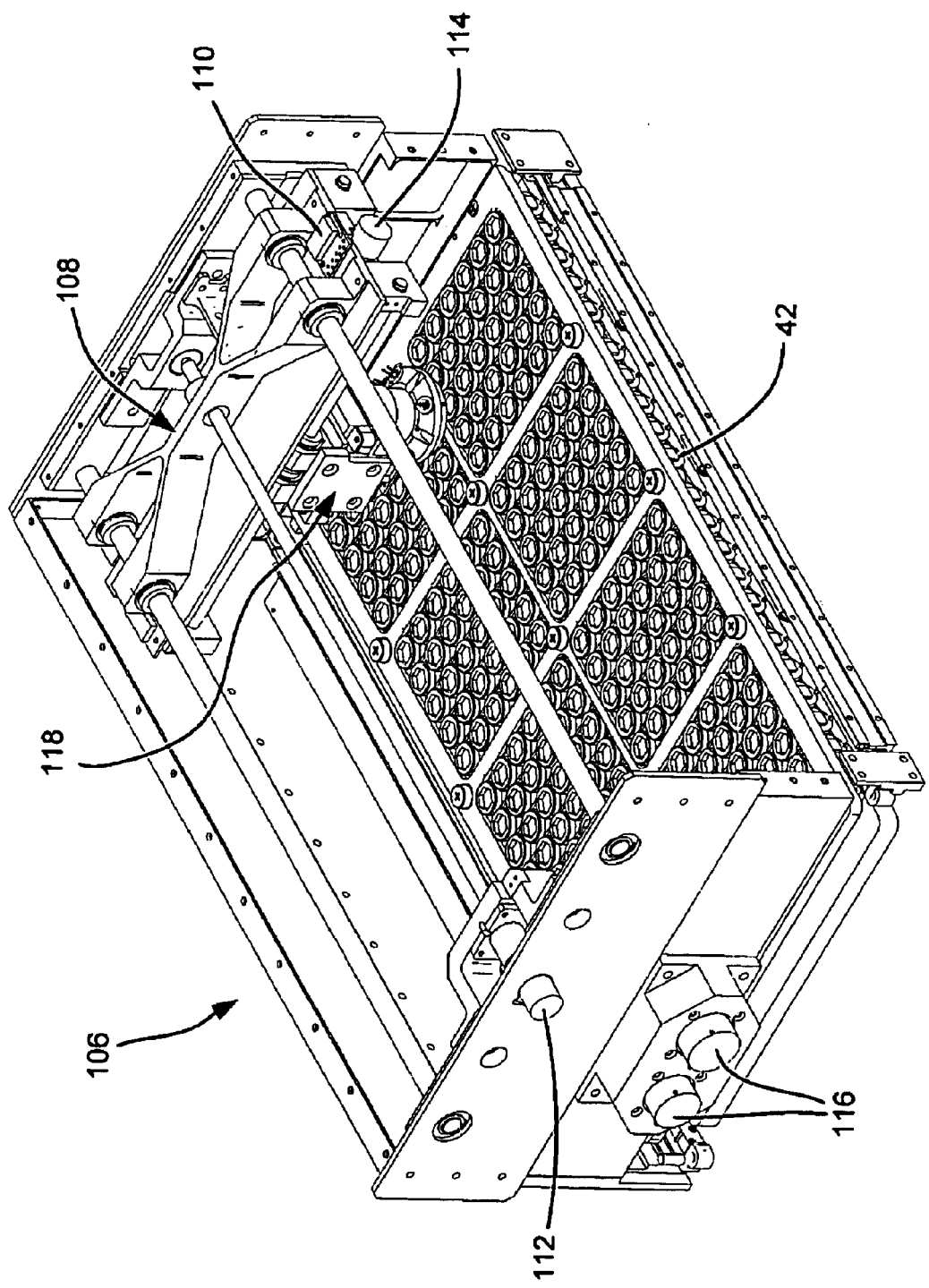

FIG. 15B illustrates another embodiment of a the VCMS chassis 106 that houses the video camera assembly 118 and the HDPCG tray assembly 42 during experiments. The chassis 106 further includes an X-Y stage with the mounted video camera assembly 108, the X-Y stage including an X-stage stepper motor 112 and a Y stage stepper motor 114. The X-Y stage assembly 108 indexes a translating camera assembly 118 utilizing a Y stage stepper motor 114 and an X stage stepper motor 112. The X and Y stage stepper motors 112, 114, respectively, are interfaced with the VCMS controller 84 via controller connectors 116. The system further provides flexible cable routing that interfaces with a flex cable zero insertion force (ZIF) connector 110.

Figure 16A:
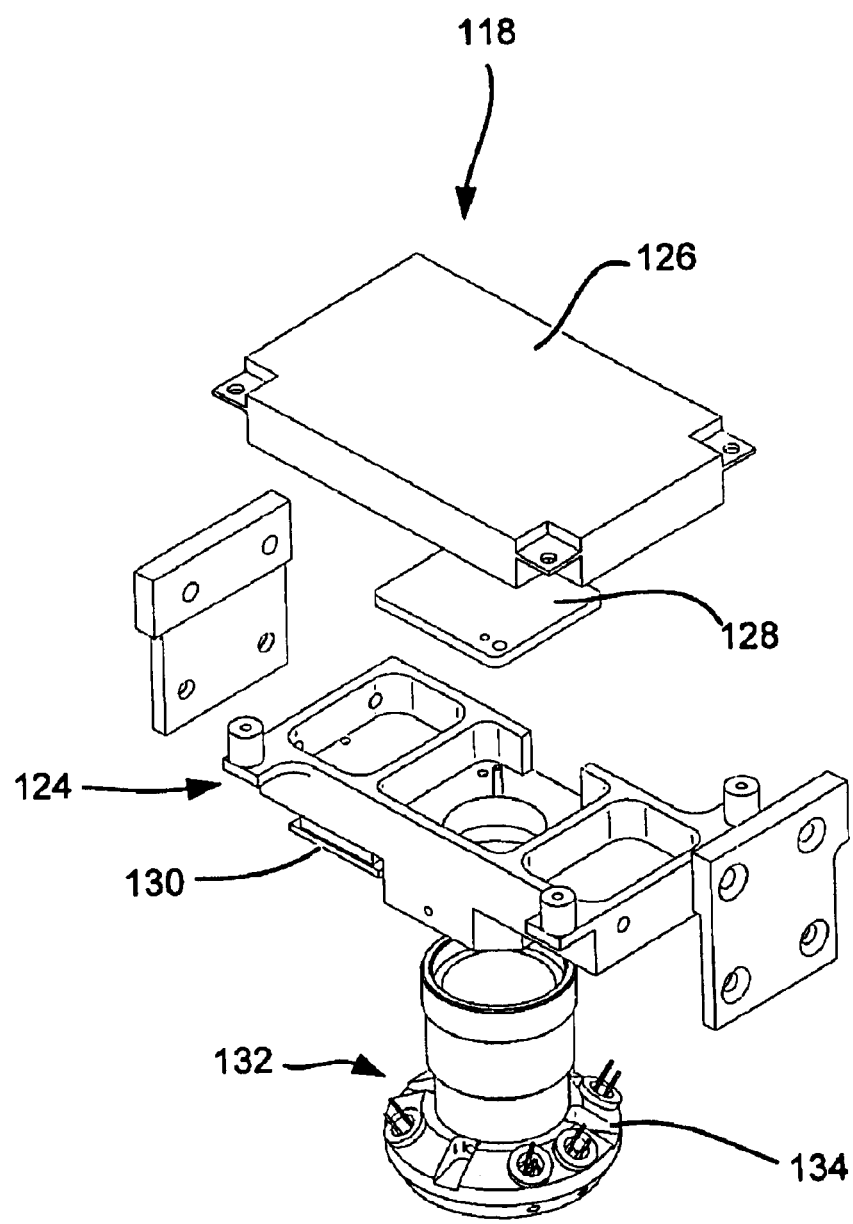
FIGS. 16A–F illustrate several views of one example of one embodiment of a translating video camera assembly and components.
Figure 16B:
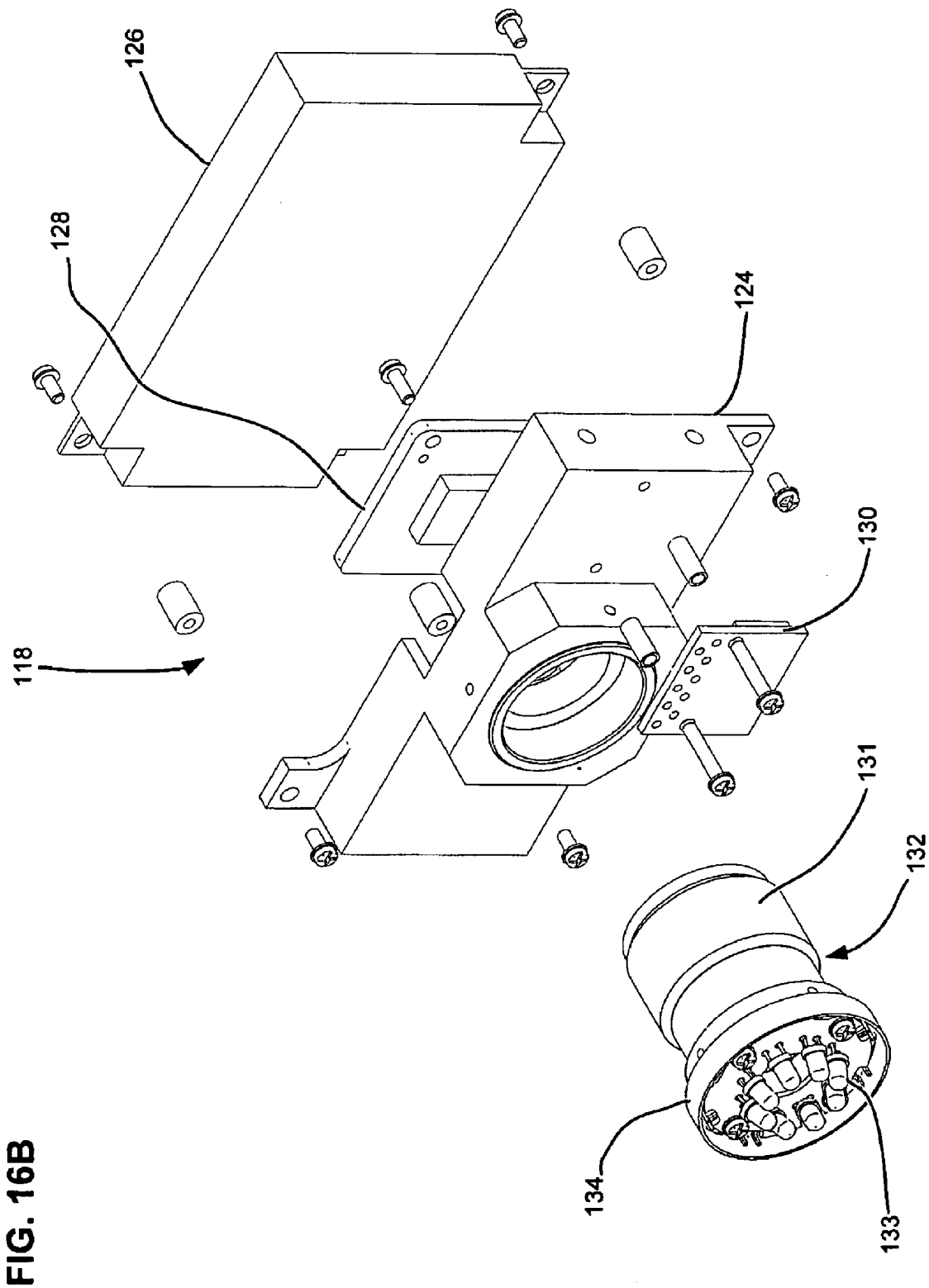

FIGS. 16A–F illustrate embodiments of the translating camera assembly 118. Digitized images are down-linked to ground support equipment (GSE) for the scientists to observe. The video camera assembly 118 comprises a lens assembly 132, light ring 134, video camera electronics 126, mounting assembly 124, a charge coupled device (CCD) head 128 and connectors for printed circuit board (PCB) 130. One embodiment of how a camera is assembled is shown in FIG. 16B. The lens assembly 132 provides the camera with a fixed focus image of the growth cell 10. The light ring 134 including 8 light emitting diodes 133 (LEDs) is attached to the base of the lens assembly 132 to the lens body 131 to provide adequate illumination during video frame acquisition.

As illustrated in FIGS. 16A–B the translating video camera assembly 118 comprises a mounting assembly 124 for mounting the camera assembly 118 to the VCMS chassis 61 X-Y stage. The camera assembly 118 further includes a Charge Coupled Device (CCD) head 128 and connectors for printed circuit board (PCB) 130. The camera utilized in the preferred embodiment of the present invention is a Sony CCB-GC7YC color card camera detachable head with 1/3" CCD 768×494 CCD elements integral DC/DC converter, Y/C and composite outputs, 470 TV lines and 5 Lux sensitivity at F1.2.

Figure 17:
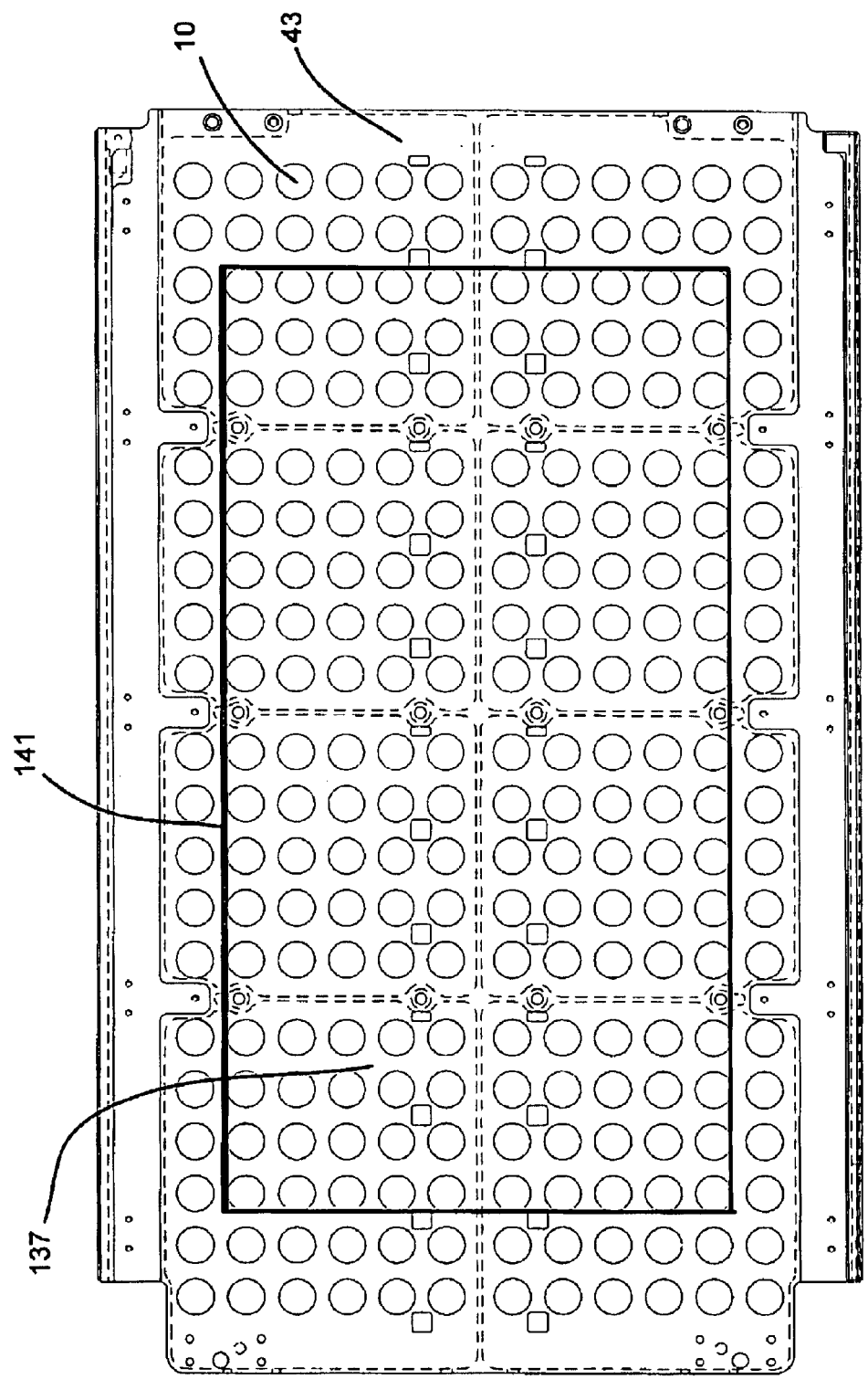
FIG. 17 illustrates an example of a diagram of a video camera growth cell coverage area.

The camera assembly 118 is mounted to the stage provided by the VCMS chassis 61 where it can translate in the X and Y directions, via mounting assembly 124. This translation allows for flexibility in viewing individual HDPCG growth cells 10 within the designated cell coverage area 137 (FIG. 17). In one embodiment, a video camera growth cell 10 coverage area 137 is about 68% of the top side HDPCG tray 43. The video camera provides a high-resolution, color, Y/C signal to the controller's 107 electronic video capture hardware.

Figure 16C:
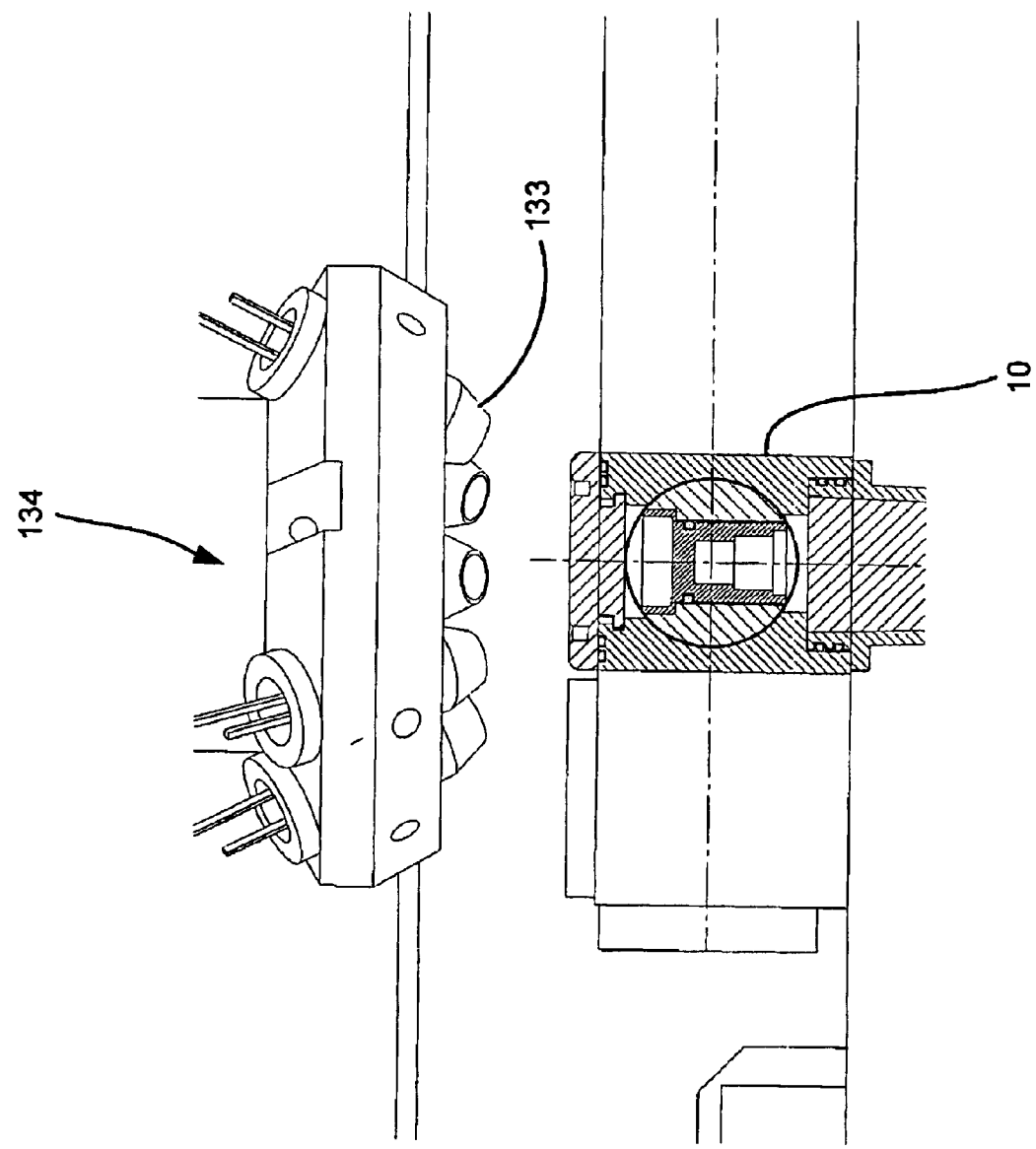

FIG. 16C illustrates the cell illumination light ring 134 attached to base of the lens. The light ring 134 including the eight sleeve mounted concentric white LED's 133 are manufactured by Sylvania Lighting International model number CMD1224WC.

Figure 16D:
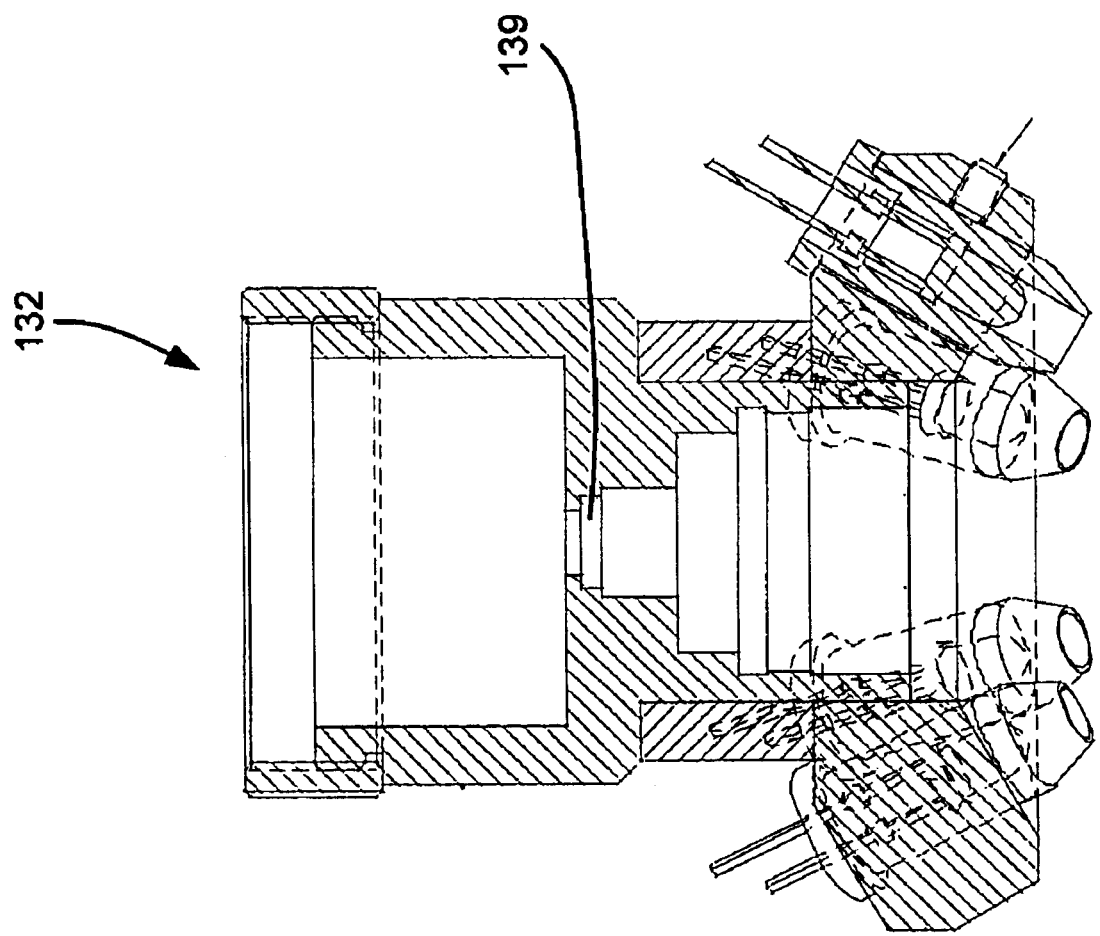

As illustrated in FIG. 16D the lens assembly 132 provides the camera with a fixed focus image of the growth cell. On the base of the lens there is a light ring that provides illumination during the video process. The assembly 132 is mounted to the X-Y stage provided by the chassis 61 where it is capable of translating in the X and Y directions. This adds the flexibility of viewing individual HDPCG growth cells within the designated cell coverage area (FIG. 17). An example of a lens assembly 132 is one custom fabricated by Optem International and includes a CS mount assembly 134, Edmund Scientific A45,207 lens 139 that is achromatic coated with a 1/4 Wave $MgF_2$ @ 550 nm, a 5 mm diameter and 15 mm focal length, and a Rolyn A32,623 Precision iris diaphragm including a 8.0–0.7 mm aperture and 8 blade blued spring steel.

Figure 16E:
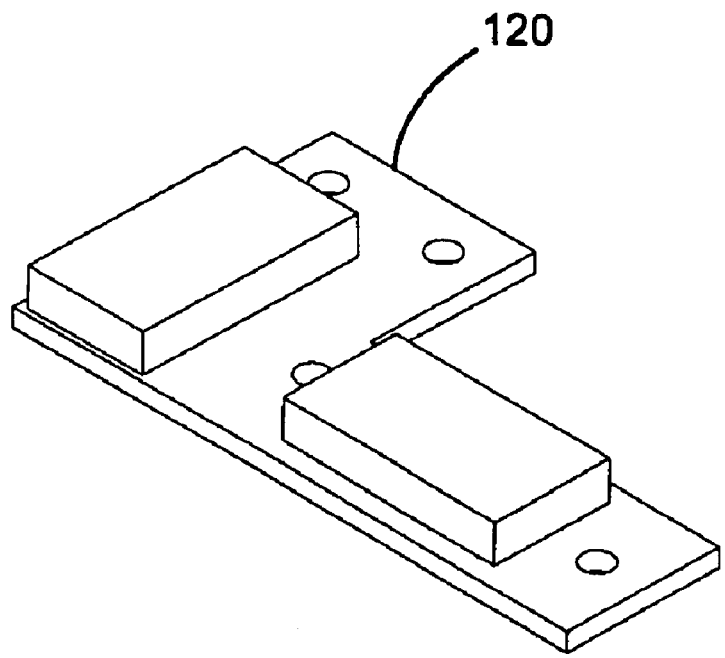
Figure 16F:
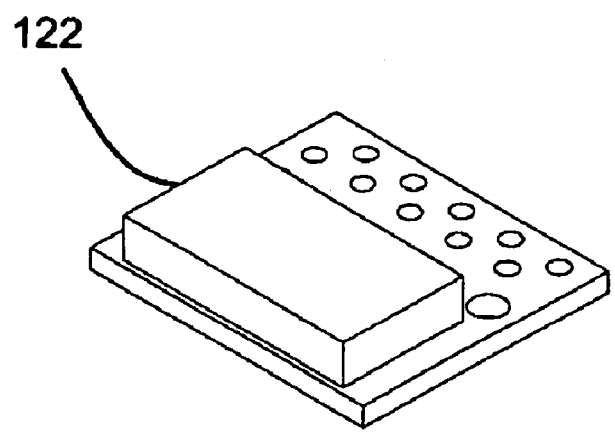

Flexible circuits 120 and 122 illustrated in FIGS. 16E and 16F, respectively, reduce the overall size, weight and assembly costs of the design. Further, the flexible circuits 120, 122 increase the system reliability, ease design (packaging in 3-dimensions), are mechanically robust and provide excellent electrical properties, for example, low strip resistance and small channel—channel capacitance.

As illustrated in FIG. 17, the VCMS System is capable of translating the video camera assembly 118 and taking periodic "snap shots" of indicated growth cells within an area of camera coverage 137 bounded by perimeter 141.

Figure 18:
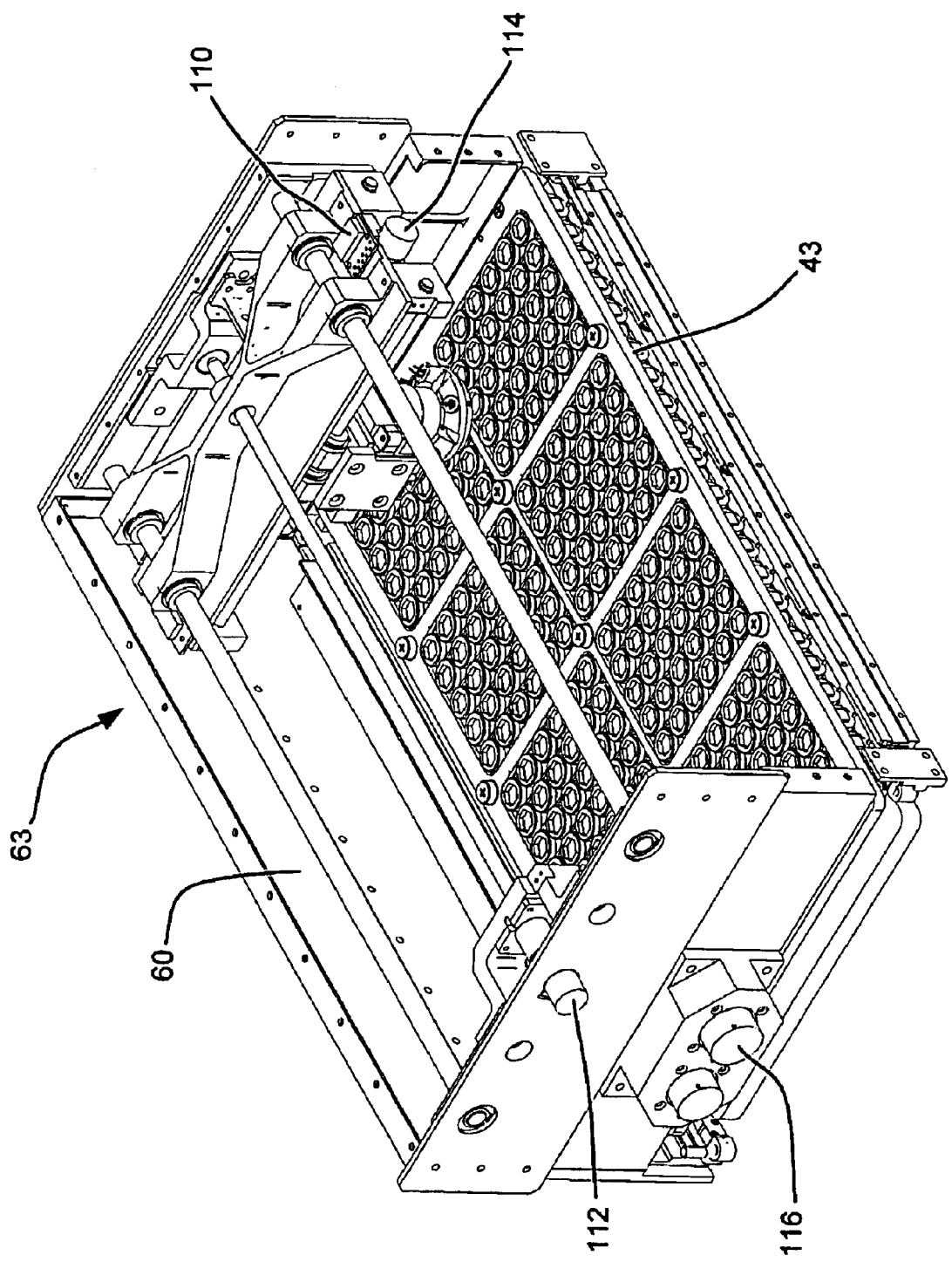
FIG. 18 illustrates one example of one embodiment of a VCMS chassis for a commercial protein crystal growth-V (CPCG-V) with hot wall removed for clarity.

As illustrated in FIG. 18, one embodiment of a VCMS chassis 61 is the structure designed to house the video camera assembly 118 and the HDPCG tray assembly 43 during an experiment. The chassis 61 includes the X-Y stage with the mounted camera assembly 118, X-stage motor/encoder 112, Y-stage motor/encoder 114, controller connector 116, flex cable connectors 110 linking the moving stages to the chassis, and installed HDPCG tray assembly 43. A sensor detects the presence of sample trays. This interlock is then used in the system software routines. Each end of the camera stage axes also has limit switches used in the software control routines.

Figure 19:
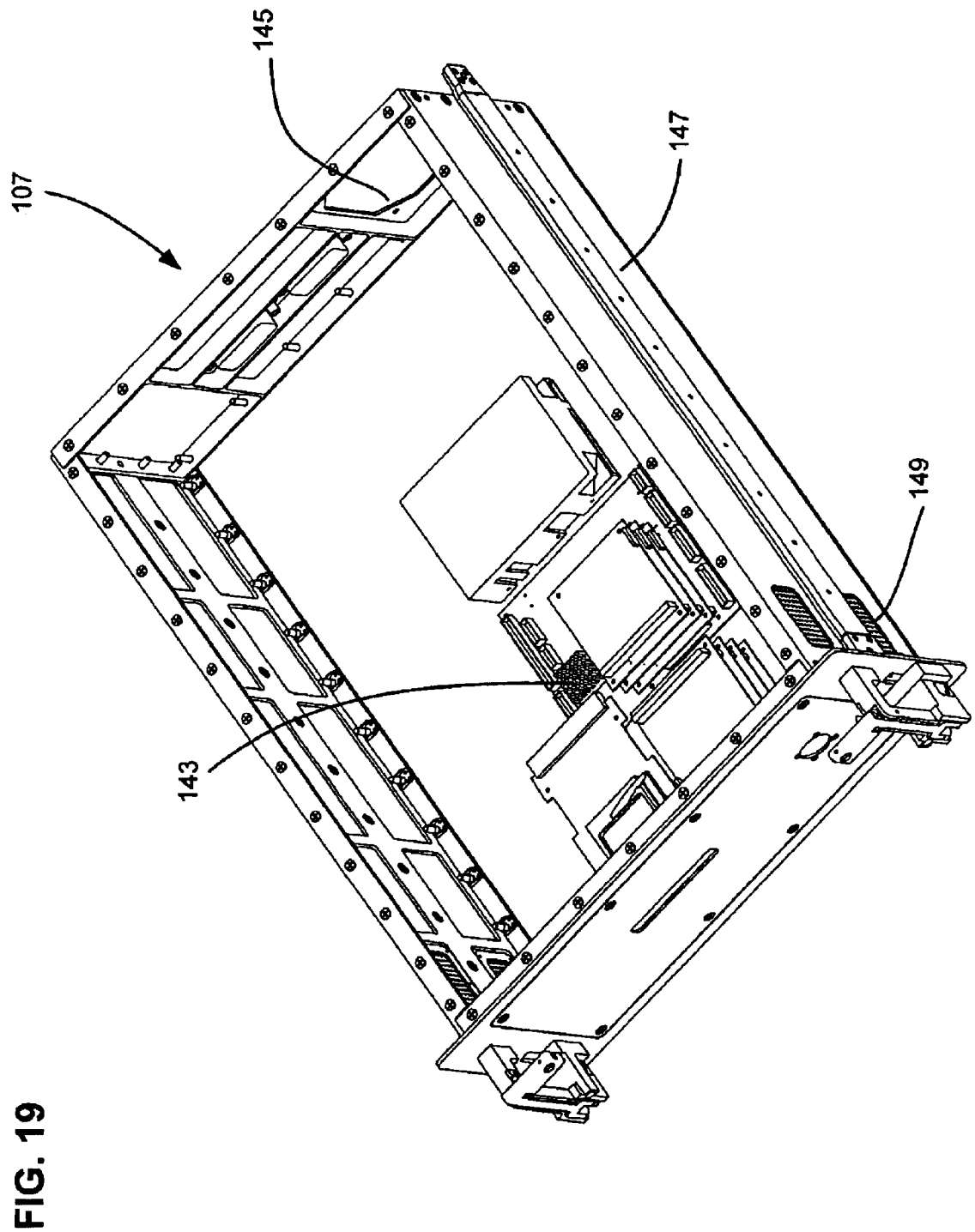
FIG. 19 illustrates one example of one embodiment of a VCMS controller for CPCG-V with top panel removed.

As illustrated in FIG. 19, one embodiment of a controller 107 is suitable for residing in an International Sub-rack Interface Standard Drawer (ISIS) 147. The VCMS 61 payload will include one Middeck Locker Equivalent (MLEs) containing hardware for protein crystal growth experiment monitoring (CPCG-V) and one experiment ISIS Drawer 147 (CPCG-C) containing control electronics 143. The VCMS is used in conjunction with the HDPCG flight assembly. The VCMS will occupy one HDPCG tray at a given time, but the VCMS has the versatility of interchanging HDPCG Trays whenever scheduled or requested.

In one embodiment, a VCMS controller 107 contains the system electronics 143. The controller has five primary functions that include: translation, video capture, disk storage, health and status, and communications. The controller 107 may be located in a four-panel unit (4PU) EXPRESS Rack ISIS drawer 147. The components are mounted to the modified baseplate of the drawer 147. The controller 107 will utilize the EXPRESS Rack internal air volume to reject heat from the VCMS controller 107. The ISIS drawer 146 is outfitted with a fan and appropriate air intake ventilation holes 149 to accomplish this heat rejection through the air exhaust vent 145. The VCMS controller 107 is monitored by both the software and hardware components. The CPCG-C system temperature(s) and system current(s) are monitored to determine the state of the electronics. Likewise, the hardware monitors vital system indicators to determine and control the state of the system.

The following hardware sub-assemblies make up the VCMS controller. An Intel 80486-based Single Board Computer (SBC) is the central processing unit. Attached to the SBC's PC/104 bus are a stepper motor controller card, an encoder feedback card, a video capture card, an analog to digital input output card, a Personal Computer Memory Card International Association (PCMCIA) solid state memory card, hard disk drive, and two DC/DC converter cards.

The VCMS controller 107 performs external communications through an Ethernet interface in the rear of the ISIS drawer 147. VCMS Health and Status (H&S) and all the down-link data passes through this interface. The Controller 107 is linked to the VCMS chassis 61 through a front panel cable. Secondary electrical supply voltages, control signals, and high-resolution Y/C video signals are routed through this cable.

The VCMS payload software will provide control of all phases of the experiment and requires limited crew involvement. The crew involvement will be required during initial experiment setup and activation, periodic status monitoring, experiment deactivation, and off-nominal activities. The VCMS payload software contains an applicable program interface to initiate, control, and monitor data acquisition from the experiment. Additionally, the VCMS payload software will manage data flow between the VCMS payload and the external interfaces. The major functions of the VCMS payload control software may include the following:

1. Provides for video data capture and storage of the payload;
2. Stores experiment data to disk;
3. Communicates with external computers;
4. Monitors system health/status;
5. Implements the periodic scan profiles for the HDPCG growth cells based upon the mask file;
6. Controls camera positioning system;
7. Monitors hardware items; and
8. Buffers experiment data.

Figure 29B:
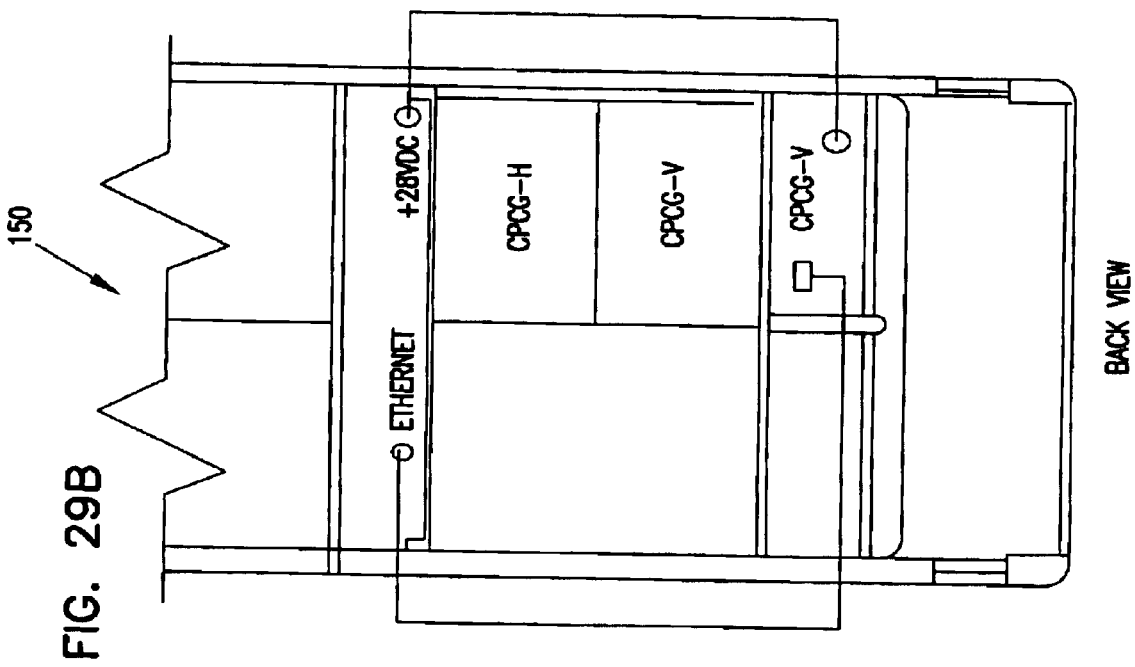
FIGS. 29A–B illustrate front and rear views, respectively, of one example of one embodiment of an express rack HDPCGNVCMS configuration.
Figure 29A:
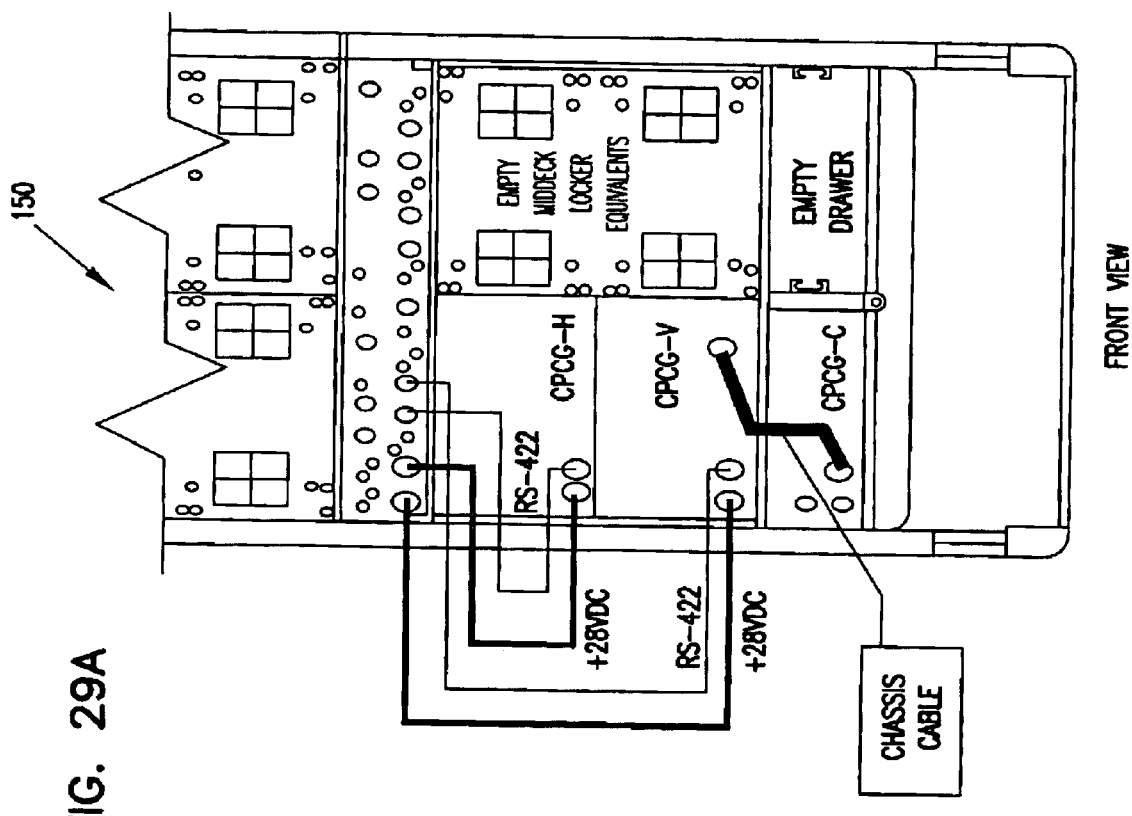

FIGS. 29A–B illustrate one embodiment of an express rack HDPCG/VCMS configuration. The HDPCG 250, VCMS chassis 61 and VCMS controller 107 experiment assemblies will utilize an EXPRESS Rack 150 (FIG. 29) in one Configuration. The thermal carriers for HDPCG and VCMS will utilize +28V power and RS422 communications on the rack front view (FIG. 29A). The cable from the VCMS controller 107 to the VCMS chassis 61 is illustrated in the front view of FIG. 29A. There are several connections located within the back of the EXPRESS rack 150. The ISIS drawer +28V power and Ethernet connections from the EXPRESS Rack 150 are routed as illustrated in the back view of FIG. 29B.

Figure 14:
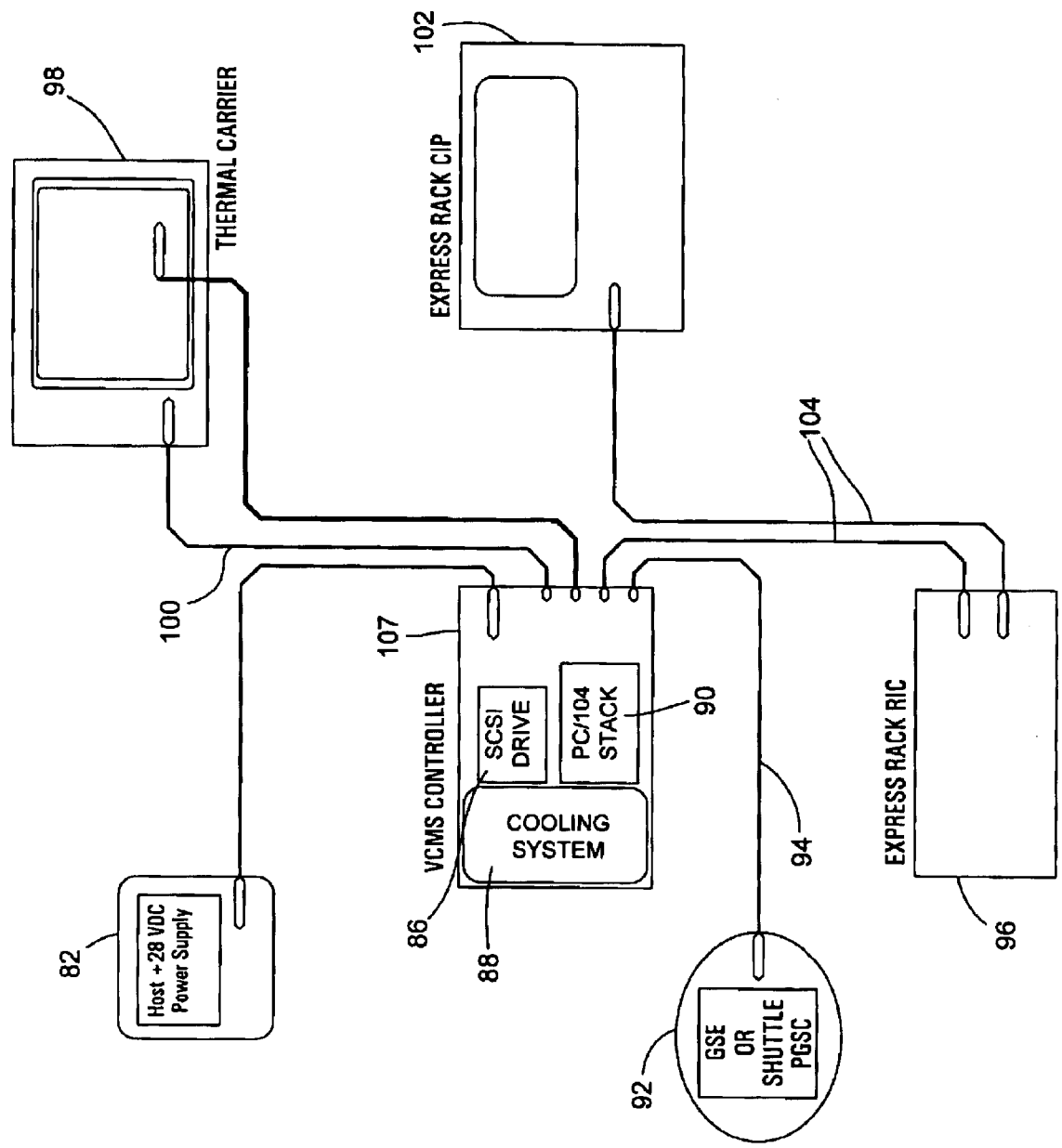
FIG. 14 illustrates a block diagram of one example of one embodiment of a video command and monitoring system (VCMS) controller.

FIG. 14 illustrates one embodiment of a block diagram of the VCMS controller 107 which contains the electronics for the system. The controller 107 may include five primary functions such as translation, illumination, video capture, disk storage and communications. It is located in an EXPRESS Rack ISIS drawer 147 where it is mounted to a modified base-plate. It utilizes the EXPRESS ISIS avionics air cooling loop to reject heat from the VCMS controller 107.

The HDPCG 43 and VCMS 61 experiment assemblies can utilize the EXPRESS Rack 150. The HDPCG 43 and VCMS 61 experiment assemblies utilize a host power supply 82 and the RS422 connections on the front of the rack. There is also a chassis connection to the VCMS 61 from the ISIS drawer and several connections that are located on the back of the rack. These are illustrated in FIGS. 29A–B. The ISIS drawer 147 utilizes a +28 V power source, Ethernet and analog (to SSPCM) connections from the EXPRESS rack.

The VCMS controller 107 is a self contained electronics box mounted in a 4 panel unit (PU) EXPRESS ISIS drawer 147. Heat is rejected via EXPRESS ISIS avionics air loop portion of the internal cooling loop 88. VCMS controller 84 further includes a small computer systems interface (SCSI) 86 drive for local electronic mass data storage and a stackable PC/104 expansion bus 90. The VCMS controller 107 communicates with peripheral devices via Ethernet communications on Ethernet bus 104 with the EXPRESS Rack interface controller 96 (RIC) and the EXPRESS Rack crew interface port (CIP) 102. The controller 107 interfaces with an RS422 communications interface 100 with thermal carrier. RS232 communications 94 is provided between the controller 84 and the GSE or Shuttle PGSC 92. It will be appreciated by those skilled in the art that the communications system may communicate digitized video images from a space station to a ground based station and form one ground based station to another ground based station.

The PC/104 bus 90 may be utilized for all computer boards such as Microprocessor (Ampro Computers, Inc.), Video Capture (Ajeco Oy, Inc.), Stepper Motor Controller (Technology 80, Inc.), Encoder Controller (Technology 80, Inc.), Stepper Motor Driver (UAB in-house design), DC—DC Converter (Tri-M Systems, Inc.) and Mass Storage (Seagate Technology, Inc.).

The microprocessor module (Ampro Littleboard 468I) includes an Intel 80486DX4 100 MHz CPU and 32 MB Dynamic Random Access Memory (DRAM). The microprocessor module is highly integrated and further includes four buffered serial ports, an Ethernet LAN interface and an SCSI-II bus interface. The microprocessor module also includes embedded features such as: bootable solid state disk support, watchdog timer and powerfail non-maskable interrupt (NMI), extended temperature operation, advanced power management functions and locking I/O connectors.

The video capture unit, Ajeco ANDI-FG, includes a Motorola 27 MHz DSP56001A digital signal processor, three 75 Ω software selectable video inputs, 640×525 digital resolution in NTSC, Y/C and composite video, eight bit A/D converter, 29.5 MHz sampling, JPEG format image upload and programming libraries in "C."

The Stepper Motor Controller may be a Tech 80 Model 5936, which includes three axes of intelligent control, directional velocity profiling, home, positive limit, and general purpose switch inputs and software-accessible functions that further include number of steps, low speed rate, high speed rate, acceleration/deceleration rate and amp-down point.

The Encoder Controller, a Tech 80 Model 5612, includes four incremental quadrature encoder inputs, three stage digital filter, software selectable filter clock 165.25 kHz to 10 MHz, 24-bit counter for each encoder and maskable PC/104 bus interrupt generation.

The Voltage Mode Stepper Motor Driver is PC/104 bus compatible and amplifies TTL level signals from the stepper controller 12VDC output, motor direction and motor speed. The driver further controls the camera illumination LED on/off switching by LED fusing and LED current limiting.

The DC—DC converter, a Tri-M Systems HE104-512-TAC, includes up to 50 W filtered power for VCMS electrical systems, PC/104 compatible design with active bus signal termination, load dump and transient noise suppression on input, logic level remote shutdown, +5VDC @ 10A output, +12VDC @ 2A output, 6–40VDC input, <20 mVpp ripple, <60 mV load regulation, <40 mV line regulation and up to 95% efficiency.

The mass storage unit, a Seagate Barracuda 9.1 Giga Byte model series that has been utilized in several NASA flights, includes 10 disks, 20 magneto resistive heads, 20 MB/sec maximum transfer rate, 512 kB multisegmented cache, 8.0/9.5 msec average seek, R/W, 4.17 msec average latency, 7,200 rpm spindle speed, 8-bit UltraSCSI interface, embedded servo control and has a 1,000,000 Mean Time Between Failure (MTBF).

One embodiment of a stepper motor 114 as illustrated in FIG. 20A is a MicroMo Stepping Gearmotor AM1524 that includes 24 steps per revolution >15 degree step angle, voltage mode motor, 12VDC operation, 6 mNn (0.85 oz-in.) holding torque, 3.71:1 reduction gear (x-axis).

One embodiment of an encoder 135 as illustrated in FIG. 20B is a MicroMo Series HE that includes a magnetic mechanism, square wave output, TTL/CMOS output, 2 channels and 90 degree phase shift.

Nominal and reduced system power required by the system are illustrated in Table 1, as follows:

TABLE 1

| Device | Nominal Power, W | Reduced Power, W |
|---|---|---|
| LB 4861 CPU | 13 | 2.6 |
| ANDI-FG VIDEO CAPTURE | 2.55 | 1.2 |

TABLE 1-continued

| Device | Nominal Power, W | Reduced Power, W |
|---|---|---|
| 5936 STEPPER CONTROLLER | 3.5 | 1.8 |
| 5912 ENCODER CONTROLLER | 0.005 | NA |
| TRANSLATION AMP. (ea.) | 0.348 | NA |
| HE104 DC/DC CONVERTER | 0.056 | NA |
| BARRACUDA HARD DRIVE | 12.4 | 4 |
| ENCODER (ea.) | 0.025 | NA |
| STEPPER MOTORS (ea.) | 0.174 | NA/OFF |
| CAMERA/LIGHTING CONTROL | 0.5 | NA |
| VIDEO CAMERA | 2.16 | NA/OFF |
| LIGHTING (ea.) | 0.125 | NA/OFF |
| TOTAL | 34.8 | 10.2 |

The VCMS controller 107 functions can be grouped into five distinct categories including translation, illumination, video capture, disk storage and communication. Each category enables varying levels of power management though software and hardware functions.

Figure 21:
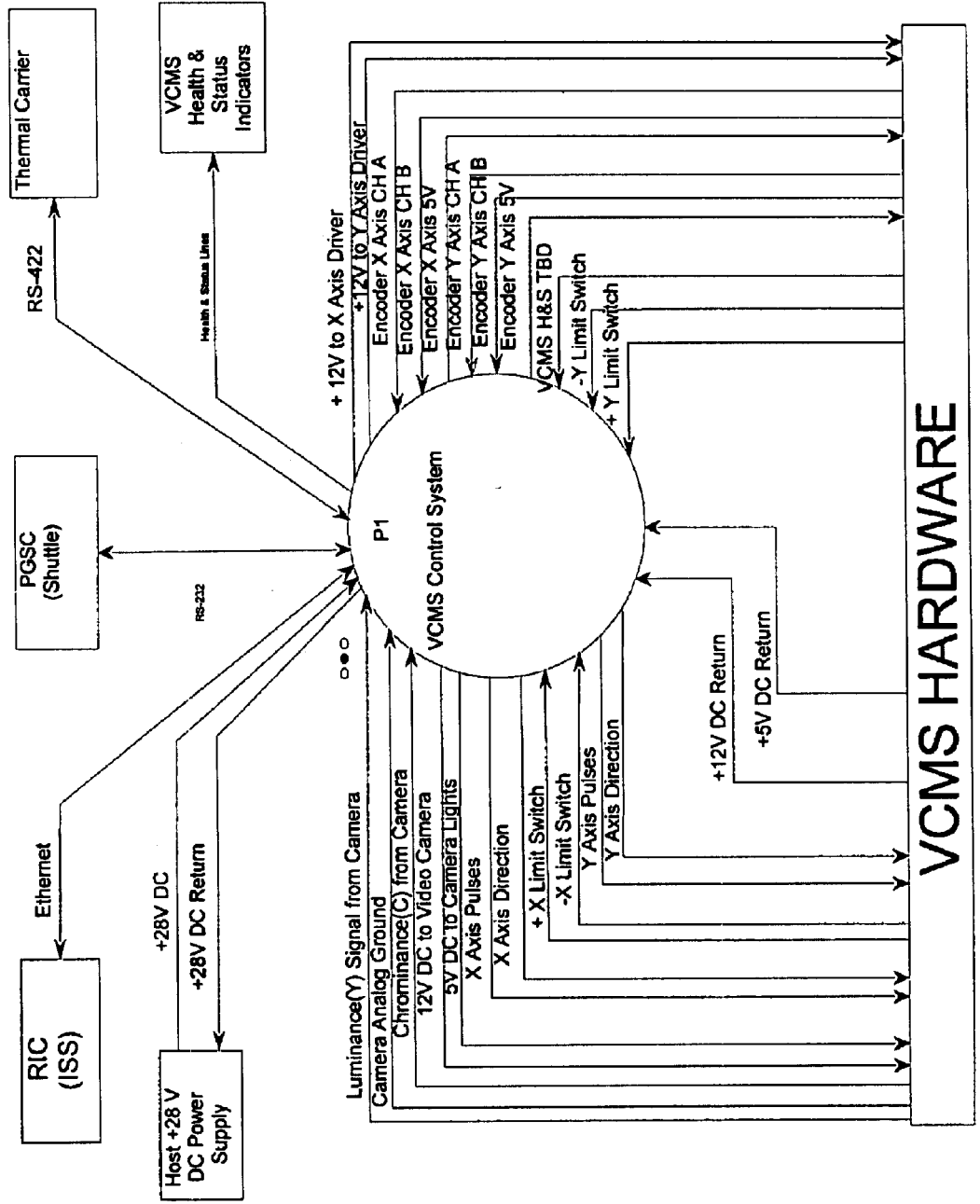
FIG. 21 illustrates one example context diagram of a VCMS.

FIG. 21 illustrates one embodiment of a VCMS context diagram.

Figure 22:
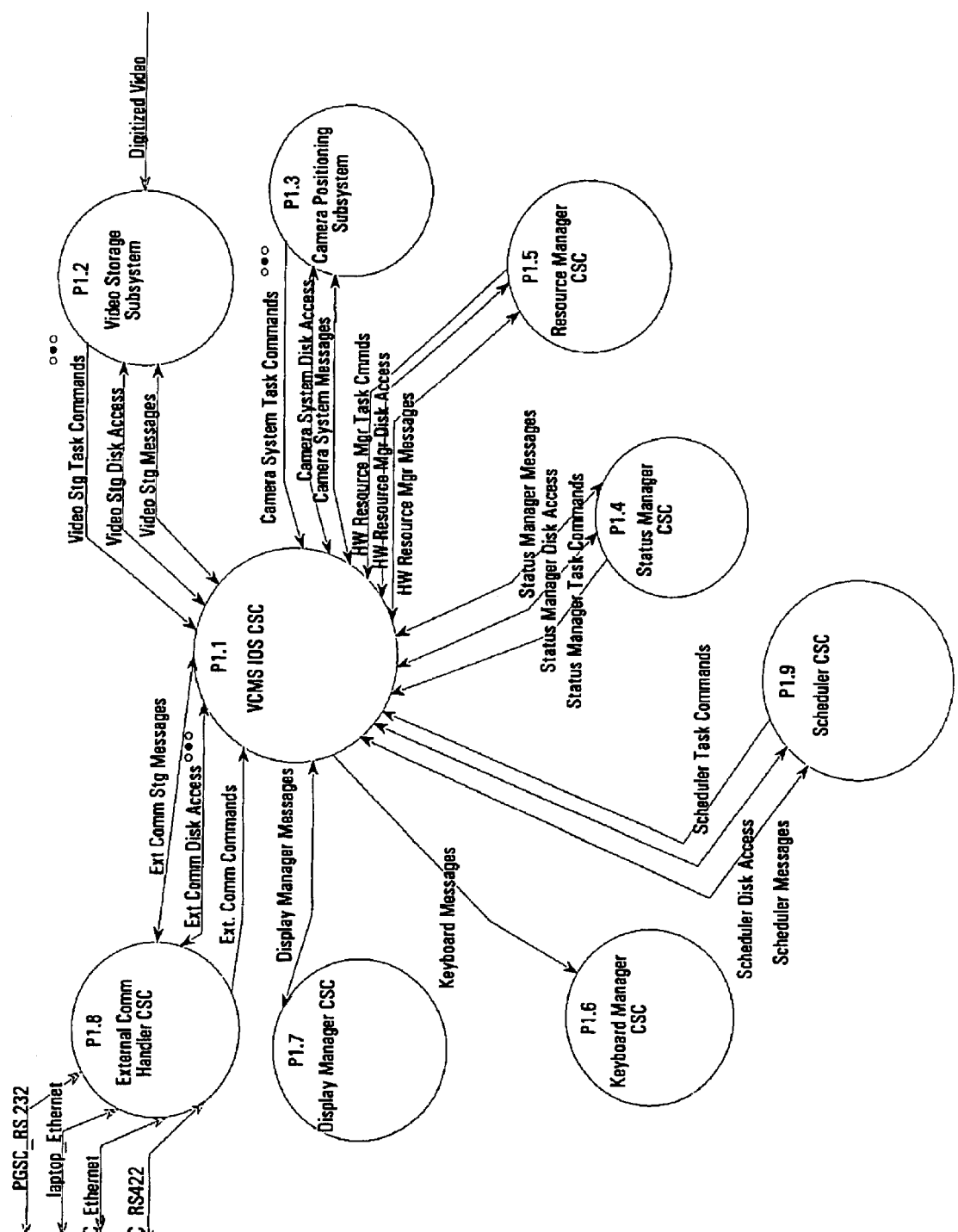
FIG. 22 illustrates one example of VCMS Input Output Subsystem (IOS) Computer Software Component (CSC) diagram.

FIG. 22 illustrates one embodiment of a VCMS IOS CSC diagram.

Figure 23:
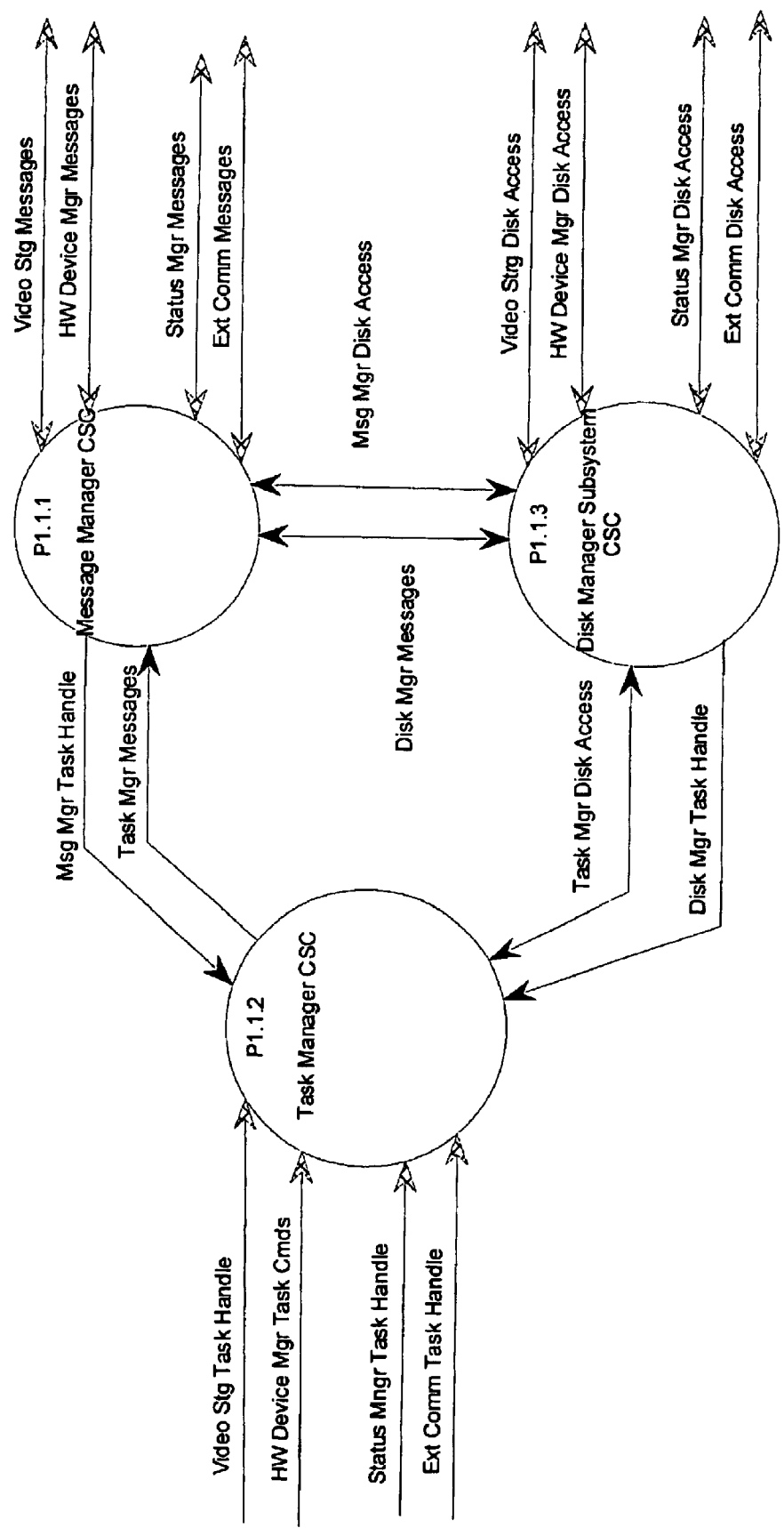
FIG. 23 illustrates one example of a VCMS IOS diagram.

FIG. 23 illustrates one embodiment of a VCMS IOS.

Figure 24:
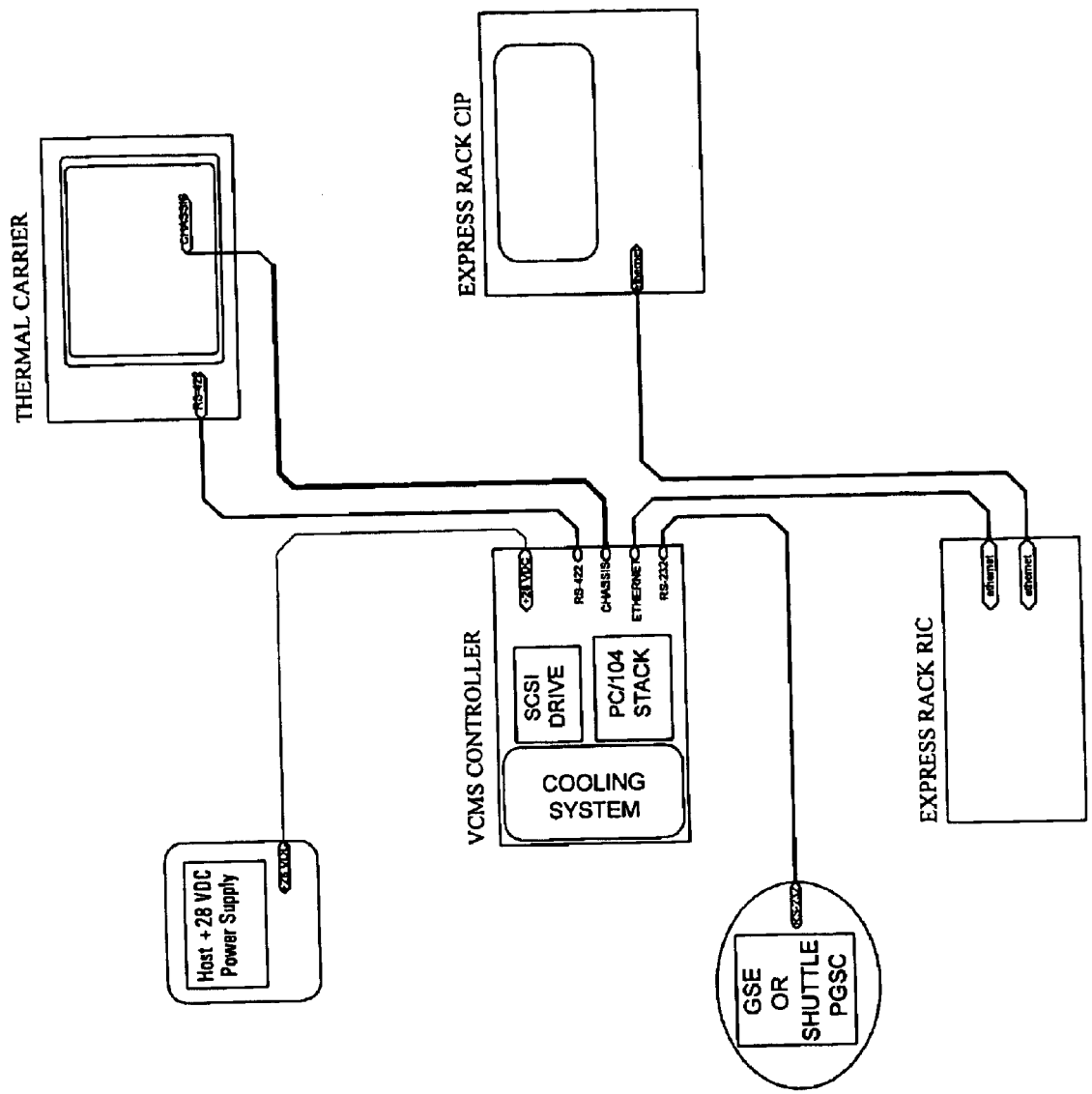
FIG. 24 illustrates a functional block diagram of one example of one embodiment of a VCMS controller.

FIG. 24 illustrates a block diagram of one embodiment of a VCMS controller.

Figure 25:
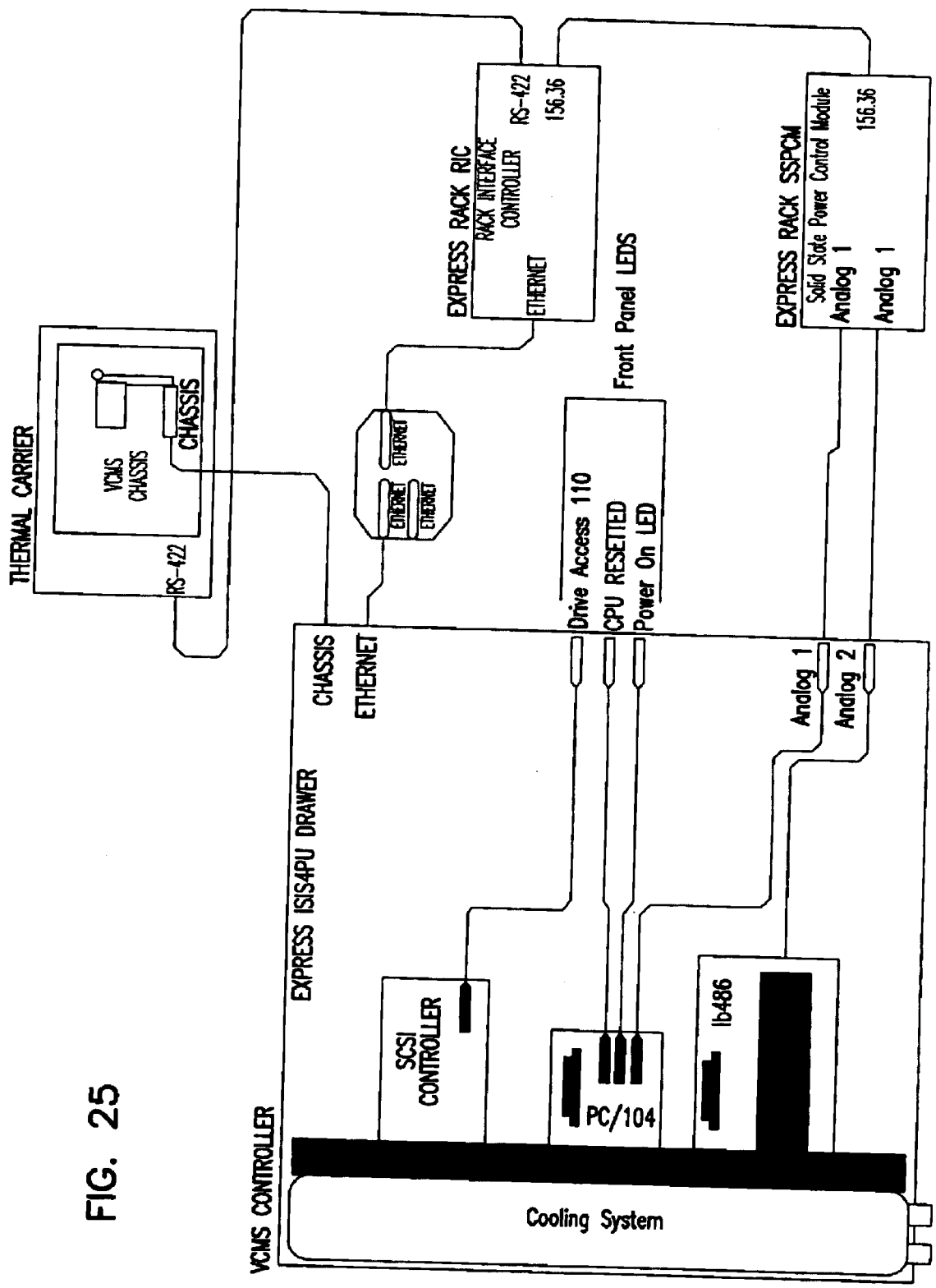
FIG. 25 illustrates a functional block diagram of one example of one embodiment of a VCMS controller.

FIG. 25 illustrates a block diagram of one embodiment of a VCMS controller.

Figure 26:
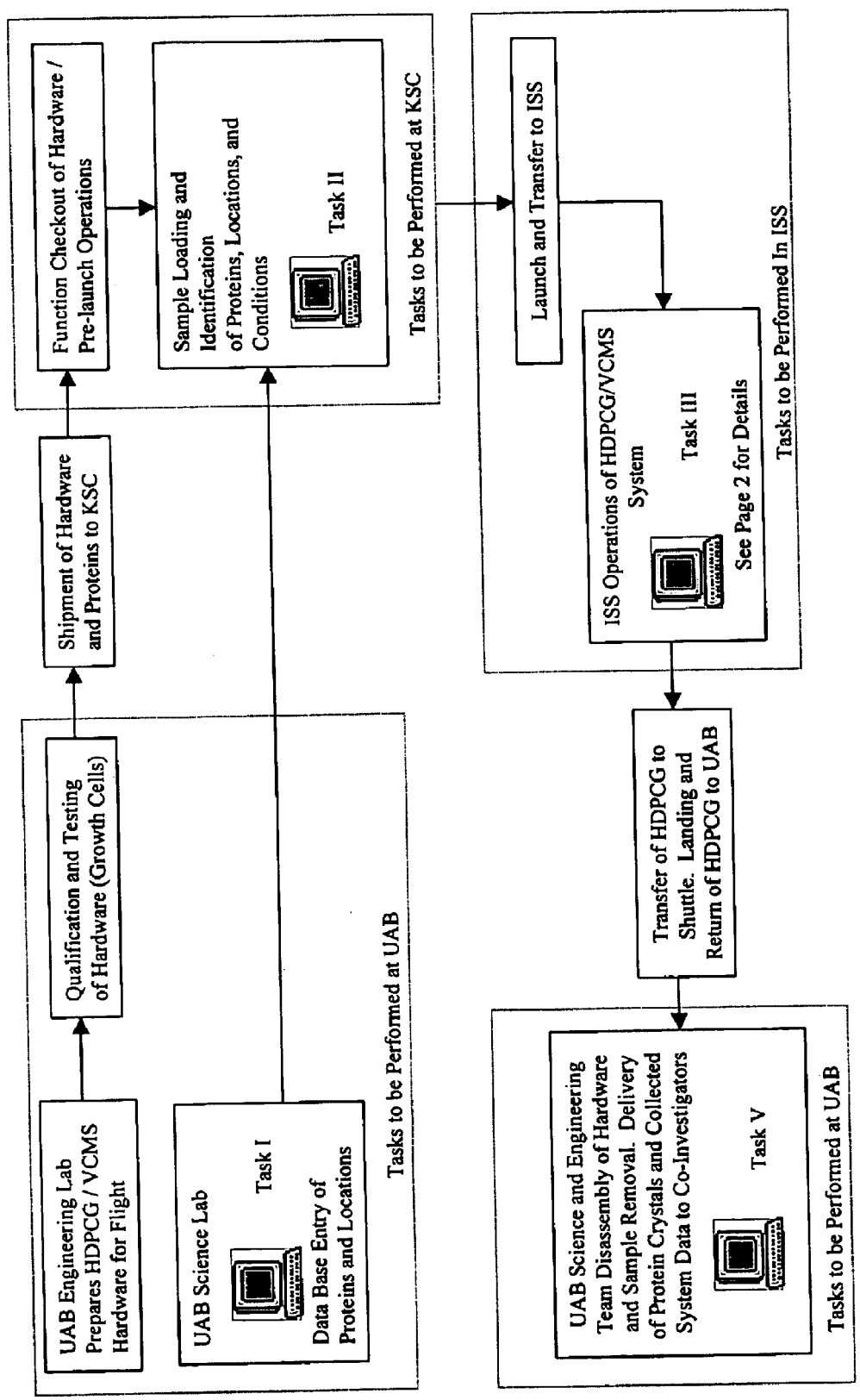
FIGS. 26 and 27 illustrate examples of flow diagrams of one embodiment of a HDPCG/NVCMS operational scenario.
Figure 27:
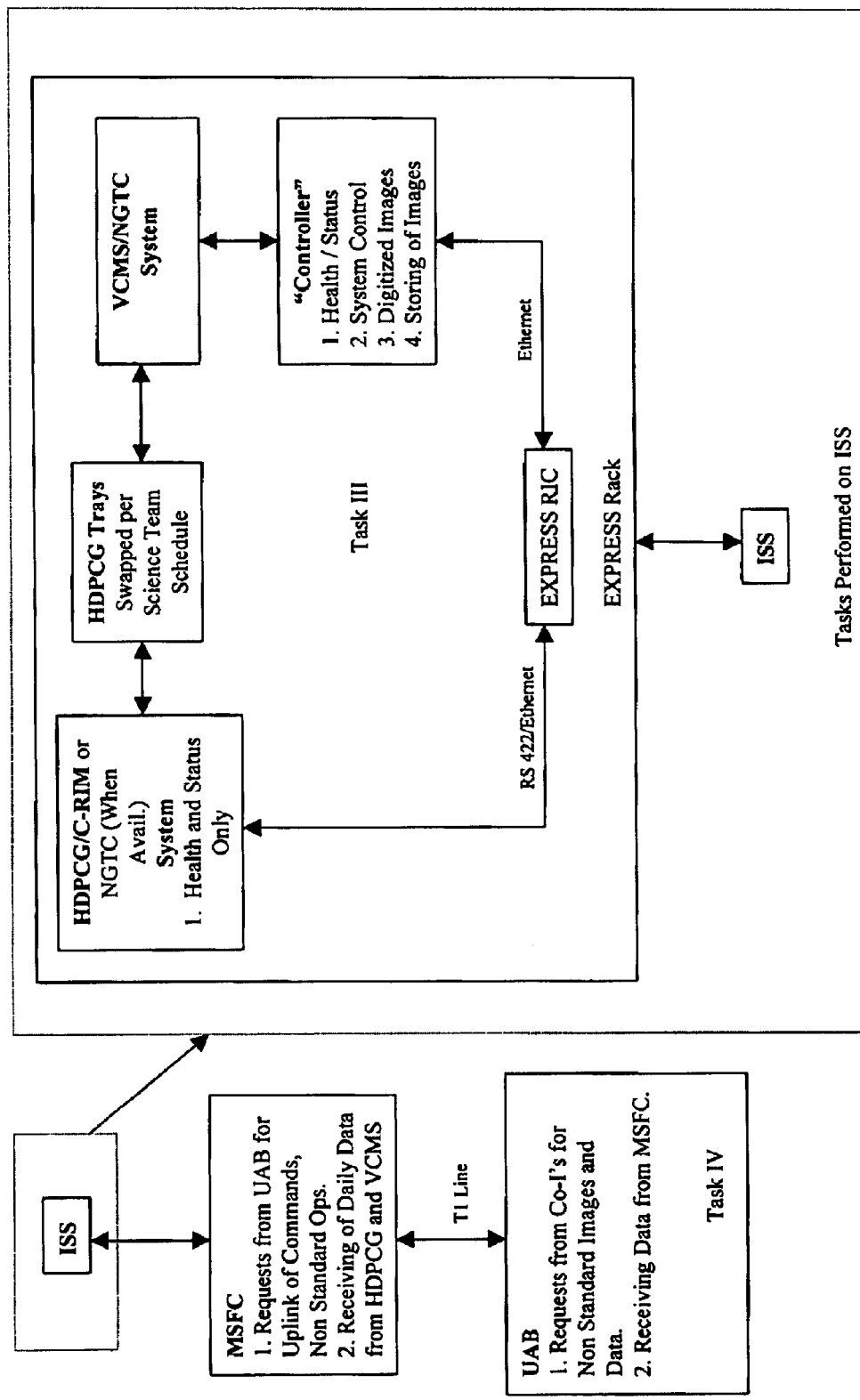

FIGS. 26 and 27 illustrate a flow diagram of one embodiment of a HDPCG/VCMS Operational Scenario.

The operational scenario is divided in five separate tasks follows:

Task I (Protein Candidate Database)

A database where protein candidates can be entered by the scientist. This database may include: protein name, co-investigator, number of samples, specifics such as volume size, growth rates and mission sequence and timeline.

Task II (Flight Protein Database)

The final flight configuration. When a growth cell block is completely full and ready to be placed into the tray, a bar code label is placed on the block. The bar code should reference a database which is generated above, but in addition includes: location of sample, actual percent concentrations and volumes loaded, time of loading, protein code written on cap of cell, and comment lines.

Task III (Command and Control of VCMS)

The VCMS will perform the following operations while on ISS:

Automatically scan all the viewable cells on a given tray twice daily and take a "snap shot"; store the digitized "snap shot" until it can be downlinked; place the images into a name specific file that can be interpreted on the ground as being a specific protein, and store the image with the file generated with Task I; move to a particular position and take a "snap shot" when given a command from the ground or by a crew member; capture the image and compress it using the best compression algorithms available possible with the given hardware; transfer health and status data from the NGTC to the EXPRESS Rack and eventually attach temperature data with the images for the database; and encryption of images before placing into the packet of data to be down-linked.

Task IV (Ground Based Operations)

The ground based system will have to do the following: receive the data packet, for example from the Marshall Space Flight Center (MSFC) and direct the images to their particular file; manage the large amount of data that will be received and place it on some type of media for transfer back to the Co-Investigators; and send requests to the MSFC (off nominal operations).

Task V (Post Flight Evaluations)

The post flight database will include information taken from the previous tasks and include: temperature data of the entire mission; digitized post flight analysis images, flight duration time; and comments during analysis.

Figure 28:
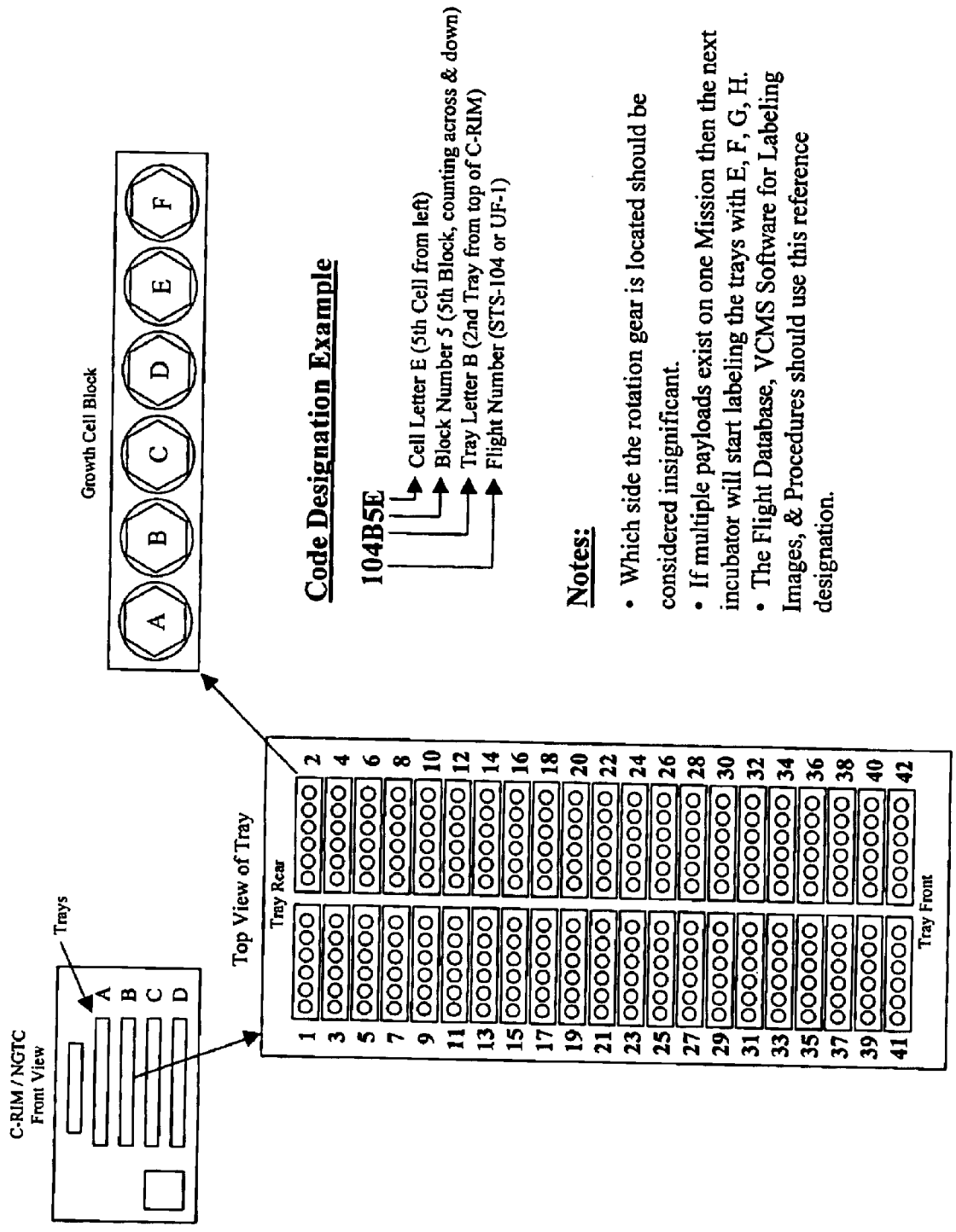
FIG. 28 illustrates one example of one embodiment of a code designation system.

FIG. 28 illustrates one embodiment of a code designation system.

The foregoing description of the specific embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this description, but rather by the claims appended hereto.

We claim:

1. A protein crystal growth assembly, comprising:
   a crystal growth cell comprising,
      a cell body having a top side, a bottom side, and an inner surface defining a chamber; said chamber including an upper portion and a lower portion; said upper portion and said lower portion each having at least one hole operatively connected thereto;
      a cell member rotatably connected within said upper portion of said chamber so as to be rotatable with respect to said chamber; said cell member defining an opening therethrough and including at least one aperture disposed through said cell member and transverse to said cell member opening;
      an upper sleeve disposed within said cell member opening; said upper sleeve including an opening substantially lining and coaxial with said cell member opening; said upper sleeve having a segment disposed in a transverse direction to said upper sleeve opening and said cell member opening; said upper sleeve opening being rotatably alignable with said lower sleeve opening in said activated position; and said upper sleeve opening being rotatably alignable with said at least one hole of said upper portion of said cell body in said deactivated position;
      a lower sleeve formed in said lower portion of said chamber; said lower sleeve defining an opening therein; and
      a cap removeably connected to said bottom side of said cell body;
      whereby said crystal growth cell is movable between an activated position and a deactivated position.

2. A protein crystal growth assembly according to claim 1, wherein said at least one aperture is operatively connected to a rotating mechanism; said rotating mechanism rotating said cell member within said upper portion of said chamber of said cell body.

3. A protein crystal growth assembly according to claim 2, wherein the rotating mechanism rotates the cell member a distance defined between said activated position and said deactivated position.

4. A protein crystal growth assembly according to claim 3, wherein said distance is 90 degrees.

5. A protein crystal growth assembly according to claim 1, wherein said top side of said cell body includes a surface formed of an optically clear surface.

6. A protein crystal growth assembly according to claim 1, wherein said upper sleeve opening includes a first liquid disposed therein; and said lower sleeve opening includes a second liquid disposed therein.

7. A protein crystal growth assembly according to claim 6, wherein said first liquid and said second liquid touch in an interface in said activated position; said interface enabling diffusion between said first liquid and second liquid.

8. A protein crystal growth assembly according to claim 1, wherein said cap is sealed to said cell body by at least one sealing member disposed at said bottom of said cell body when said cap is connected to said cell body for isolating said crystal growth cell from a local environment.

9. A protein crystal growth assembly according to claim 8, wherein said local environment is a micro-gravity environment.

10. A method for protein crystal growth, comprising:

providing a protein crystal growth assembly including at least one crystal growth cell having a cell body defining a chamber therein; the chamber including an upper portion and a lower portion; the upper portion including a cell member having an upper sleeve rotatably connected with the upper portion; the lower portion including a lower sleeve; the upper and lower sleeves including openings being alignable when the cell member is rotated; the upper and lower portions including holes for accessing the openings of the upper and lower sleeves; and a cap removably disposed on said cell body;

disposing a first liquid in the upper sleeve opening;

disposing a second liquid in the lower sleeve opening;

rotating the cell member to align the upper and lower sleeve openings to create an interface between the first and second liquids;

diffusing the first and second liquids through the interface to mix the first and second liquids so that crystals precipitate from the mixture of the first and second liquids; and maintaining a constant temperature throughout the preceding steps.

11. A method for protein crystal growth, comprising:

providing a protein crystal growth assembly including at least one crystal growth cell having a cell body defining a chamber therein; the chamber including an upper portion and a lower portion; the upper portion including a cell member having an upper sleeve rotatably connected with the upper portion; the lower portion including a lower sleeve; the upper and lower sleeves including openings being alignable when the cell member is rotated; the upper and lower portions including holes for accessing the openings of the upper and lower sleeves; and a cap removably disposed on said cell body;

disposing a first liquid in the upper sleeve opening;

disposing a second liquid in the lower sleeve opening;

rotating the cell member to align the upper and lower sleeve openings where the first and second liquids form an interface; and agitating the first and second liquids to create a mixture allowing crystals to precipitate from the mixture of the first and second liquids.

* * * * *